US009093575B2

(12) United States Patent
Yokoyama

(10) Patent No.: US 9,093,575 B2
(45) Date of Patent: Jul. 28, 2015

(54) SEMICONDUCTOR DEVICE AND SOLID-STATE IMAGING DEVICE WITH TANTALUM OXIDE LAYER FORMED BY DIFFUSING A MATERIAL OF AN ELECTRODE OF NECESSITY OR A COUNTER ELECTRODE

(71) Applicant: Sony Corporation, Tokyo (JP)

(72) Inventor: Takashi Yokoyama, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/017,816

(22) Filed: Sep. 4, 2013

(65) Prior Publication Data

US 2014/0091321 A1    Apr. 3, 2014

(30) Foreign Application Priority Data

Sep. 28, 2012  (JP) .................................. 2012-218000

(51) Int. Cl.
| | | |
|---|---|---|
| *H01L 31/0224* | (2006.01) | |
| *H01L 31/18* | (2006.01) | |
| *H01L 31/028* | (2006.01) | |
| *B82Y 20/00* | (2011.01) | |

(52) U.S. Cl.
CPC .......... *H01L 31/0224* (2013.01); *H01L 31/028* (2013.01); *H01L 31/18* (2013.01); *B82Y 20/00* (2013.01); *Y10S 977/742* (2013.01); *Y10S 977/954* (2013.01)

(58) Field of Classification Search
CPC ... H01L 31/0224; H01L 31/18; H01L 31/028; Y01S 977/742; Y01S 977/954

USPC ............. 257/723, 59, E33.053, 43, E29.068, 257/288, 347, 352, 734; 977/742, 954; 438/98

See application file for complete search history.

(56) References Cited

U.S. PATENT DOCUMENTS

| | | | |
|---|---|---|---|
| 7,544,981 B2 * | 6/2009 | Tanaka et al. .................. 257/288 |
| 7,939,347 B2 * | 5/2011 | Wang ................................ 438/3 |
| 2011/0097834 A1* | 4/2011 | Yamazaki et al. .............. 438/30 |
| 2011/0122673 A1* | 5/2011 | Kamata et al. ................ 365/114 |
| 2011/0156026 A1* | 6/2011 | Yamazaki et al. .............. 257/43 |
| 2011/0234930 A1* | 9/2011 | Nishida et al. .................. 349/33 |
| 2012/0018729 A1* | 1/2012 | Takayama et al. .............. 257/59 |

FOREIGN PATENT DOCUMENTS

| | | | |
|---|---|---|---|
| JP | 2005-268662 | | 9/2005 |
| JP | 2009-094495 | | 4/2009 |
| JP | 2009-94495 A | * | 4/2009 |

* cited by examiner

*Primary Examiner* — Alexander Oscar Williams
(74) *Attorney, Agent, or Firm* — Dentons US LLP

(57) ABSTRACT

There is provided a semiconductor device including a semiconductor layer that includes an active region, semiconductor elements that are formed using the active region, connection regions that are obtained by metalizing parts of the semiconductor layer in an island shape isolated from the active region, an insulation film that is formed to cover one main surface side of the semiconductor layer, electrodes that are disposed to face the semiconductor elements and the connection regions via the insulation film, and contacts that penetrate through the insulation film to be selectively formed in portions according to necessity among portions that connect the semiconductor elements or the connection regions to the electrodes.

16 Claims, 47 Drawing Sheets

A1—A1'

A1—A1'

B2-B2'

A-A'

SEMICONDUCTOR DEVICE AND SOLID-STATE IMAGING DEVICE WITH TANTALUM OXIDE LAYER FORMED BY DIFFUSING A MATERIAL OF AN ELECTRODE OF NECESSITY OR A COUNTER ELECTRODE

BACKGROUND

The present technology relates to a semiconductor device and a method of manufacturing the semiconductor device, and more particularly, to a semiconductor device in which elements are disposed 3-dimensionally by laminating a plurality of semiconductor layers, a solid-state imaging device using the semiconductor device, and a method of manufacturing such a semiconductor device.

As one of the structures configured to achieve higher integration of a semiconductor device, a 3-dimensional structure in which elements with different characteristics are laminated in a plurality of layers has been suggested. In the semiconductor device having such a 3-dimensional structure, there are, for example, the following two configurations.

A first configuration is a configuration in which a plurality of substrates in which elements are formed are prepared and these substrates are bonded to each other. In this case, for example, connection electrodes connected to the elements are configured to be extracted toward the bonded surface sides of the substrates. By joining the extracted connection electrodes with the connection electrodes, two substrates are bonded so that the substrates can be electrically connected to each other (hitherto, for example, see Japanese Unexamined Patent Application Publication No. 2005-268662).

A second configuration is a configuration in which elements including a second semiconductor layer are formed on a substrate in which elements including a first semiconductor layer are formed via an inter-layer insulation film, and the elements of the layers are connected in an upper layer (hitherto, for example, see Japanese Unexamined Patent Application Publication No. 2009-94495).

SUMMARY

In the first configuration, however, it is necessary to route the connection electrodes on the front surface of each substrate. For this reason, an occupation area in which the connection electrodes are wired may increase depending on a kind of formed circuit, and thus miniaturization of a semiconductor device may deteriorate. In the second configuration, the upper and lower elements are connected in the uppermost layer. Therefore, a routing area of wirings used to connect the elements to each other may further increase, and thus the miniaturization of a semiconductor device may further deteriorate.

It is desirable to provide a semiconductor device in which upper and lower elements can be connected without routing wirings even when a plurality of element layers are laminated, and thus miniaturization can be achieved. It is also desirable to provide a solid-state imaging device using the semiconductor device and a method of manufacturing such a semiconductor device.

According to a first embodiment of the present technology, there is provided a semiconductor device including a semiconductor layer that includes an active region, semiconductor elements that are formed using the active region, connection regions that are obtained by metalizing parts of the semiconductor layer in an island shape isolated from the active region, an insulation film that is formed to cover one main surface side of the semiconductor layer, electrodes that are disposed to face the semiconductor elements and the connection regions via the insulation film, and contacts that penetrate through the insulation film to be selectively formed in portions according to necessity among portions that connect the semiconductor elements or the connection regions to the electrodes.

In the semiconductor device with such a configuration, the connection regions obtained by metalizing parts of the semiconductor layer in the island shape independent from the active region are formed as electrode pads in the same layer as the active region included in the semiconductor layer. Therefore, by selectively disposing the contacts between the connection regions and the electrodes and between the semiconductor elements and the electrodes, potentials of portions of the semiconductor elements can be extracted to the connection regions disposed on an opposite side from the electrodes with the insulation film interposed therebetween. Thus, a desired circuit can be formed by selection of disposition of the contacts without depending on only routing of the wirings.

The solid-state imaging device according to an embodiment of the present technology is a device that uses the semiconductor device according to an embodiment of the present technology and includes the above-described semiconductor device and the imaging substrate that includes the photoelectric conversion unit.

Further, according to a first embodiment of the present technology, there is provided a method of manufacturing a semiconductor device including forming an active region in a semiconductor layer and forming connection regions obtained by metalizing the semiconductor layer in an island shape isolated from the active region, forming semiconductor elements using the active region, forming an insulation film that covers one main surface side of the semiconductor layer, forming contacts that penetrate the insulation film selectively in portions according to necessity among portions that reach the semiconductor elements or the connection regions, and forming electrodes of which parts are connected to the contacts in positions at which the semiconductor elements face the connection regions via the insulation film.

According to the above-described embodiments of the present technology, a desired circuit can be formed by selection of disposition of the contacts without depending on only routing of the wirings, and thus miniaturization of the semiconductor device can be achieved.

DETAILED DESCRIPTION OF THE EMBODIMENTS

DETAILED DESCRIPTION OF THE EMBODIMENTS

Figure 1:
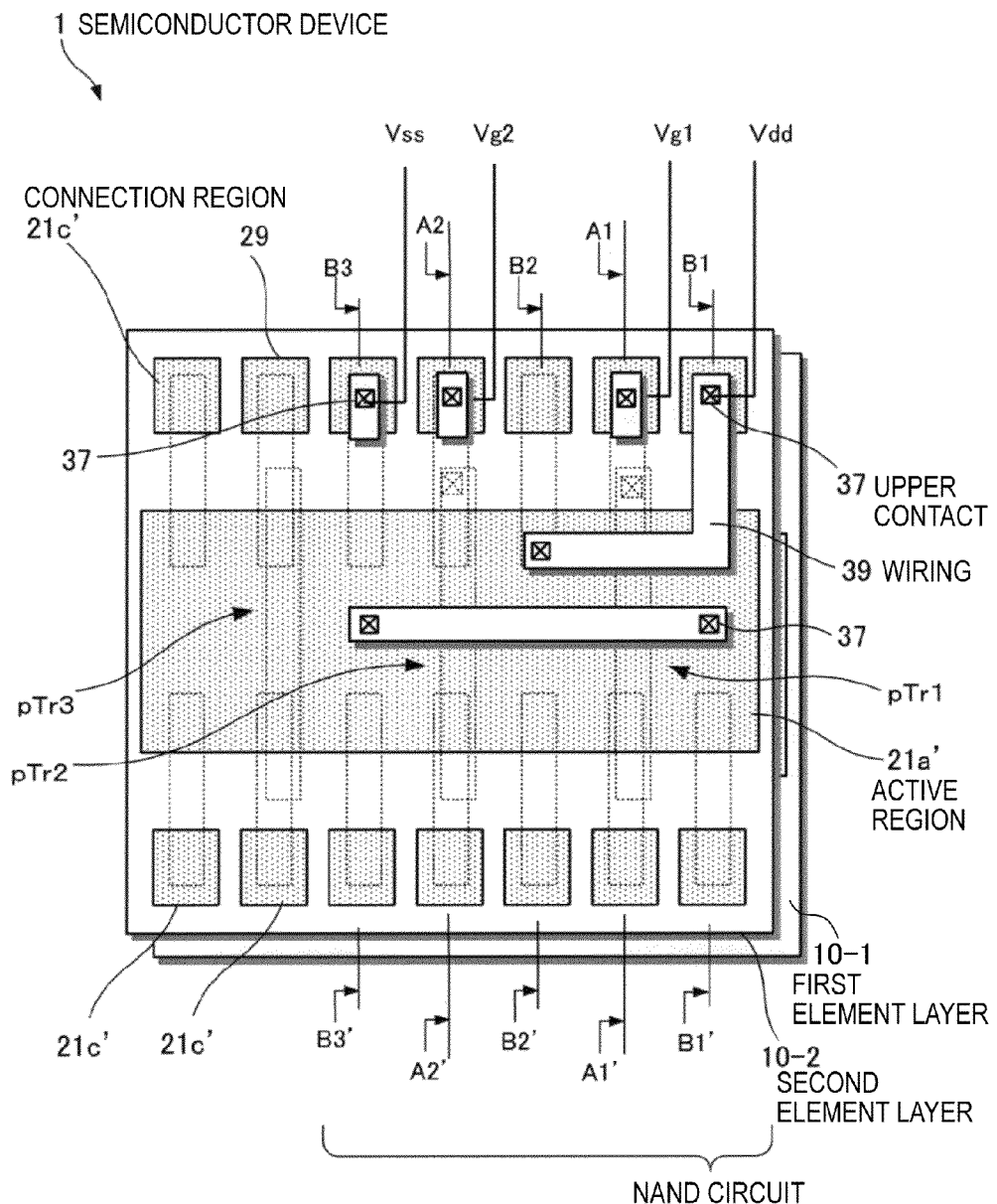
FIG. 1 is a plan view illustrating a semiconductor device according to a first embodiment.

Hereinafter, preferred embodiments of the present technology will be described in detail with reference to the appended drawings. Note that, in this specification and the appended drawings, structural elements that have substantially the same function and structure are denoted with the same reference numerals, and repeated explanation of these structural elements is omitted.

Hereinafter, embodiments of the present technology will be described in the following order with reference to the drawings.

<<First embodiment>> [2-layer structure: basic structure (including NAND circuit)]
1-(1) Structure
1-(2) Manufacturing method
<<Second embodiment>> [example of lamination structure of 3 or more layers]
2-(1) Structure
2-(2) Manufacturing method
<<Third embodiment>> [example of lamination structure using support substrate (including NAND circuit)]
3-(1) Structure
3-(2) Manufacturing method
<<Fourth embodiment>> [example of lamination structure applied to solid-state imaging device]
<<Fifth embodiment>> [example of lamination structure applied to FIN structure]
5-(1) Structure
5-(2) Manufacturing method
5-(3) Modification example 1 (example of lamination structure of 3 or more layers)
5-(4) Manufacturing method of modification example 1
5-(5) Modification example 2 (example of direct connection between contacts)
<<Sixth embodiment>> [example of lamination structure using tantalum oxide layer]
6-(1) Structure
6-(2) Manufacturing method
6-(3) Modification example
6-(4) Manufacturing method of modification example
<<Seventh embodiment>> [Electronic device using solid-state imaging device]

First Embodiment

2-Layer Structure: Basic Structure (Including NAND Circuit)

<1-(1) Structure>

Figure 2:
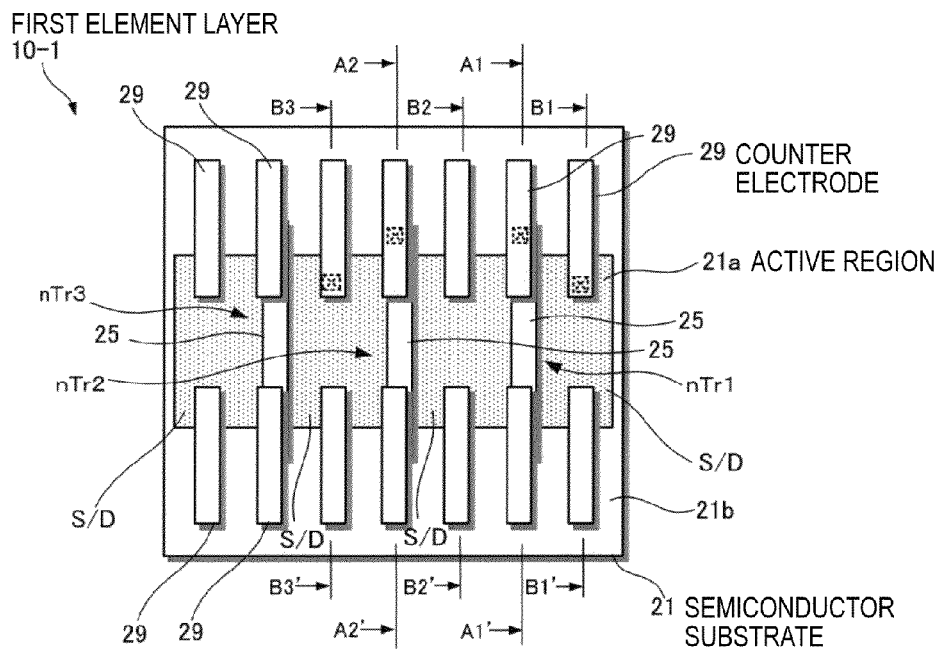
FIG. 2 is a plan view illustrating a first element layer of the semiconductor device according to the first embodiment.
Figure 3:
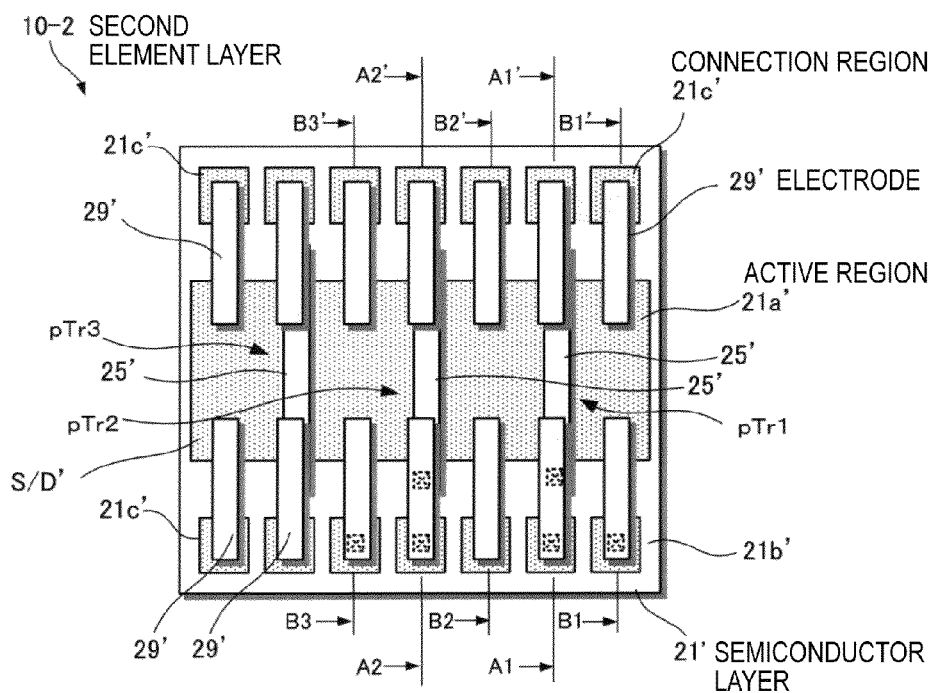
FIG. 3 is a plan view illustrating a second element layer of the semiconductor device according to the first embodiment.

FIG. 1 is a plan view illustrating a schematic configuration of a semiconductor device according to a first embodiment. A semiconductor device 1 of the first embodiment illustrated in the drawing is a semiconductor device that has a 3-dimensional structure in which a first element layer 10-1 and a second element layer 10-2 are laminated. FIG. 2 is a plan view illustrating the first element layer 10-1. FIG. 3 is a plan view illustrating the second element layer 10-2. The first element layer 10-1 and the second element layer 10-2 illustrated in these drawings are bonded to each other so that surfaces on which semiconductor elements are formed face each other, and thus are characterized by the connection state of the semiconductor elements between the first element layer 10-1 and the second element layer 10-2.

Figure 9:
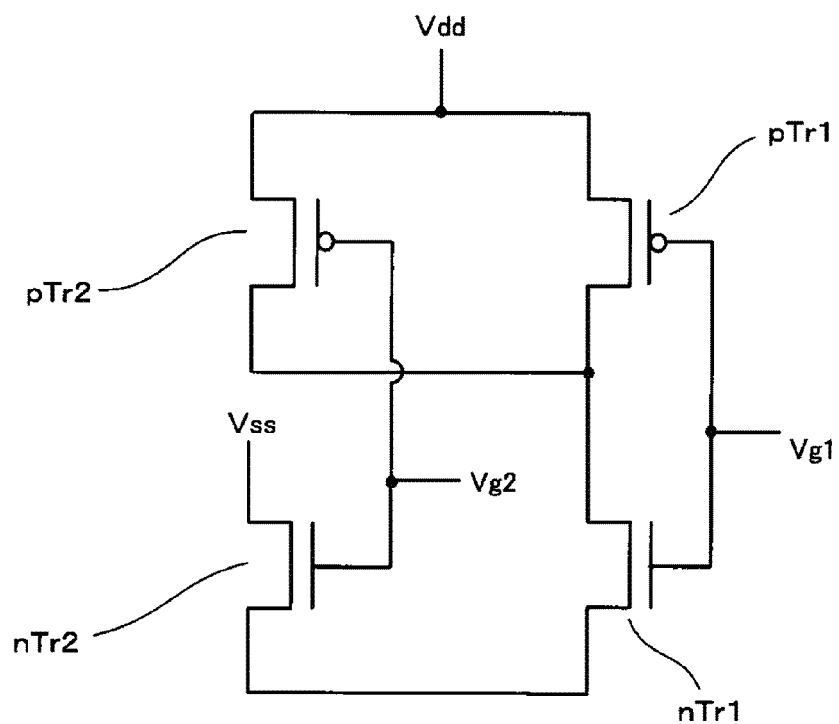
FIG. 9 is an equivalent circuit diagram illustrating a NAND circuit included in the semiconductor device according to the first embodiment.

Hereinafter, a case in which the detailed configuration of the semiconductor device 1 is applied to a semiconductor device including a NAND circuit which is an example of a digital circuit will be exemplified. Here, the detailed configuration will be described in the order of <first element layer 10-1>, <second element layer 10-2>, and <wiring layer 11> formed on an outside of a laminate of the first and element layers with reference to the plan views of FIGS. 1 to 3 and sectional views (FIGS. 4 to 8) of other portions taken along the lines A1-A1', A2-A2', B1-B1', and so on of the plan views. FIG. 9 is an equivalent circuit diagram illustrating the NAND circuit formed in the semiconductor device 1.

<First Element Layer 10-1>

The first element layer 10-1 illustrated in the plan views of FIGS. 1 and 2 and the sectional views of FIGS. 4 to 8 includes n-type transistors nTr1, nTr2, and nTr3 on one main surface of the semiconductor substrate 21. A laminated insulation film 27 (illustrated only in the sectional views) covering such n-type transistors nTr1, nTr2, and nTr3 and counter electrodes 29 are formed in this order on the one main surface side of the semiconductor substrate 21, and contacts 31 are also formed to penetrate through the laminated insulation film 27. The details of these constituent elements are as follows.

[Semiconductor Substrate 21]

The semiconductor substrate 21 includes an active region 21a on a front surface layer on the one main surface side. The active region 21a is a region that is surrounded by an element isolation region 21b of which a circumference is of a thin groove type. The n-type transistors nTr1, nTr2, and nTr3 to be described below are formed using the active region 21a.

Such a semiconductor substrate 21 may be formed of, for example, silicon (Si), but an embodiment of the present technology is not limited thereto. The semiconductor substrate may be formed of another semiconductor material suitable for the n-type transistors nTr1, nTr2, and nTr3. Examples of other materials include germanium (Ge), silicon germanium (SiGe), silicon carbide (SiC), carbon (C), carbon nanotubes, graphene, gallium arsenide (GaAs), and indium gallium arsenide (InGaAs). Using the first element layer 10-1 and the semiconductor substrate 21 formed of, particularly, indium gallium arsenide (InGaAs) among the above materials, high performance of the n-type transistors nTr1, nTr2, and nTr3 is achieved.

The semiconductor substrate 21 may be a substrate (a so-called SOI substrate) in which a thin-film semiconductor layer is formed on an insulation substrate. In this case, the active region 21a and the element isolation region 21b are assumed to be formed in this semiconductor layer.

[n-Type Transistors nTr1, nTr2, and nTr3]

The n-type transistors nTr1, nTr2, and nTr3 are elements formed using the active region 21a. Each of the n-type transistors nTr1, nTr2, and nTr3 includes a gate insulation film 23 (illustrated only in the sectional views) covering the one main surface side of the semiconductor substrate 21 and a gate electrode 25 (see FIGS. 2, 4, and 5) disposed to traverse this active region 21a via the gate insulation film.

Here, the gate insulation film 23 is formed using, for example, a high dielectric film. Examples of the high dielectric film include not only a silicon nitride film (SiN) but also a hafnium oxide film ($HfO_2$), a tantalum oxide film ($TaO_2$), an aluminum oxide film ($AlO_2$), and corresponding nitride films.

The gate electrode 25 may be used by selecting a material suitable for the n-type transistor in consideration of, for example, a work function.

In each of the n-type transistors nTr1, nTr2, and nTr3, the active region 21a interleaved with the gate electrode 25 and located at both sides thereof is configured as a source and drain S/D (see FIGS. 6 to 8), and the source and drain S/D is configured to be shared by the adjacent transistors. This source and drain S/D is an n-type region and may be metalized. The active region 21a superimposed on the gate electrode 25 is a portion serving as a channel region and remaining as a region which does not become the n-type region, is not metalized, and thus remains as a region in which semiconductor characteristics are maintained.

Figure 4:
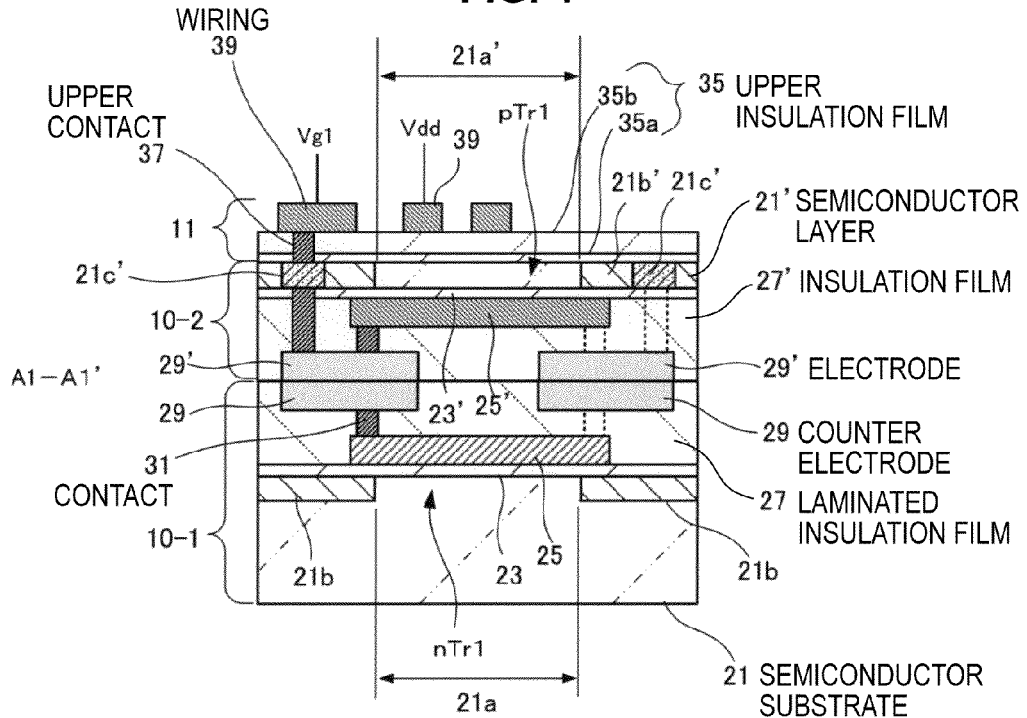
FIG. 4 is a sectional view taken along the line A1-A1' of FIG. 1.
Figure 5:
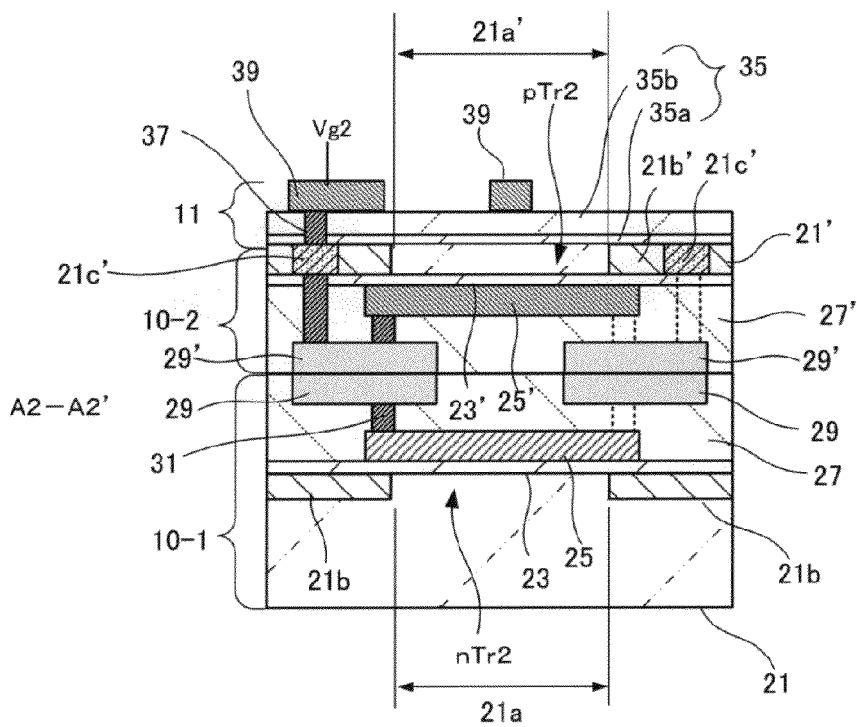
FIG. 5 is a sectional view taken along the line A2-A2' of FIG. 1.
Figure 6:
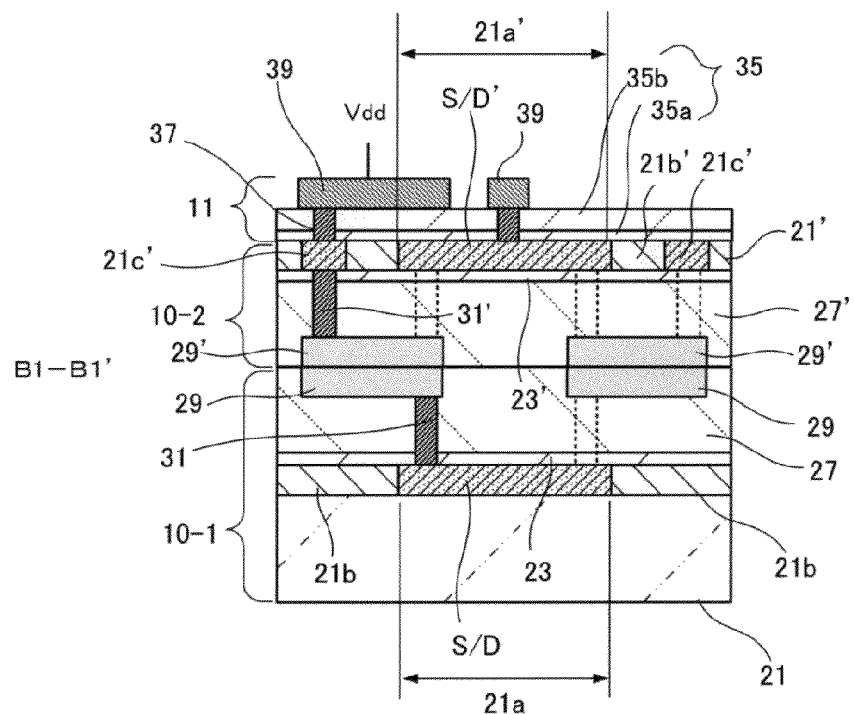
FIG. 6 is a sectional view taken along the line B1-B1' of FIG. 1.
Figure 7:
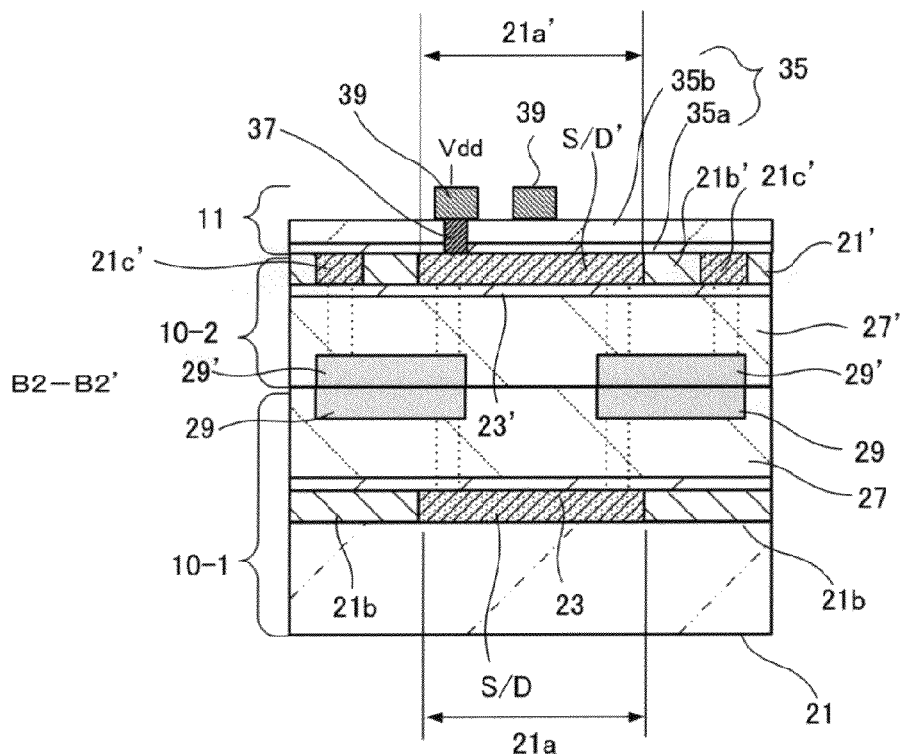
FIG. 7 is a sectional view taken along the line B2-B2' of FIG. 1.
Figure 8:
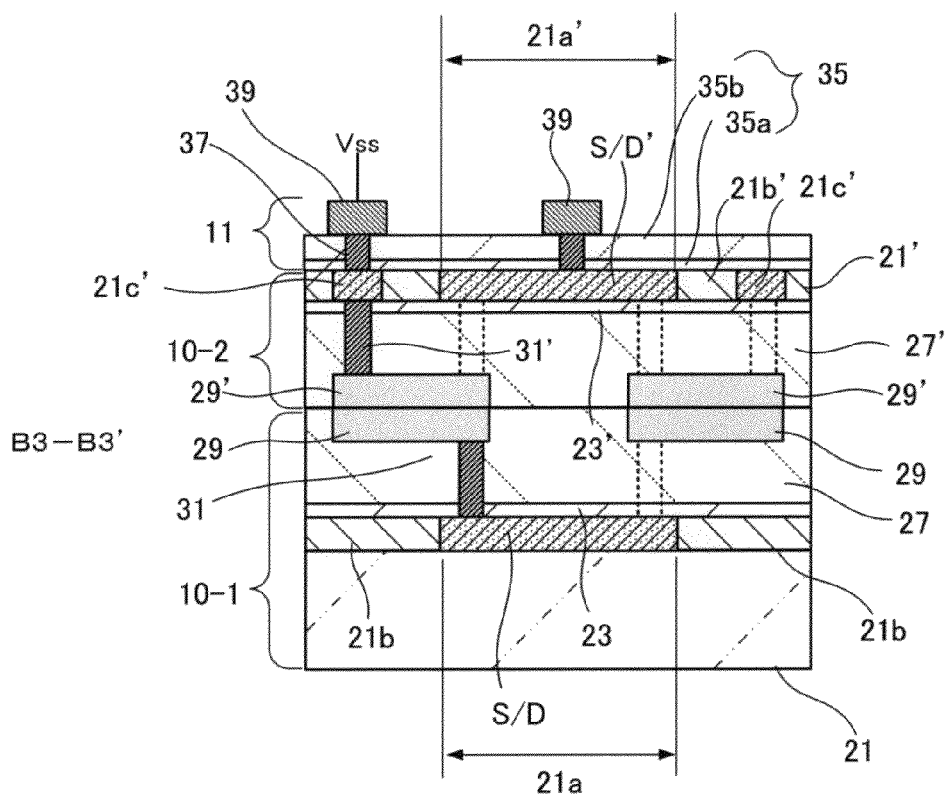
FIG. 8 is a sectional view taken along the line B3-B3' of FIG. 1.

FIG. 4 is a sectional view taken in the extension direction of the gate electrode 25 in the n-type transistor nTr1. FIG. 5 is a sectional view taken in the extension direction of the gate electrode 25 in the n-type transistor nTr2. As illustrated in these drawings, each gate electrode 25 is extracted with a sufficient length from the active region 21a to a region superimposed on the element isolation region 21b so that this gate electrode comes into contact with the gate electrode 25 at the position superimposed on the element isolation region 21b.

[Laminated Insulation Film 27]

The laminated insulation film 27 is formed to embed the n-type transistors nTr1, nTr2, and nTr3 on the one main surface side of the semiconductor substrate 21 and is formed as a planarized insulation film with a planar surface. The laminated insulation film 27 is formed to be joined with an insulation film 27' of the second element layer 10-2 to be described below.

[Counter Electrodes 29]

The plurality of counter electrodes 29 are the electrodes 29 facing electrodes 29' formed in the second element layer 10-2 to be described below and are formed on one main surface side of the laminated insulation film 27 in a one-to-one joining state with the electrodes 29'. The counter electrodes 29 are each wired in the extension direction of the gate electrode 25 and are each disposed on both sides of the active region 21a so that one end side of the counter electrode is disposed to be superimposed on the active region 21a and the other end side thereof is disposed to be superimposed on the element isolation region 21b.

The six counter electrodes 29 described above are disposed in each of the n-type transistors nTr1, nTr2, and nTr3. That is, in each of the n-type transistors nTr1, nTr2, and nTr3, two counter electrodes 29 are formed so that one ends thereof are superimposed on both ends of each gate electrode 25 in its extension direction. Further, in each of the n-type transistors nTr1, nTr2, and nTr3, two counter electrodes 29 are disposed such that one ends thereof are superimposed on portions of the active region 21a on each of both flanks of the gate electrode 25, that is, the source and drain S/D, in other words, a total of four counter electrodes 29 are disposed. Thus, a total of six counter electrodes 29 are disposed in each of the n-type transistors nTr1, nTr2, and nTr3. However, the n-type transistor nTr2 disposed in the middle shares the source and drain S/D with both of the n-type transistors nTr1 and nTr3. Therefore, a total of fourteen counter electrodes 29 are disposed in the three n-type transistors nTr1, nTr2, and nTr3.

Such counter electrodes 29 have a constant planar shape and are arranged regularly at constant intervals in the arrangement direction of the gate electrodes 25.

The above-described counter electrodes 29 are formed as embedded electrodes that are embedded in the laminated insulation film 27, are disposed to have the same height as the one main surface of the laminated insulation film 27, and are formed of, for example, copper (Cu).

[Contacts 31]

The contacts 31 are formed to penetrate through the laminated insulation film 27. The contacts 31 are selectively formed in portions according to necessity among portions that connect the gate electrodes 25 and the source and drain S/D to the counter electrodes 29 in the n-type transistors nTr1, nTr2, and nTr3. Of the portions, the portions that connect the gate electrodes 25 to the counter electrodes 29 refer to six portions in which the gate electrodes 25 and the counter electrodes 29 are disposed to be superimposed on each other in the element isolation region 21b on the outside of the active region 21a. Further, the portions that connect the source and drain S/D to the counter electrodes 29 refer to eight portions in which the active region 21a and the counter electrodes 29 are disposed to be superimposed on each other without intervention of the gate electrodes 25.

Of the portions, the contacts 31 penetrating through the laminated insulation film 27 are selectively formed in the portions necessary according to a circuit formed using the n-type transistors nTr1, nTr2, and nTr3. That is, the connection states between the n-type transistors nTr1, nTr2, and nTr3 and the counter electrodes 29 are selected by selection of the positions of the portions in which the contacts 31 are formed among the above-described portions.

For example, in the present semiconductor device 1, the NAND circuit is formed using two n-type transistors nTr1 and nTr2, and thus the positions at which the contacts 31 are formed are selected as follows.

First, referring to FIGS. 2, 4, and 5, the contacts 31 are formed to connect the gate electrodes 25 of the n-type transistors nTr1 and nTr2 to the counter electrodes 29 disposed to be superimposed on the gate electrodes. Although two counter electrodes 29 are disposed to be superimposed on each gate electrode 25 in this case, each gate electrode 25 may be connected to at least one counter electrode 29.

Further, referring to FIGS. 2 and 6 to 8, the contacts 31 are formed to connect the sources and drains S/D not shared by the two n-type transistors nTr1 and nTr2 to the counter electrodes 29 disposed to be superimposed on the sources and drains S/D. Although two counter electrodes 29 are disposed to be superimposed on each source and drain S/D in this case, the source and drain S/D may be connected to at least one counter electrode 29.

<Second Element Layer 10-2>

The second element layer 10-2 illustrated in the plan views of FIGS. 1 and 3 and the sectional views of FIGS. 4 to 8 includes p-type transistors pTr1, pTr2, and pTr3 on one main surface (on the side of the first element layer 10-1) of a thinned semiconductor layer 21'. A laminated insulation film 27' (illustrated only in the sectional views) covering these p-type transistors pTr1, pTr2, and pTr3 and electrodes 29' are formed in this order on the one main surface side of the semiconductor layer 21', and contacts 31' are also formed to penetrate through the insulation film 27'.

In particular, the semiconductor layer 21' is characterized by including connection regions 21c' in addition to an active region 21a'. These connection regions are regions different from the first element layer 10-1. Hereinafter, these constituent elements will be described in detail.

[Semiconductor Layer 21']

The semiconductor layer 21' is formed of a thin-film semiconductor and includes the connection regions 21c' in addition to the active region 21a'. The active region 21a' and the connection regions 21c' are regions of which circumferences are surrounded by an element isolation region 21b' with an insulation property. Of the regions, the active region 21a' form parts of the p-type transistors pTr1, pTr2, and pTr3 to be described below.

On the other hand, the connection regions 21c' are regions that are formed such that parts of the semiconductor layer 21' are metalized in an island shape isolated from the active region 21a', and may have the same configuration as a source and drain S/D' formed in the active region 21a'. Each connection region 21c' is formed in an independent island shape at a position superimposed on one end side of each electrode 29' to be described below extracted to the outside of the active region 21a'.

Accordingly, in the case of the exemplary configuration in which fourteen electrodes 29' are formed in the second element layer 10-2, the connection region 21c' is formed at each of the fourteen independent positions.

Such semiconductor layers 21' may be formed using silicon (Si), but an embodiment of the present technology is not limited thereto. Different semiconductor materials suitable for the p-type transistors pTr1, pTr2, and pTr3 may be used. For example, the same material as that of the semiconductor substrate 21 forming the first element layer 10-1 is used as a material other than silicon. In particular, the high perfor-mance of the p-type transistors pTr1, pTr2, and pTr3 is achieved using the semiconductor layer 21' formed of germanium (Ge).

[p-Type Transistors pTr1, pTr2, and pTr3]

The p-type transistors pTr1, pTr2, and pTr3 are elements formed using the active region 21a'. Each of the p-type transistors pTr1, pTr2, and pTr3 includes a gate insulation film 23' (illustrated only in the sectional views) covering one main surface side of the second element layer 10-2 and a gate electrode 25' disposed to traverse the active region 21a' via this gate insulation film.

Here, the gate insulation film 23' is formed using the same high dielectric film as the gate insulation film 23 of the n-type transistors nTr1, nTr2, and nTr3.

On the other hand, the gate electrode 25' may be used by selecting a material suitable for the p-type transistor in consideration of, for example, a work function.

In each of the p-type transistors pTr1, pTr2, and pTr3, the active region 21a' interleaved with the gate electrode 25' and located at both sides thereof is configured as a source and drain S/D', and the source and drain S/D' is configured to be shared by the adjacent transistors. This source and drain S/D' is a p-type region and may be metalized. The active region 21a' superimposing the gate electrode 25' is a portion serving as a channel region and remaining as a region which does not become the n-type region, is not metalized, and thus remains as a region in which semiconductor characteristics are maintained.

FIG. 4 is a sectional view taken in an extension direction of the gate electrode 25' in the p-type transistor pTr1. FIG. 5 is a sectional view taken in the extension direction of the gate electrode 25' in the p-type transistor pTr2. As illustrated in these drawings, each gate electrode 25' is extracted with a sufficient length from the active region 21a' to a position superimposed on the element isolation region 21b' so that this gate electrode comes into contact with the gate electrode 25' at the position superimposed on the element isolation region 21b'.

[Insulation Film 27']

The insulation film 27' is formed to embed the p-type transistors pTr1, pTr2, and pTr3 on the one main surface side of the second element layer 10-2 and is formed as a planarized insulation film with a planar surface. The insulation film 27' is formed to be joined with the laminated insulation film 27 of the first element layer 10-1.

[Electrodes 29']

The plurality of electrodes 29' are the electrodes 29' facing the counter electrodes 29 formed on the side of the above-described first element layer 10-1 and are formed on the one main surface side of the insulation film 27' in a one-to-one joining state with the counter electrodes 29. The electrodes 29' are each wired in the extension direction of the gate electrode 25' and are each disposed on both sides of the active region 21a' so that one end side of the electrode is disposed to be superimposed on the active region 21a' and the other end side thereof is disposed to be superimposed on the connection region 21c'.

The six electrodes 29' described above are disposed in each of the p-type transistors pTr1, pTr2, and pTr3. That is, in each of the p-type transistors pTr1, pTr2, and pTr3, two counter electrodes 29' are formed so that one ends thereof are superimposed on both ends in the extension direction of each gate electrode 25'. Further, in each of the p-type transistors pTr1, pTr2, and pTr3, two electrodes 29' are disposed such that one ends thereof are superimposed on portions of the active region 21a' on each of both flanks of the gate electrode 25', that is, the source and drain S/D', in other words, a total of four electrodes 29' are disposed. Thus, a total of six electrodes 29' are disposed in each of the p-type transistors pTr1, pTr2, and pTr3. However, the p-type transistor pTr2 disposed in the middle shares the source and drain S/D' with the p-type transistors pTr1 and pTr3 on both sides. Therefore, a total of fourteen electrodes 29' are disposed in the three p-type transistors pTr1, pTr2, and pTr3.

These electrodes 29' have a constant planar shape and are arranged regularly at constant intervals in the arrangement direction of the gate electrodes 25'.

Each of the above-described electrodes 29' is configured as an embedded electrode that is embedded in the insulation film 27', is disposed to have the same height as the one main surface of the insulation film 27', and is formed of, for example, copper (Cu).

[Contacts 31']

The contacts 31' are formed to penetrate through the insulation film 27'. The contacts 31' are selectively formed in portions according to necessity among portions that connect the gate electrodes 25' and the source and drain S/D' to the electrodes 29' in the p-type transistors pTr1, pTr2, and pTr3. Further, the contacts 31' are selectively connected to the connection regions 21'c using these connection regions as electrode pads. That is, the contacts 31' are also selectively formed in portions according to necessity among portions that connect the connection regions 21c' to the electrodes 29'.

Of the portions, the portions that connect the gate electrodes 25' to the electrodes 29' refer to six portions in which the gate electrodes 25' and the electrodes 29' are disposed to be superimposed on each other in the element isolation region 21b' on the outside of the active region 21a'. Further, the portions that connect the source and drain S/D' to the electrodes 29' refer to eight portions in which the active region 21a' and the electrodes 29' are disposed to be superimposed on each other without intervention of the gate electrodes 25'. Further, the portions that connect the connection regions 21c' to the electrodes 29' refer to fourteen portions in which the connection regions 21c' and the electrodes 29' are disposed to be superimposed on each other.

Of the portions, the contacts 31' penetrating through the insulation film 27' are selectively formed in the portions necessary according to a circuit formed using these p-type transistors pTr1, pTr2, and pTr3. That is, the connection states between the p-type transistors pTr1, pTr2, and pTr3 and the connection regions 21c', and the electrodes 29' are selected by selection of the positions of the portions in which the contacts 31' are formed among the above-described portions. Further, the connection states between the p-type transistors pTr1, pTr2, and pTr3 and the connection regions 21c' via the electrodes 29' are selected by selection of the positions at which the contacts 31' are formed.

For example, in the present semiconductor device 1, the NAND circuit is formed using two p-type transistors pTr1 and pTr2, and thus the positions at which the contacts 31' are formed are selected as follows.

First, referring to FIGS. 3, 4, and 5, the contacts 31' are formed in the selected portions so that the gate electrodes 25' of the p-type transistors pTr1 and pTr2 are connected to the gate electrodes 25 of the n-type transistors nTr1 and nTr2 disposed to face each other.

Further, referring to FIGS. 3 and 6 to 8, the contacts 31' are formed in the selected portions so that the sources and drains S/D in the n-type transistors nTr1 and nTr2 of the first element layer 10-1 are individually connected to the connection regions 21c'.

<Wiring Layer 11>

The wiring layer 11 is formed on the top of the second element layer 10-2. This wiring layer 11 has a configuration in which an upper insulation film 35 (illustrated only in the sectional views), upper contacts 37, and wirings 39 are disposed in this order from the side of the second element layer 10-2. The details of each constituent element are as follows.

[Upper Insulation Film 35]

The upper insulation film 35 is a layer that is formed to come into contact with the second element layer 10-2 and is formed on an opposite side to the insulation film 27' with the semiconductor layer 21' of the second element layer 10-2 interposed therebetween. The upper insulation film 35 is configured to have a lamination structure in which a first layer 35a formed using the same high dielectric film as that used in the gate insulation film 23' and a second layer 35b having protective-film characteristics of the upper layer are laminated in order from the side of the semiconductor layer 21'.

[Upper Contacts 37]

The upper contacts 37 are formed to penetrate through the upper insulation film 35. The upper contacts 37 are selectively formed in portions according to necessity among portions connected to the connection regions 21c' or the sources and drains S/D' of the active region 21a' in the second element layer 10-2. Here, for example, the upper contacts 37 are selectively formed at positions serving as terminals of the NAND circuit and positions serving as terminals connecting elements included in the NAND circuit.

[Wirings 39]

The wirings 39 are formed on one main surface side of the upper insulation film 35 so that these wirings are connected to the upper contacts 37. These wirings 39 are formed as a Vdd terminal, a Vss terminal, a Vg1 terminal, and a Vg2 terminal in the NAND circuit and as connection wirings between the sources and drains S/D of the p-type transistors pTr1 and pTr2, so that the NAND circuit is formed.

<Advantages of Structure According to First Embodiment>

In the semiconductor device 1 having the above-described configuration, the connection regions 21c' obtained by metalizing parts of the same semiconductor layer 21' as the active region 21a' are used as electrode pads. Therefore, potentials of respective portions of the p-type transistors pTr1, pTr2, and pTr3 can be extracted to the connection regions 21c' by selectively disposing the contacts 31' between the connection regions 21c' and the electrodes 29' and between the p-type transistors pTr1, pTr2, and pTr3 and the electrodes 29'. Further, since the counter electrodes 29 connected to the portions of the n-type transistors nTr1, nTr2, and nTr3 are joined with the electrodes 29', the potentials of the respective portions of the n-type transistors nTr1, nTr2, and nTr3 can be extracted to these connection regions 21c' via these counter electrodes 29 and these electrodes 29'.

As described above, a desired circuit can be formed by the selection of the disposition of the contacts 31' without depending on only routing of the counter electrodes 29, the electrodes 29', and the wirings 39. As a result, miniaturization of the semiconductor device can be achieved.

Figure 10:
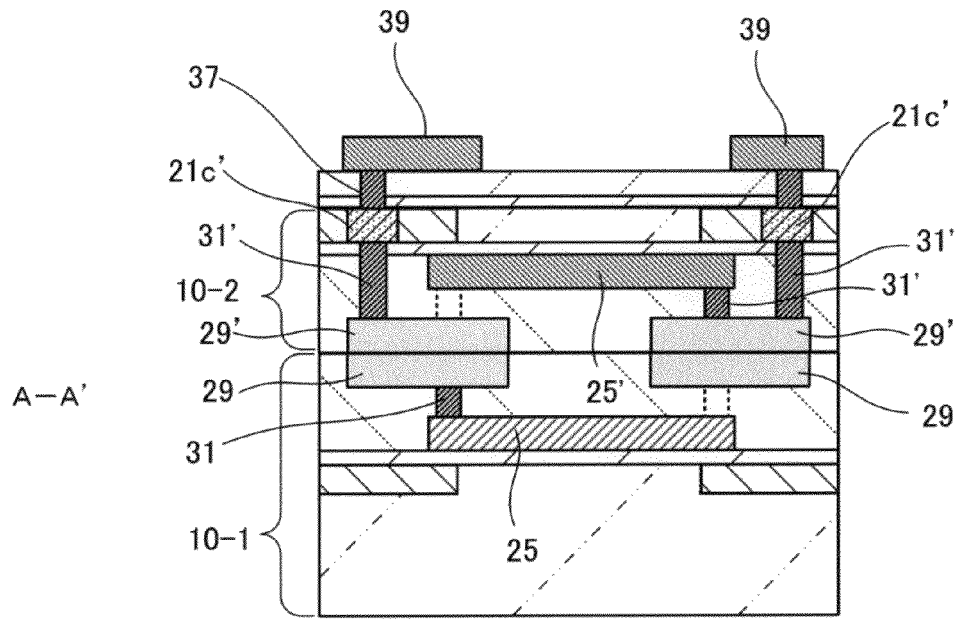
FIG. 10 is a sectional view taken along the line A-A' and illustrating a connection configuration example of portions of gate electrodes in the semiconductor device according to the first embodiment.
Figure 11:
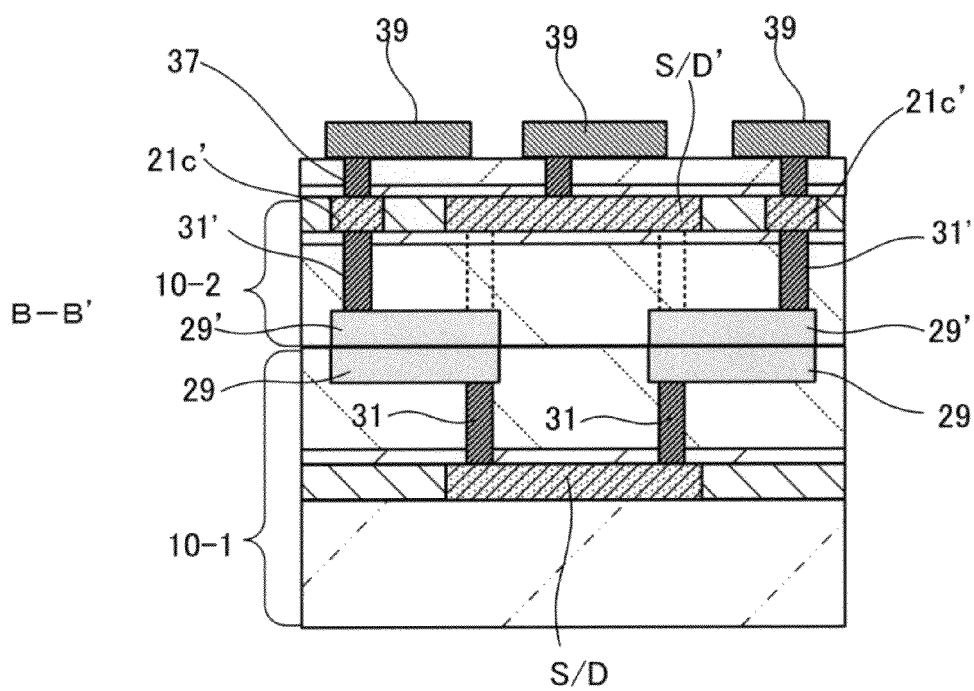
FIG. 11 is a sectional view taken along the line B-B' and illustrating connection configuration example—1 of portions of sources and drains in the semiconductor device according to the first embodiment.
Figure 12:
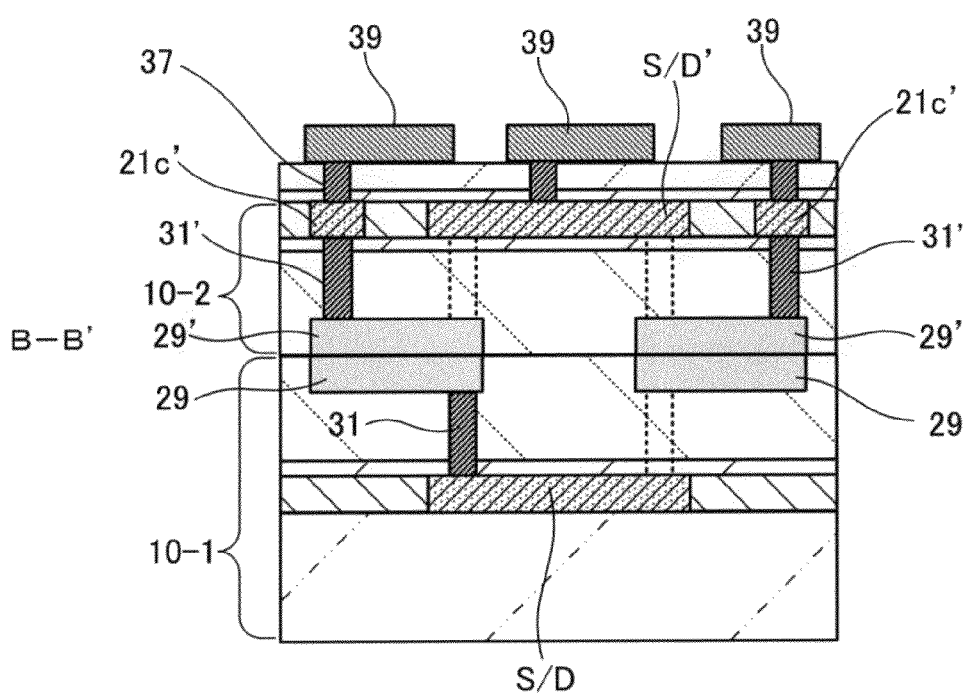
FIG. 12 is a sectional view taken along the line B-B' and illustrating connection configuration example—2 of portions of sources and drains in the semiconductor device according to the first embodiment.

Here, FIGS. 10 to 12 illustrate selective disposition examples of the contacts 31 and 31' in the semiconductor device 1.

FIG. 10 is a sectional view taken along the line A-A' and illustrating a connection configuration example of the portions of the gate electrodes 25 and 25' in the semiconductor device 1 according to the first embodiment. In the semiconductor device 1 according to the first embodiment, as illustrated in the drawing, the gate electrodes 25 of the first element layer 10-1 and the gate electrodes 25' of the second element layer 10-2 can be individually extracted up to the wirings 39 by the selection of the disposition of the contacts 31 and 31'.

Further, FIG. 11 is a sectional view taken along the line B-B' and illustrating connection configuration example—1 of the portions of the sources and drains S/D and S/D' in the semiconductor device 1 according to the first embodiment. In the semiconductor device 1 according to the first embodiment, as illustrated in the drawing, the sources and drains S/D of the first element layer 10-1 can be individually extracted to two wirings 39 by the selection of the disposition of the contacts 31 and 31'.

Furthermore, FIG. 12 is a sectional view taken along the line B-B' and illustrating connection configuration example—2 of the portions of the sources and drains S/D and S/D' in the semiconductor device 1 according to the first embodiment. In the semiconductor device 1 according to the first embodiment, as illustrated in the drawing, the sources and drains S/D of the first element layer 10-1 and the sources and drains S/D' of the second element layer 10-2 can be individually extracted up to the wirings 39 by the selection of the disposition of the contacts 31, 31', and 37. Although not illustrated here, the sources and drains S/D' of the second element layer 10-2 can also be extracted to three wirings 39 by the selection of the disposition of the contacts 31, 31', and 37.

Thus, in the present first embodiment, the cases in which the NAND circuit is formed by the selection of the disposition of the contacts 31, 31', and 37 have been exemplified. However, application of the present first embodiment is not limited thereto. Digital circuits called standard cells such as, first, NOR and INVERTER, and flip-flop may, of course, be formed with basic 2-dimensional and 3-dimensional structures. An embodiment of the present technology is not limited to the digital circuits, but may be applied to analog circuits as well. The same also applies to embodiments to be described below.

<1-(2) Manufacturing Method>

Next, a method of manufacturing the semiconductor device according to the first embodiment will be described in detail with reference to the drawings. Here, the description will be made in the order of <process of manufacturing first element layer 10-1>, <process of manufacturing second element layer 10-2>, and <lamination process>.

<Process of Manufacturing First Element Layer 10-1>

Figure 13:
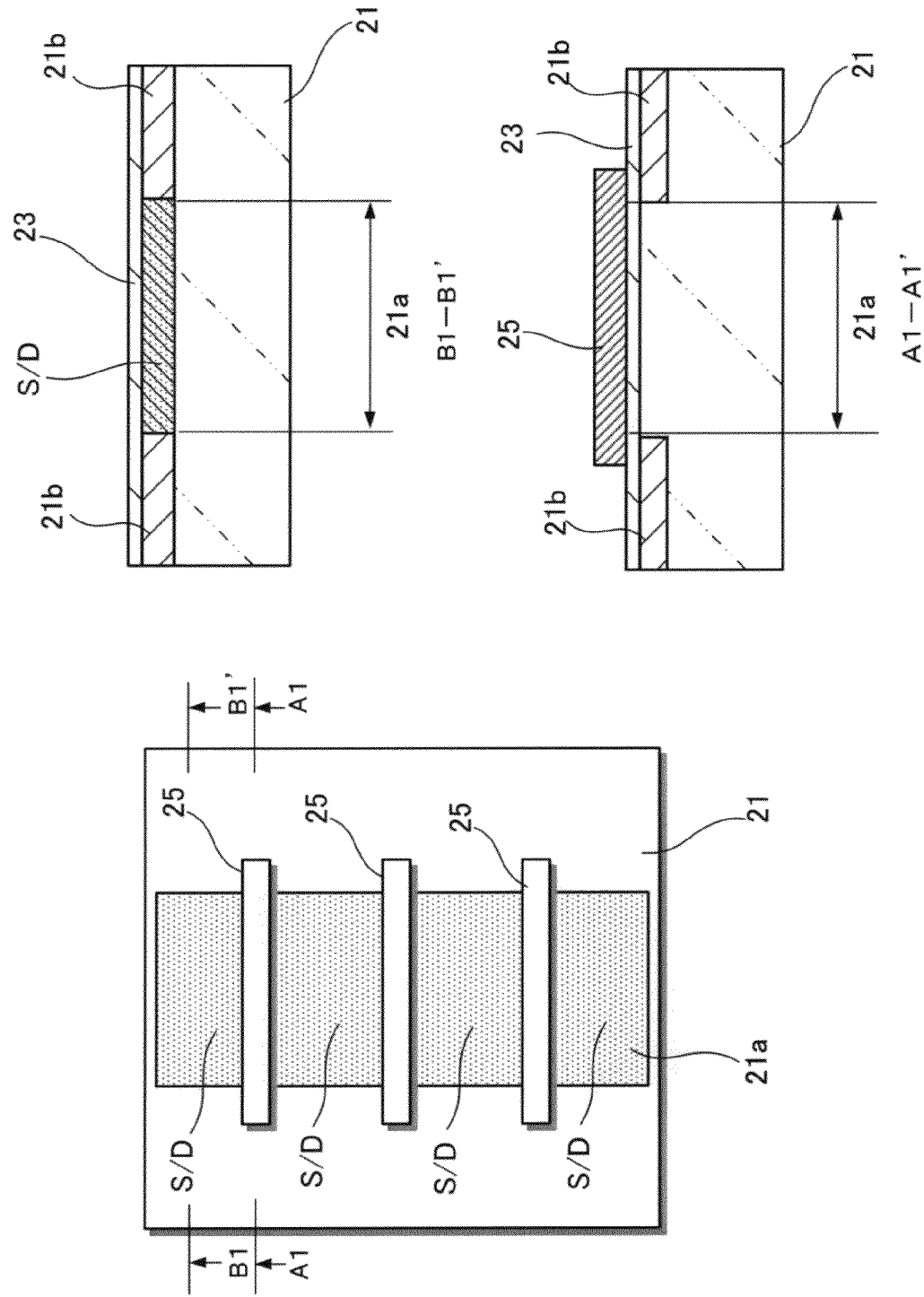
FIG. 13 is a diagram (part 1) illustrating a process of manufacturing a first element layer of the semiconductor device according to the first embodiment.
Figure 14:
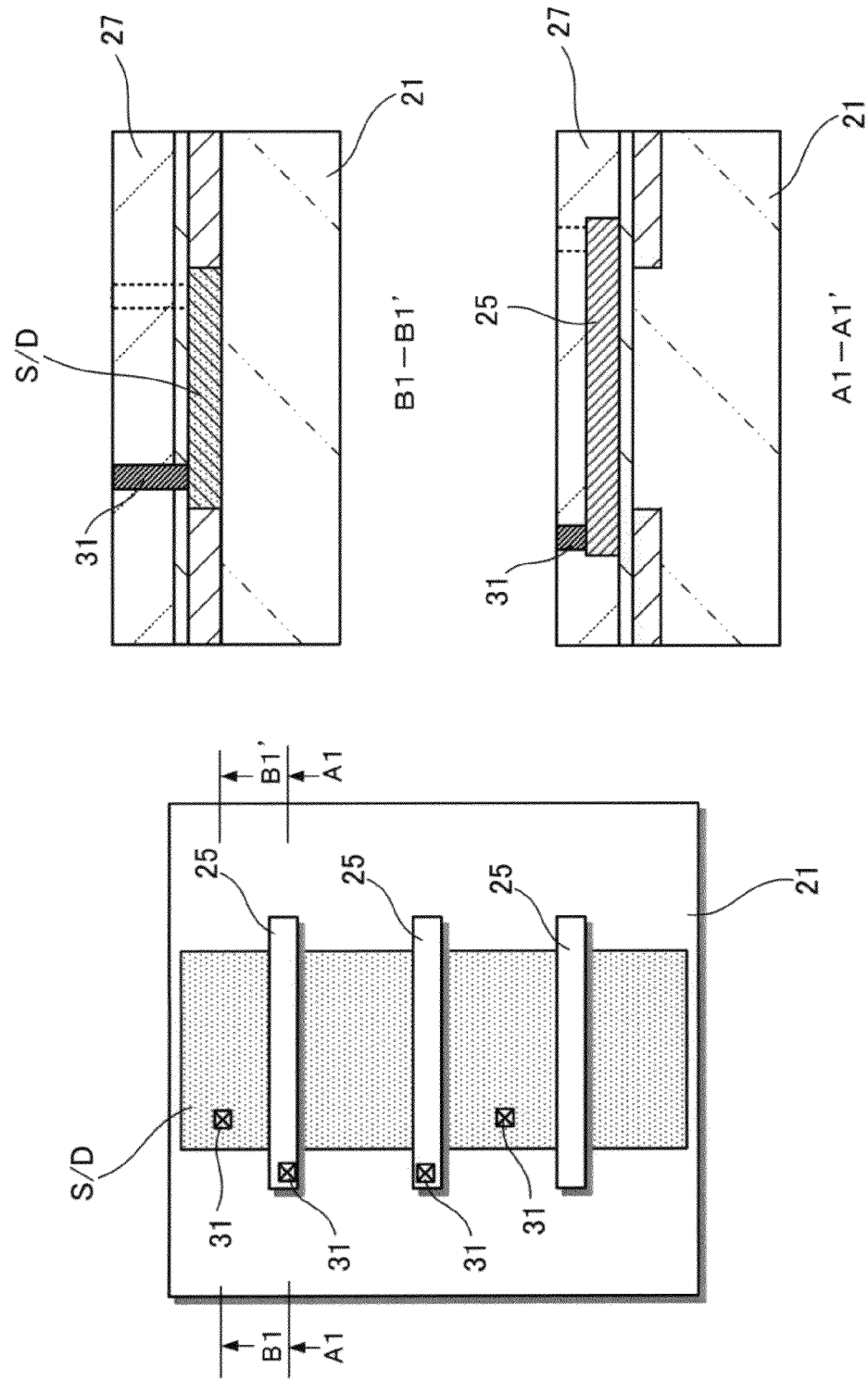
FIG. 14 is a diagram (part 2) illustrating a process of manufacturing a first element layer of the semiconductor device according to the first embodiment.
Figure 15:
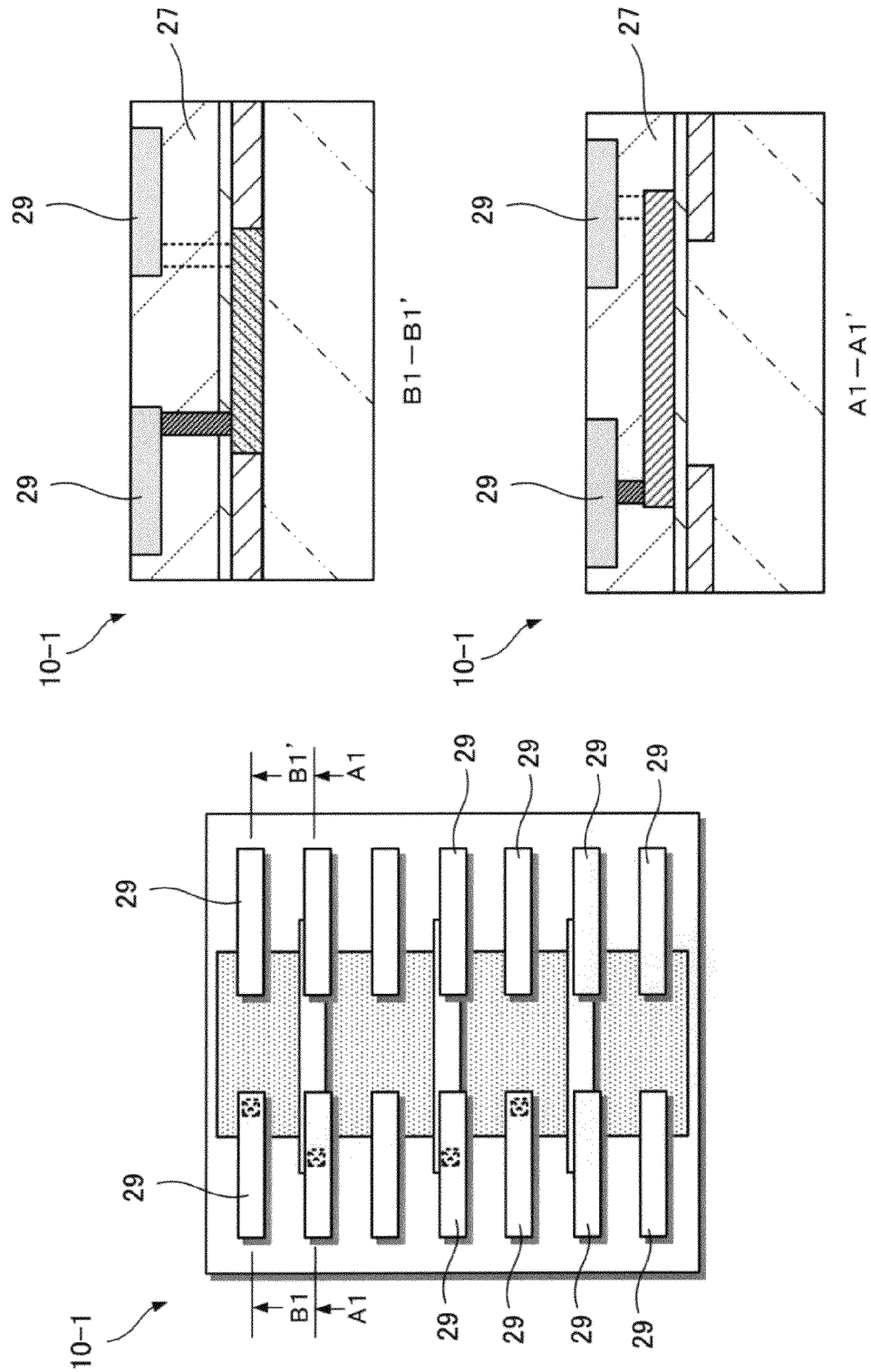
FIG. 15 is a diagram (part 3) illustrating a process of manufacturing a first element layer of the semiconductor device according to the first embodiment.

FIGS. 13 to 15 are diagrams illustrating manufacturing processes to describe processes of manufacturing the first element layer 10-1, and are plan views illustrating one main surface side of the semiconductor substrate 21 and sectional views taken along the lines B1-B1' and A1-A1' of the plan views. As illustrated in these drawings, the first element layer 10-1 is manufactured as follows.

First, as illustrated in FIG. 13, which is a diagram (part 1) illustrating the manufacturing process, the groove-shaped element isolation region 21b is formed on the one main surface side of the semiconductor substrate 21 so as to surround the active region 21a. The n-type source and drain S/D is formed in the active region 21a, the gate insulation film 23 is formed to cover the semiconductor substrate 21, and then the gate electrodes 25 are formed on the top of this gate insulation film. When the substrate is changed to the semiconductor substrate 21 and an SOI substrate is used, the active region 21a and the element isolation region 21b are formed in the thin-film semiconductor layer.

Next, as illustrated in FIG. 14, which is a diagram (part 2) illustrating the manufacturing process, the laminated insulation film 27 (illustrated only in the sectional views) is formed on the one main surface side of the semiconductor substrate 21 so as to cover the gate electrodes 25. Subsequently, the contacts 31 penetrating through the laminated insulation film 27 and reaching the gate electrodes 25 and the source and drain S/D are formed in the portions selected according to necessity.

Thereafter, as illustrated in FIG. 15 which is a diagram (part 3) illustrating the manufacturing process, the laminated insulation film 27 is further accumulated, and then the counter electrodes 29 of which parts are connected to the contacts 31 are formed by applying an embedded-electrode process (a so-called damascene process) to the accumulated laminated insulation film 27. At this time, grooves are formed in the laminated insulation film 27, electrode material films are formed to be embedded in the grooves, and the electrode material films on the laminated insulation film 27 are removed such that the electrode material films remain only in the grooves, and the remaining electrode material films are formed as the counter electrodes 29.

As described above, the above-described first element layer 10-1 can be obtained. The processing order is not particularly limited except that the contacts 31 are formed only in the portions selected from the preset portions and the counter electrodes 29 are formed in a constant shape while constant intervals are maintained, and the manufacturing of the above-described first element layer 10-1 is performed in a normal order. For example, a dual damascene process may be applied when the contacts 31 and the counter electrodes 29 are formed.

<Process of Manufacturing Second Element Layer 10-2>

Figure 16:
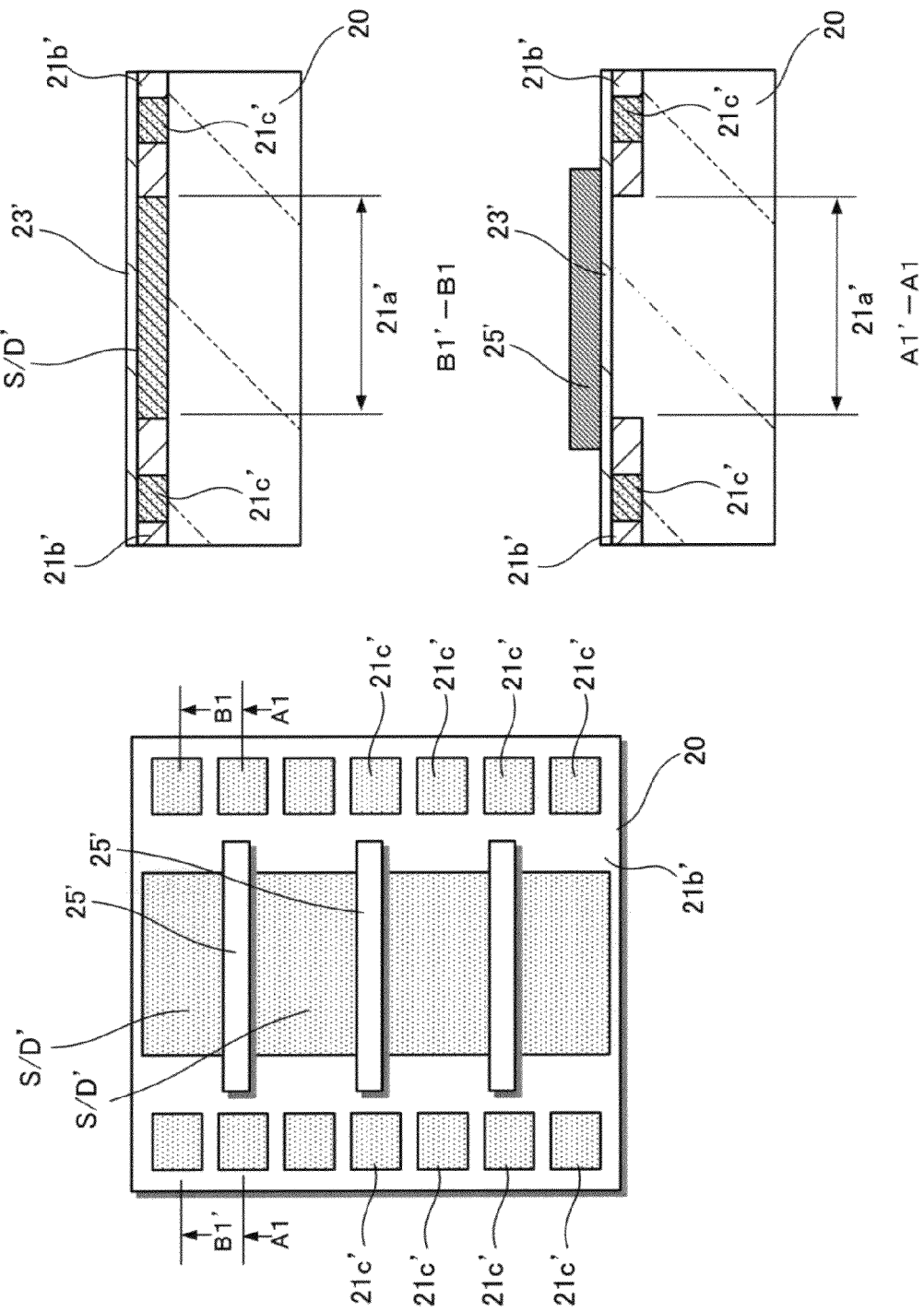
FIG. 16 is a diagram (part 1) illustrating a process of manufacturing a second element layer of the semiconductor device according to the first embodiment.
Figure 17:
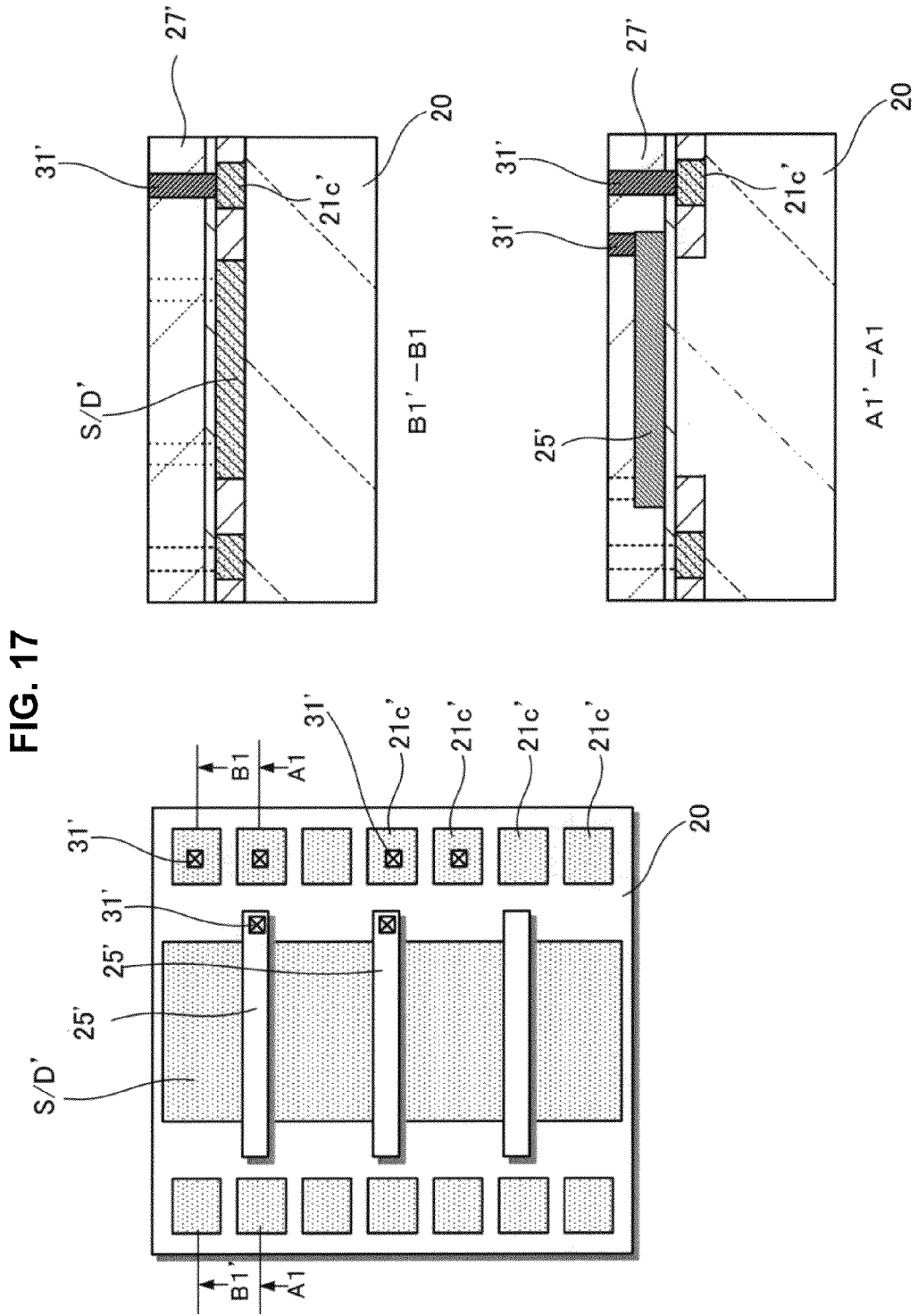
FIG. 17 is a diagram (part 2) illustrating a process of manufacturing a second element layer of the semiconductor device according to the first embodiment.
Figure 18:
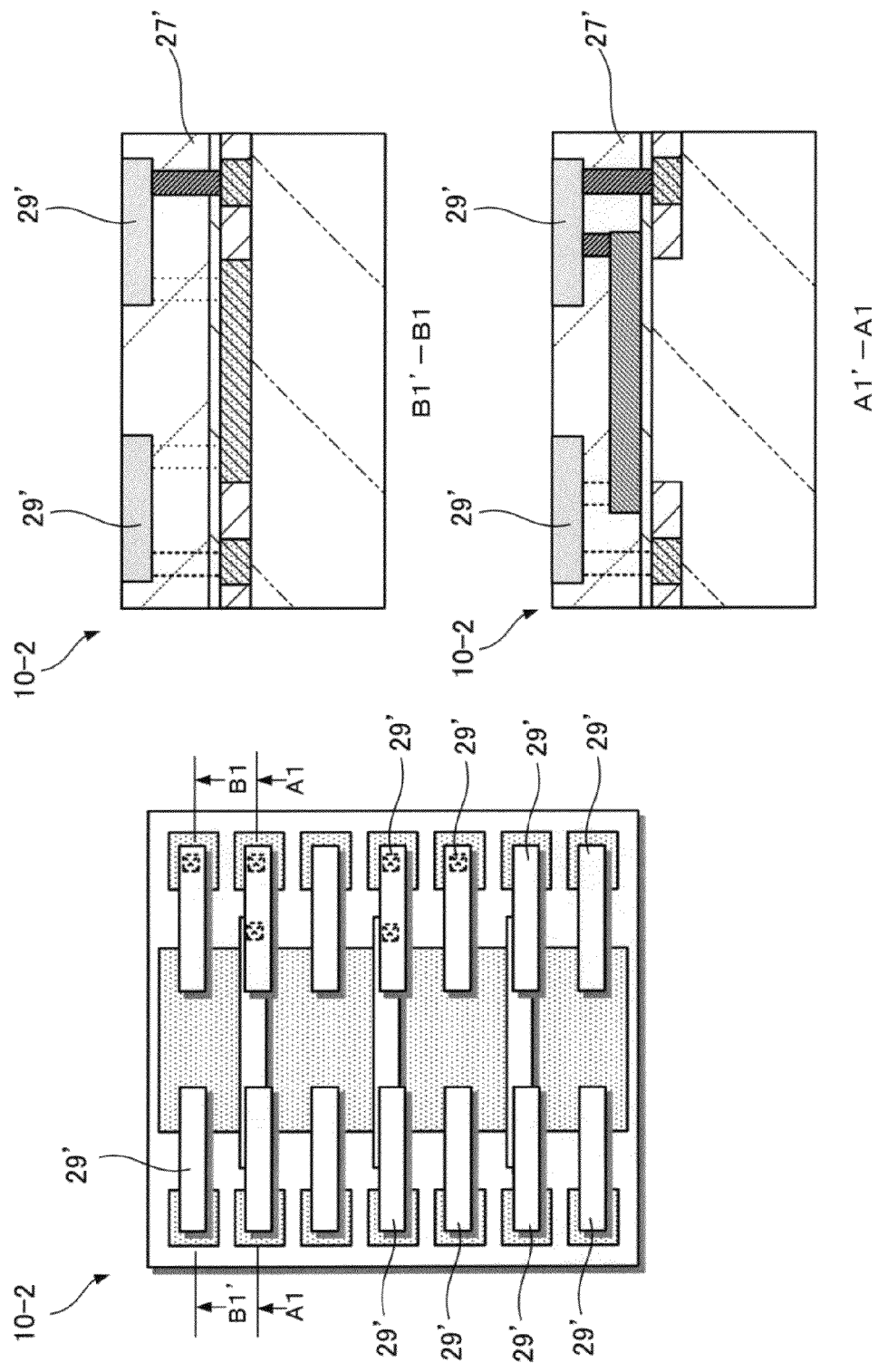
FIG. 18 is a diagram (part 3) illustrating a process of manufacturing a second element layer of the semiconductor device according to the first embodiment.

FIGS. 16 to 18 are diagrams illustrating manufacturing processes to describe processes of manufacturing the second element layer 10-2 and are plan views illustrating one main surface side of the semiconductor layer 21' and sectional views taken along the lines B1'-B1 and A1'-A1 of the plan views. As illustrated in these drawings, the second element layer 10-2 is manufactured as follows.

First, as illustrated in FIG. 16, which is a diagram (part 1) illustrating the manufacturing process, the groove-shaped element isolation region 21b' is formed on the one main surface side of a semiconductor substrate 20 so as to surround the active region 21a' and the connection regions 21c'. At this time, the connection regions 21c' with an island shape independent from the active region 21a' are formed by the element isolation region 21b'. The n-type source and drain S/D' is formed in the active region 21a'. At this time, in the same process as the process of forming the source and drain S/D', the connection regions 21c' with the island shape independent from the active region 21a' are metalized. Further, after the gate insulation film 23' (illustrated only in the sectional views) is formed so that the semiconductor substrate 20 is covered, the gate electrodes 25' are formed on the top of this gate insulation film.

The substrate may be changed to the semiconductor substrate 20 and an SOI substrate may be used. In this case, the active region 21a', the element isolation region 21b', the connection regions 21c', and the source and drain S/D' are formed in the thin-film semiconductor layer, and the gate insulation film 23' and the gate electrodes 25' are formed on the top of the active region, the element isolation region, and the connection regions.

Next, as illustrated in FIG. 17, which is a diagram (part 2) illustrating the manufacturing process, the insulation film 27' (illustrated only in the sectional views) is formed on the one main surface side of the semiconductor substrate 20 so as to cover the gate electrodes 25'. Subsequently, the contacts 31' penetrating through the insulation film 27' and reaching the gate electrodes 25' and the source and drain S/D' are formed in the portions selected according to necessity.

Thereafter, as illustrated in FIG. 18, which is a diagram (part 3) illustrating the manufacturing process, the insulation film 27' is further accumulated, and then the electrodes 29' are formed by applying an embedded-electrode process (a so-called damascene process) to this insulation film 27'. At this time, grooves are formed in the insulation film 27', electrode material films are formed to be embedded in the grooves, and the electrode material films on the insulation film 27' are removed such that the electrode material films remain only in the grooves, and the remaining electrode material films are formed as the counter electrodes 29. In particular, here, it is important to form the electrodes 29' with a constant shape in correspondence with the counter electrodes of the first element layer described above, while constant intervals are maintained.

As described above, the above-described second element layer 10-2 can be obtained. The manufacturing of the above-described second element layer 10-2 is performed in a normal order except that the connection regions 21c' are formed, the contacts 31' are formed only in the portion selected from the preset portions, and the electrodes 29' are formed in a constant shape while constant intervals are maintained. For example, a dual damascene process may be applied when the contacts 31' and the electrodes 29' are formed.

<Lamination Process>

Figure 19:
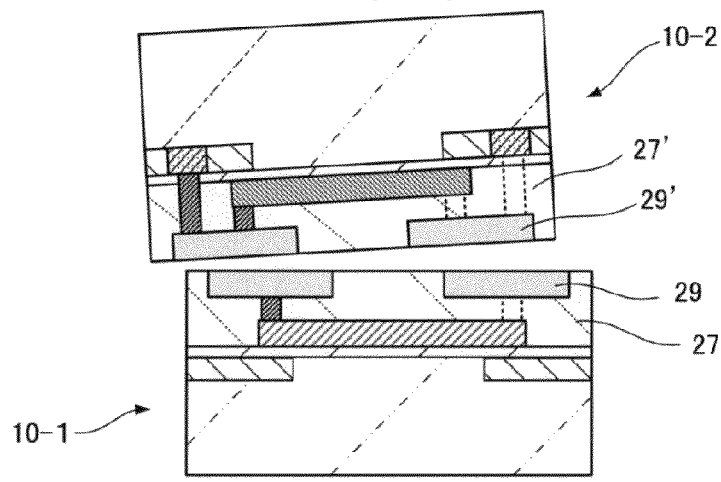
FIG. 19 is a diagram (part 1) illustrating a process of laminating the semiconductor device according to the first embodiment.
Figure 20:
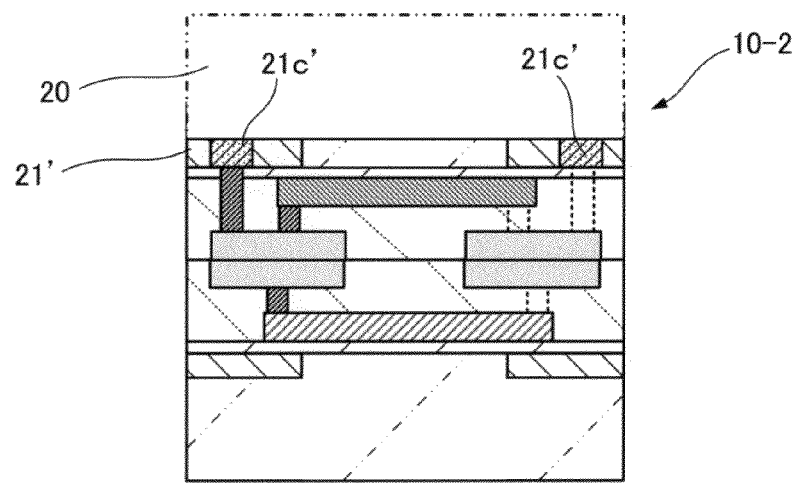
FIG. 20 is a diagram (part 2) illustrating a process of laminating the semiconductor device according to the first embodiment.
Figure 21:
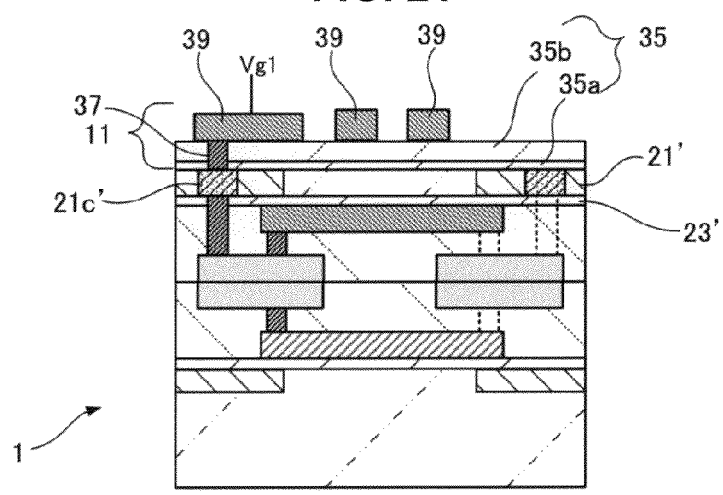
FIG. 21 is a diagram (part 3) illustrating a process of laminating the semiconductor device according to the first embodiment.

FIGS. 19 to 21 are diagrams illustrating a laminating process to describe the process of laminating the first element layer 10-1 and the second element layer 10-2 and correspond to the sectional views taken along the line A1-A1' of the above-described plan views. As illustrated in the drawings, the process of laminating the first element layer 10-1 and the second element layer 10-2 is performed as follows.

First, as illustrated in FIG. 19, which is a diagram (part 1) illustrating the laminating process, the first element layer 10-1 and the second element layer 10-2 are disposed to face each other so that the counter electrodes 29 of the first element layer 10-1 face the electrodes 29' of the second element layer 10-2. At this time, the first element layer 10-1 and the second element layer 10-2 are adjusted so that the counter electrodes 29 and the electrodes 29' correspond to each other in a one-to-one manner. In this state, the counter electrodes 29 of the first element layer 10-1 are joined with the electrodes 29' of the second element layer 10-2. Further, the first element layer 10-1 is bonded to the second element layer 10-2 by joining the laminated insulation film 27 of the first element layer 10-1 with the insulation film 27' of the second element layer 10-2.

In the bonding, heat of about 400° C. is applied and inter-metal joining (for example, Cu-to-Cu) is performed between the counter electrodes 29 and the electrodes 29'. Further, in the joining between the laminated insulation film 27 and the insulation film 27', plasma joining or the like is applied using dehydration and condensation.

On the bonded surfaces, the counter electrodes 29 and the electrodes 29' correspond to each other in the one-to-one manner in the same dimensions and the same shape. However, the dimensions of the bonded portions between the counter electrodes 29 and the electrodes 29' may, of course, be set to be large or small according to processing variation accuracy at the time of forming the respective electrodes and alignment accuracy of the alignment at the time of the bonding. The same also applies to embodiments to be described below.

Next, as illustrated in FIG. 20, which is a diagram (part 2) illustrating the laminating process, the semiconductor substrate 20 of the second element layer 10-2 is cut until the connection regions 21c' are exposed from the exposed surface side, so that the semiconductor layer 21' obtained by thinning the semiconductor substrate 20 on the side of the second element layer 10-2 is formed. At this time, when the substrate is changed to the semiconductor substrate 20 and the SOI substrate is used, only the thin-film semiconductor layer may remain by peeling an insulation substrate portion in the SOI substrate.

Thereafter, as illustrated in FIG. 21, which is a diagram (part 3) illustrating the laminating process, the wiring layer 11 is formed on the semiconductor layer 21' of the second element layer 10-2. In this case, the upper insulation film 35 with the lamination structure is formed by forming the first layer 35a formed of the same high dielectric film as the gate insulation film 23' and the second layer 35b having the protective-film characteristics of the upper layer in order. Next, the upper contacts 37 penetrating through the upper insulation film 35 and reaching the connection regions 21c' and the source and drain S/D' (not illustrated here) are formed in portions selected according to necessity.

Further, the semiconductor device 1 is completed by forming the wirings 39 connected to the upper contacts 37 on the upper insulation film 35.

<Advantages of Manufacturing Method According to First Embodiment>

According to the above-described manufacturing method, the semiconductor device 1 with the above-described configuration can be manufactured. Since the counter electrodes 29 of the first element layer 10-1 and the electrodes 29' of the second element layer 10-2 are formed in the constant shapes while the constant intervals are maintained, it is possible to form the counter electrodes 29 and the electrodes 29' of which heights are constantly maintained. For example, when the embedded-electrode process is applied to form these counter electrodes 29 and these electrodes 29', the removal film thickness of the electrode material film can be prevented from varying, and thus the counter electrodes 29 and the electrodes 29' of which the heights are constantly maintained are formed. As a result, when the first element layer 10-1 and the second element layer 10-2 are laminated to be bonded, adhesion can be improved, and thus the joining strength of the first element layer 10-1 and the second element layer 10-2 can be ensured.

Second Embodiment

Example Lamination Structure of 3 or More Layers 2-(1) Structure

Figure 22:
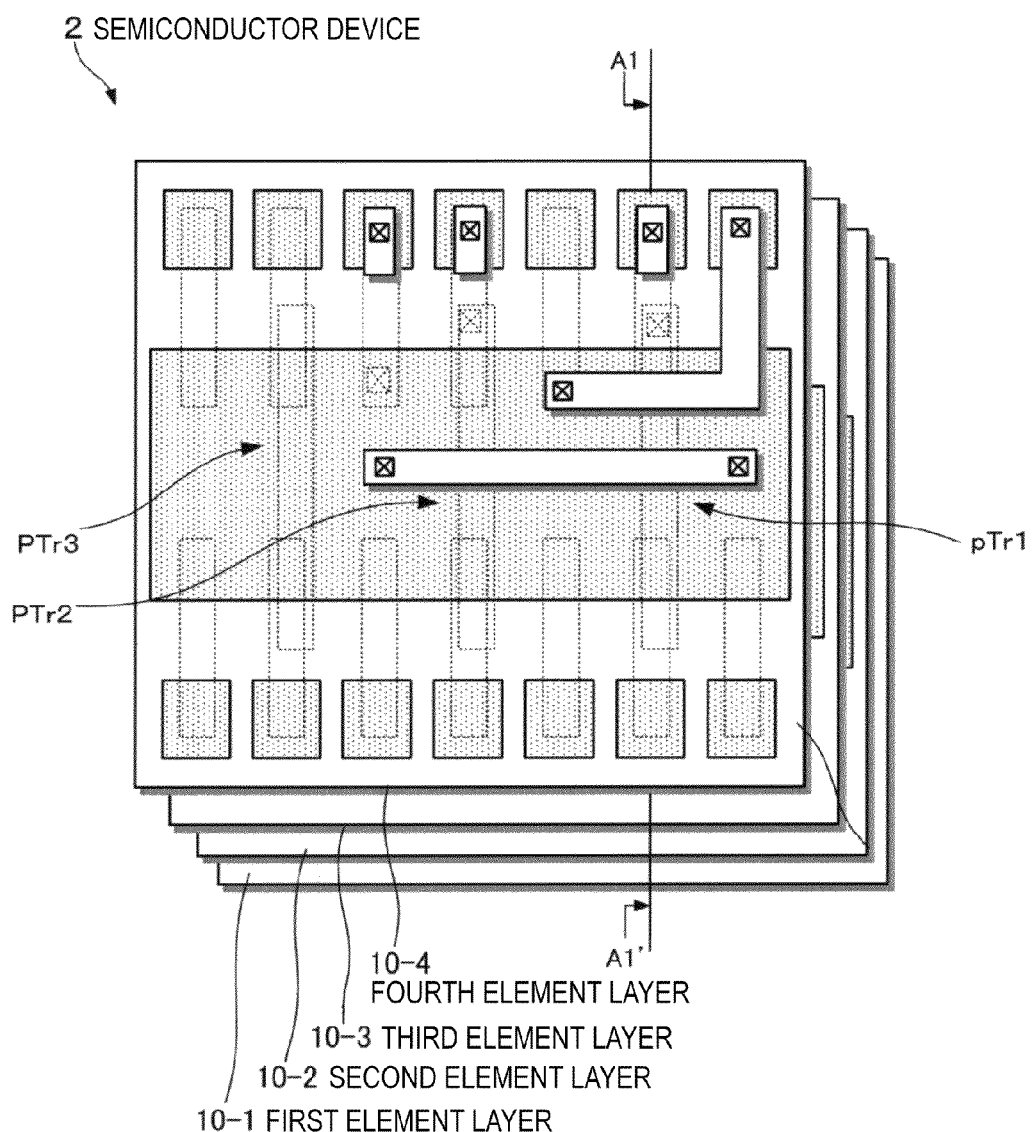
FIG. 22 is a plan view illustrating a semiconductor device according to a second embodiment.
Figure 23:
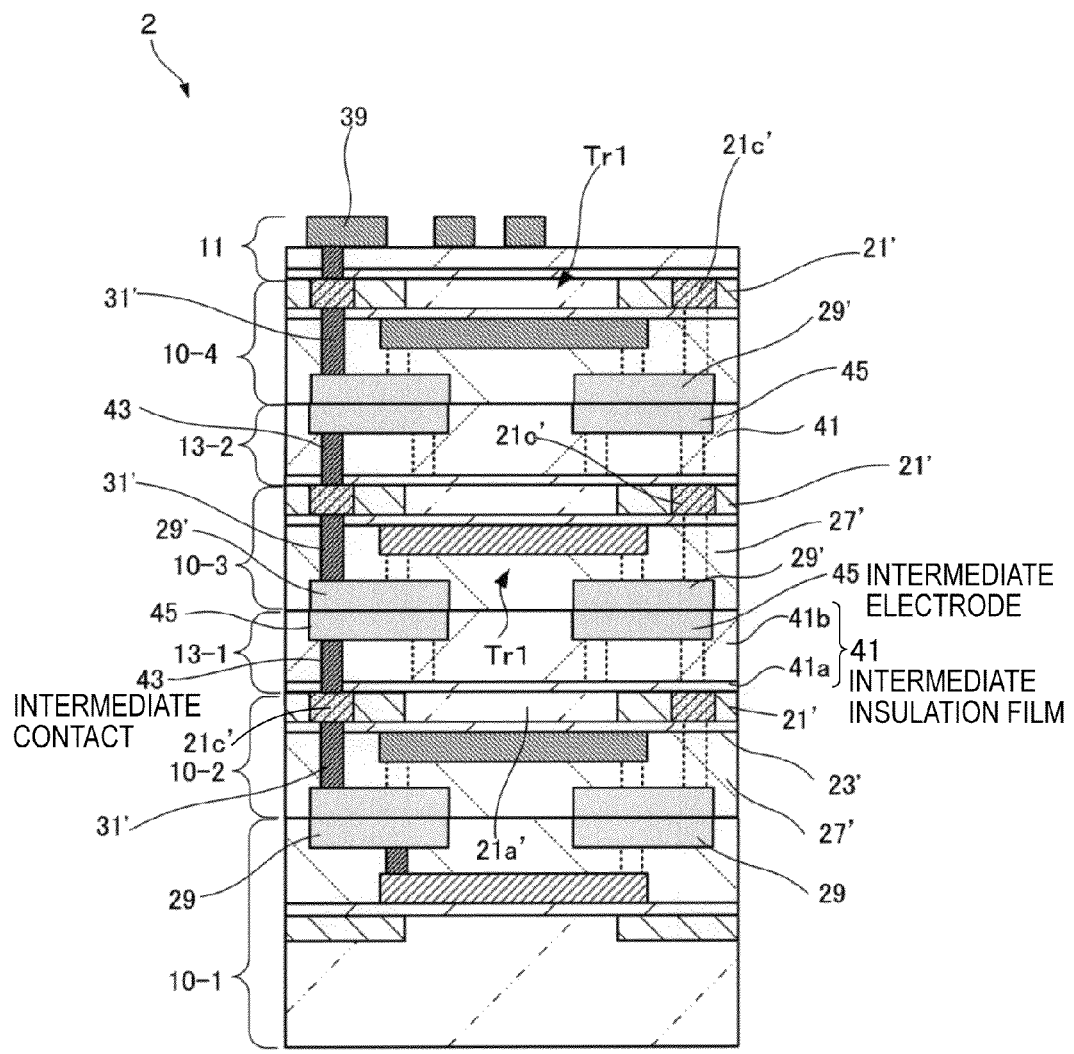
FIG. 23 is a sectional view taken along the line A1-A1' of FIG. 22.

FIG. 22 is a plan view illustrating a schematic configuration of a semiconductor device according to a second embodiment. FIG. 23 is a sectional view taken along the line A-A1' of FIG. 22. A semiconductor device 2 of the second embodiment illustrated in the drawings is a semiconductor device having a 3-dimensional structure in which four element layers, a first element layer 10-1 to a fourth element layer 10-4, are laminated.

The semiconductor device 2 is different from the semiconductor device of the first embodiment in that the third element layer 10-3 and the fourth element layer 10-4 are laminated above the second element layer 10-2 via intermediate layers 13-1 and 13-2 (illustrated only in the sectional view). Therefore, the lamination is configured such that the second element layer 10-2, the intermediate layer 13-1, the third element layer 10-3, the intermediate layer 13-2, the fourth element layer 10-4, and a wiring layer 11 are laminated in this order on the top of the first element layer 10-1.

Hereinafter, the constituent elements will be described in detail in order from the side of the first element layer 10-1. The same reference numerals are given to the same constituent elements as those of the first embodiment, and the repeated description will be omitted.

<First Element Layer 10-1 and Second Element Layer 10-2>

The first element layer 10-1 and the second element layer 10-2 have the same configurations as those described in the first embodiment and are laminated in the same manner as those described in the first embodiment.

<Intermediate Layer 13-1>

The intermediate layer 13-1 is disposed between the second element layer 10-2 and the third element layer 10-3. The intermediate layer 13-1 has a configuration in which an intermediate insulation film 41, intermediate contacts 43, and intermediate electrodes 45 are disposed from the side of the second element layer 10-2. The details of each constituent element are as follows.

[Intermediate Insulation Film 41]

The intermediate insulation film 41 is a layer in which the second element layer 10-2 is formed to come into contact with the third element layer 10-3 and is formed to cover the semiconductor layer 21' in the second element layer 10-2. The intermediate insulation film 41 is configured with a lamination structure in which a first layer 41a formed of the same high dielectric film as the gate insulation film 23' and a second layer 41b having an inter-layer insulation property of the upper layer are laminated in order from the side of the semiconductor layer 21' of the second element layer 10-2.

[Intermediate Contacts 43]

The intermediate contacts 43 are formed to penetrate through the intermediate insulation film 41. The intermediate contacts 43 are selectively formed in portions according to necessity among portions connected to connection regions 21c' and a source and drain S/D' of an active region 21a' (not illustrated here) in the second element layer 10-2.

[Intermediate Electrodes 45]

The intermediate electrodes 45 are electrodes that are disposed to face the electrodes 29' formed in the third element layer 10-3 to be described below and are formed on one main surface side of the intermediate insulation film 41 in a one-to-one joining state with the electrodes 29'. The shape and the disposition state of the intermediate electrodes 45 may be the same as the shape and the disposition state of the counter electrodes 29 of the first element layer 10-1. That is, the intermediate electrodes 45 have a constant planar shape and are arranged regularly at constant intervals in the arrangement direction of the gate electrodes 25.

The above-described intermediate electrodes 45 are formed as embedded electrodes that are embedded in the intermediate insulation film 41, are disposed to have the same height as the one main surface of the intermediate insulation film 41, and are formed of, for example, copper (Cu).

<Third Element Layer 10-3>

The third element layer 10-3 is a layer that has the same configuration as the second element layer 10-2 and includes a semiconductor layer 21', transistors Tr1, Tr2, and Tr3, an insulation film 27', electrodes 29', and contacts 31'. This embodiment is characterized by the fact that the connection regions 21c' are formed in the semiconductor layer 21' and the contacts 31' are formed in portions selected according to necessity. However, the transistors Tr1, Tr2, and Tr3 included in the third element layer 10-3 may not necessarily be the same conductive type as the second element layer 10-2, and may be n-type or p-type transistors. In this case, a material of each of the constituent elements included in the third element layer 10-3 is assumed to be appropriately selected.

In the third element layer 10-3, the electrodes 29' are disposed on one main surface side of the intermediate layer 13-1 in a one-to-one joining state with the intermediate electrodes 45 of the intermediate layer 13-1.

<Intermediate Layer 13-2>

The intermediate layer 13-2 is disposed between the third element layer 10-3 and the fourth element layer 10-4. The intermediate layer 13-2 has the same configuration as the above-described intermediate layer 13-1 and a configuration in which an intermediate insulation film 41, intermediate contacts 43, and intermediate electrodes 45 are disposed from the side of the third element layer 10-3.

<Fourth Element Layer 10-4>

The fourth element layer 10-4 has the same configuration as the second element layer 10-2 and includes a semiconductor layer 21', transistors Tr1, Tr2, and Tr3, an insulation film 27', electrodes 29', and contacts 31'. This embodiment is characterized by the fact that the connection regions 21c' are formed in the semiconductor layer 21' and the contacts 31' are formed in portions selected according to necessity. However, the transistors Tr1, Tr2, and Tr3 included in the fourth element layer 10-4 may not necessarily be the same conductive type as the second element layer 10-2, and may be n-type or p-type transistors. In this case, a material of each of the constituent elements included in the fourth element layer 10-4 is assumed to be appropriately selected.

In the fourth element layer 10-4, the electrodes 29' are disposed on one main surface side of the intermediate layer 13-2 in a one-to-one joining state with the intermediate electrodes 45 of the intermediate layer 13-2.

<Wiring Layer 11>

The wiring layer 11 has the same configuration as that described in the first embodiment and is laminated in the same manner as that described in the first embodiment. However, here, the wiring layer is disposed on the top of the fourth element layer 10-4.

In the semiconductor device 2 having the above-described configuration, the insulation films 27' and 41, the electrodes 29' and 45, and the contacts 31' and 43 are formed on both surfaces of each of the semiconductor layers 21' included in the second element layer 10-2 and the third element layer 10-3.

<Advantages of Structure According to Second Embodiment>

In the semiconductor device 2 having the above-described configuration, the connection regions 21c' obtained by metalizing parts of the same semiconductor layer 21' as the active region 21a' are also used as electrode pads in each of the element layers 10-1 to 10-4. Therefore, in the lamination structure of a plurality of element layers such as three or more element layers, potentials of the portions of the transistors of each layer can be also extracted up to the connection regions 21c' of the uppermost layer (the fourth element layer 10-4), as in the first embodiment. As a result, a desired circuit can be formed by the selection of the disposition of the contacts 31' without depending on only routing of the counter electrodes 29, the electrodes 29', and the wirings 39 of the element layers 10-1 to 10-4. As a result, miniaturization of the semiconductor device can be achieved.

<2-(2) Manufacturing Method>

Next, a method of manufacturing the semiconductor device according to the second embodiment will be described in detail with reference to FIGS. 24 to 31, which are diagrams illustrating laminating processes.

Figure 24:
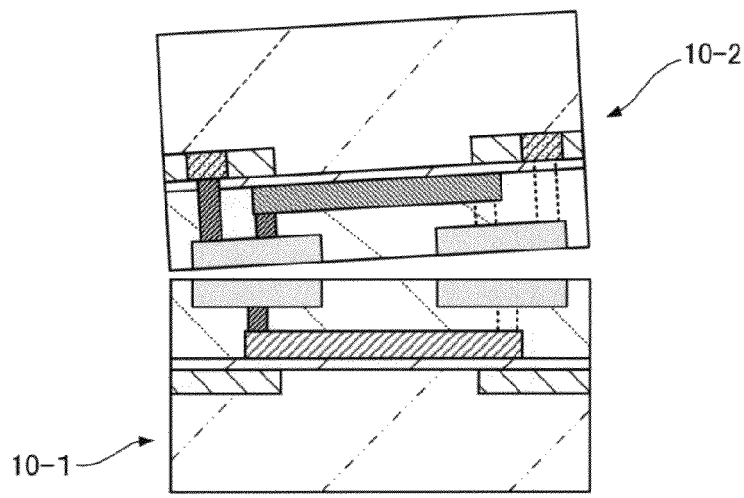
FIG. 24 is a diagram (part 1) illustrating a process of laminating the semiconductor device according to the second embodiment.
Figure 25:
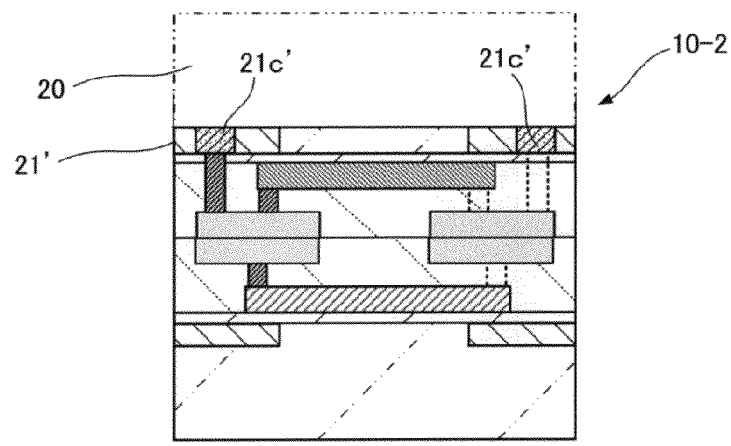
FIG. 25 is a diagram (part 2) illustrating a process of laminating the semiconductor device according to the second embodiment.

First, as illustrated in FIG. 24, which is a diagram (part 1) illustrating a laminating process, the first element layer 10-1 and the second element layer 10-2 are laminated in an aligned state. Next, as illustrated in FIG. 25, which is a diagram (part 2) illustrating a laminating process, the semiconductor layer 21' obtained by thinning the semiconductor substrate 20 of the second element layer 10-2 is formed. The above-described processes are performed as in the manufacturing of the semiconductor device according to the first embodiment.

Figure 26:
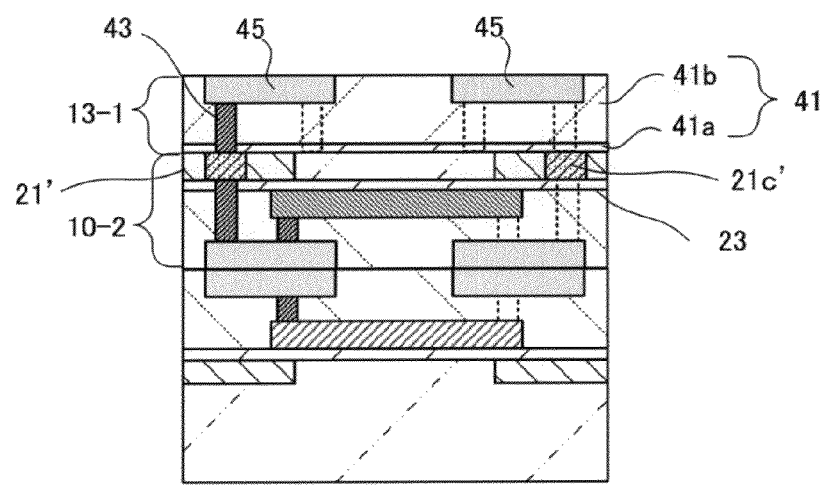
FIG. 26 is a diagram (part 3) illustrating a process of laminating the semiconductor device according to the second embodiment.

Next, as illustrated in FIG. 26, which is a diagram (part 3) illustrating a laminating process, the first layer 41a formed from the same high dielectric film as the gate insulation film 23' and the second layer 41b having the inter-layer insulation property of the upper layer and formed on the top of this first layer are formed in order on the semiconductor layer 21' of the second element layer 10-2, so that the intermediate insulation film 41 with the lamination structure is formed. Next, the intermediate contacts 43 penetrating through the intermediate insulation film 41 and reaching the connection regions 21c' and the source and drain S/D' (not illustrated here) are formed in the portions selected according to necessity.

Then, the second layer 41b is accumulated to be formed, and then the intermediate electrodes 45 are formed by applying an embedded-electrode process (a so-called damascene process) to this second layer 41b. In particular, here, it is important to form the intermediate electrodes 45 with the constant shape while the constant intervals are maintained.

As described above, the above-described intermediate layer 13-1 can be obtained. The processing order is not particularly limited except that the intermediate contacts 43 are formed only in the portions selected from the preset portions and the intermediate electrodes 45 are formed in the constant shape while the constant intervals are maintained, and the forming of the above-described intermediate layer 13-1 is performed in a normal order. For example, a dual damascene process may be applied when the intermediate contacts 43 and the intermediate electrodes 45 are formed.

Figure 27:
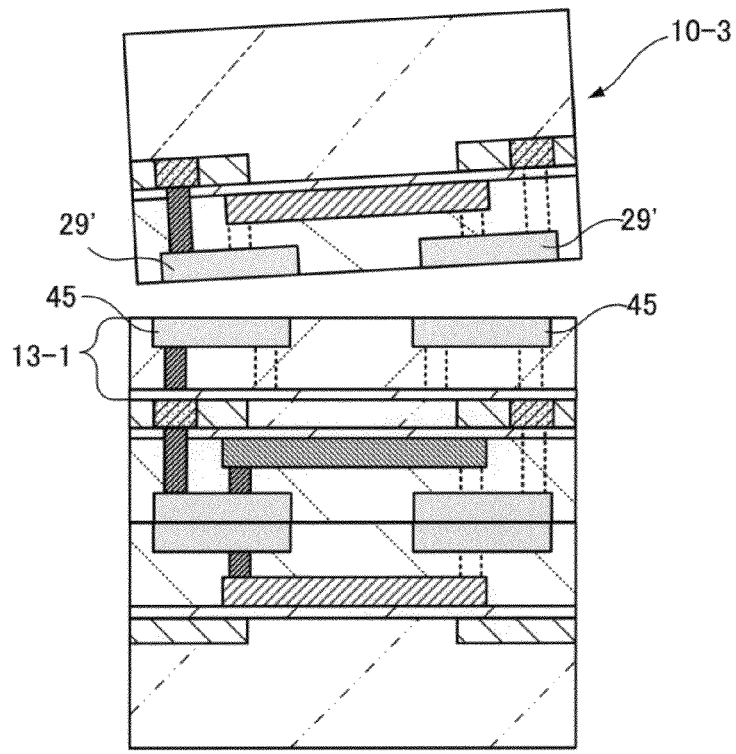
FIG. 27 is a diagram (part 4) illustrating a process of laminating the semiconductor device according to the second embodiment.

Thereafter, as illustrated in FIG. 27, which is a diagram (part 4) illustrating a laminating process, the third element layer 10-3 is laminated on the surface in which the intermediate electrodes 45 are formed in the intermediate layer 13-1. The process of manufacturing the third element layer 10-3 is performed as in the process of manufacturing the second element layer 10-2 described in the first embodiment. The laminating of the third element layer 10-3 on the intermediate layer 13-1 is performed as in the laminating of the second element layer 10-2 on the first element layer 10-1 described in the first embodiment, so that the intermediate electrodes 45 of the intermediate layer 13-1 and the electrodes 29' of the third element layer 10-3 are joined in a one-to-one manner.

Figure 28:
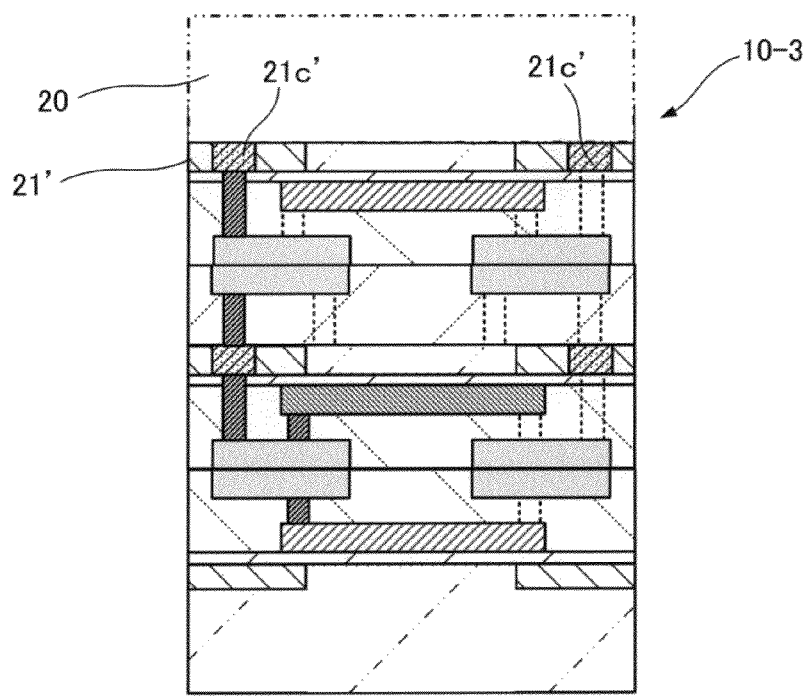
FIG. 28 is a diagram (part 5) illustrating a process of laminating the semiconductor device according to the second embodiment.

Next, as illustrated in FIG. 28, which is a diagram (part 5) illustrating a laminating process, the semiconductor substrate 20 of the third element layer 10-3 is cut until the connection regions 21c' are exposed from the exposed surface side, so that the semiconductor layer 21' obtained by thinning the semiconductor substrate 20 on the side of the third element layer 10-3 is formed.

Figure 29:
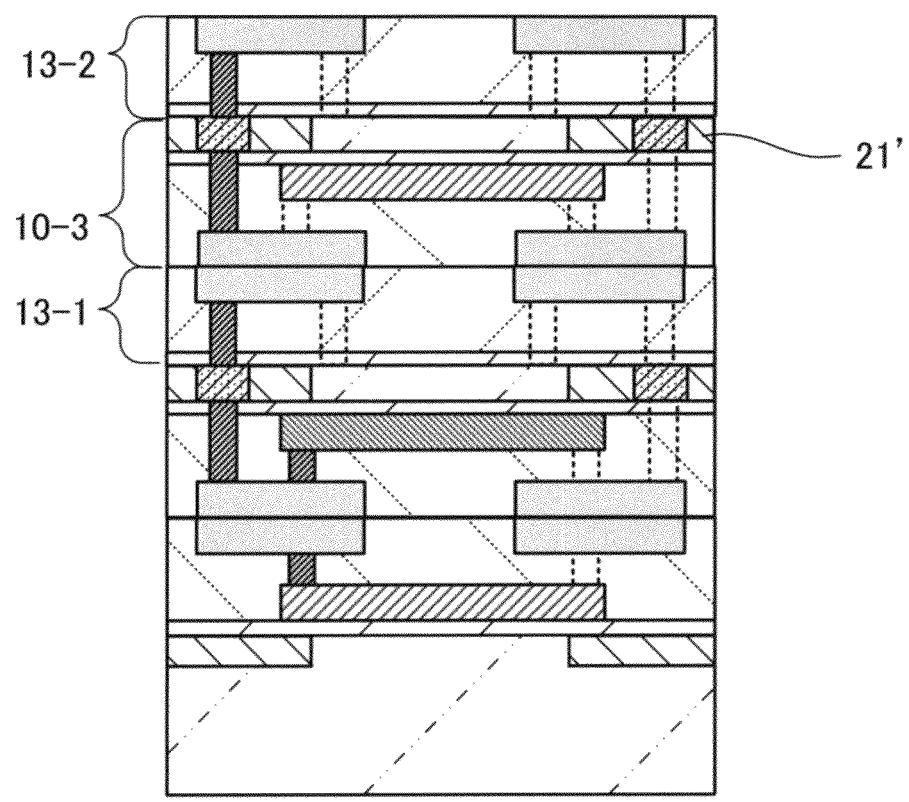
FIG. 29 is a diagram (part 6) illustrating a process of laminating the semiconductor device according to the second embodiment.

Further, as illustrated in FIG. 29 which is a diagram (part 6) illustrating a laminating process, the intermediate layer 13-2 is formed on the semiconductor layer 21' of the third element layer 10-3. The forming of the intermediate layer 13-2 is performed as in the forming of the intermediate layer 13-1 described above with reference to FIG. 26.

Figure 30:
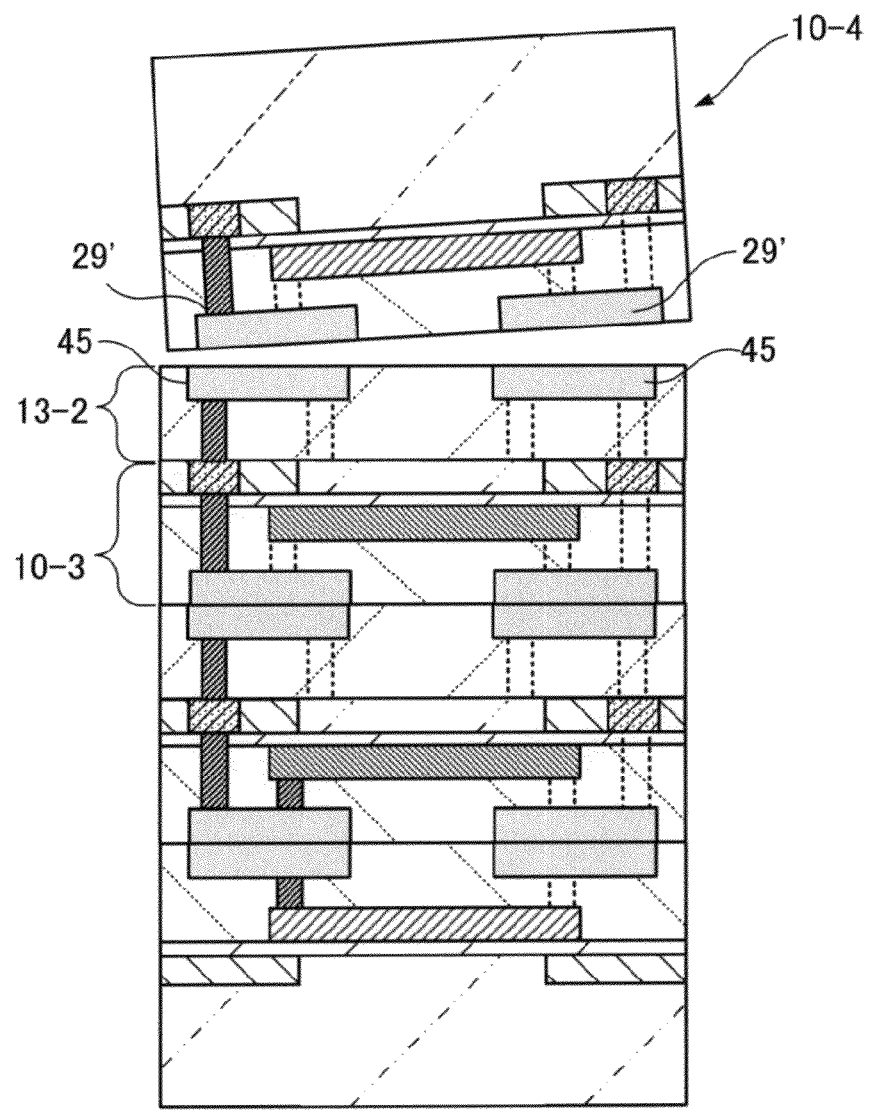
FIG. 30 is a diagram (part 7) illustrating a process of laminating the semiconductor device according to the second embodiment.

Thereafter, as illustrated in FIG. 30, which is a diagram (part 7) illustrating a laminating process, the fourth element layer 10-4 is laminated on the surface in which the intermediate electrodes 45 are formed in the intermediate layer 13-2, as in the third element layer 10-3.

Figure 31:
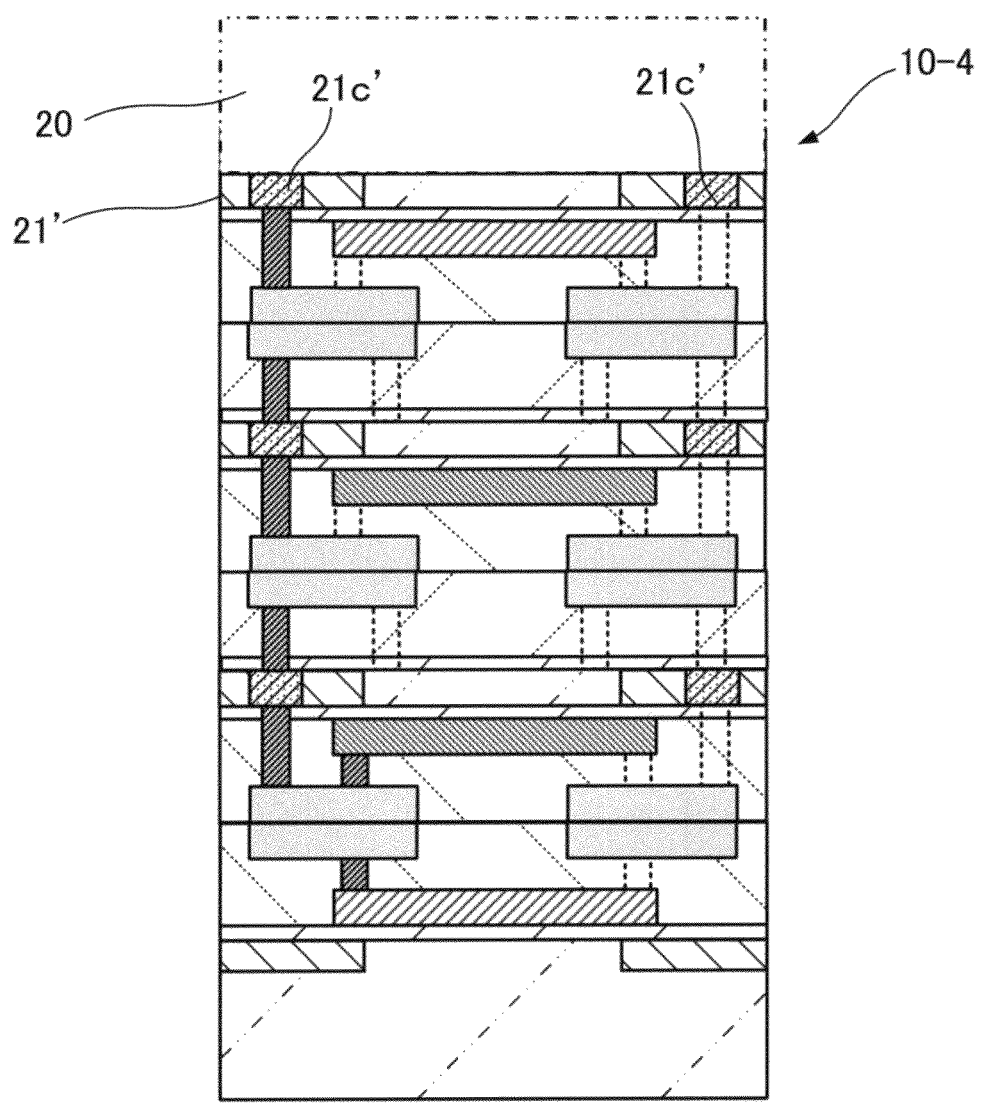
FIG. 31 is a diagram (part 8) illustrating a process of laminating the semiconductor device according to the second embodiment.

Subsequently, as illustrated in FIG. 31, which is a diagram (part 8) illustrating a laminating process, the semiconductor substrate 20 of the fourth element layer 10-4 is cut until the connection regions 21c' are exposed from the exposed surface side, so that the semiconductor layer 21' obtained by thinning the semiconductor substrate 20 on the side of the fourth element layer 10-4 is formed.

When four or more element layers are laminated, element layers can be laminated by any number of laminations by repeatedly performing the processes of FIGS. 29 to 31 as many times as the number of additional element layers.

Thereafter, as illustrated in FIG. 23, the semiconductor device 2 is completed by forming the wiring layer 11 on the fourth element layer 10-4.

<Advantages of Manufacturing Method According to Second Embodiment>

According to the above-described manufacturing method, the semiconductor device 2 with the above-described configuration can be manufactured. Since the counter electrodes 29 of the first element layer 10-1, the electrodes 29' of the second element layer 10-2 to the fourth element layer 10-4, and the intermediate electrodes 45 of the intermediate layers 13-1 and 13-2 are formed in the constant shapes while the constant intervals are maintained, it is possible to form the counter electrodes 29, the electrodes 29', and the intermediate electrodes 45 of which heights are constantly maintained. As a result, when the first element layer 10-1 and the second element layer 10-2, and the element layers 10-3 and 10-4 and the intermediate layers 13-1 and 13-2 are laminated to be bonded, adhesion can be improved, and thus the joining strength of these layers can be ensured.

Third Embodiment

Example of Lamination Structure Using Support Substrate (Including NAND Circuit)

<3-(1) Structure>

Figure 32:
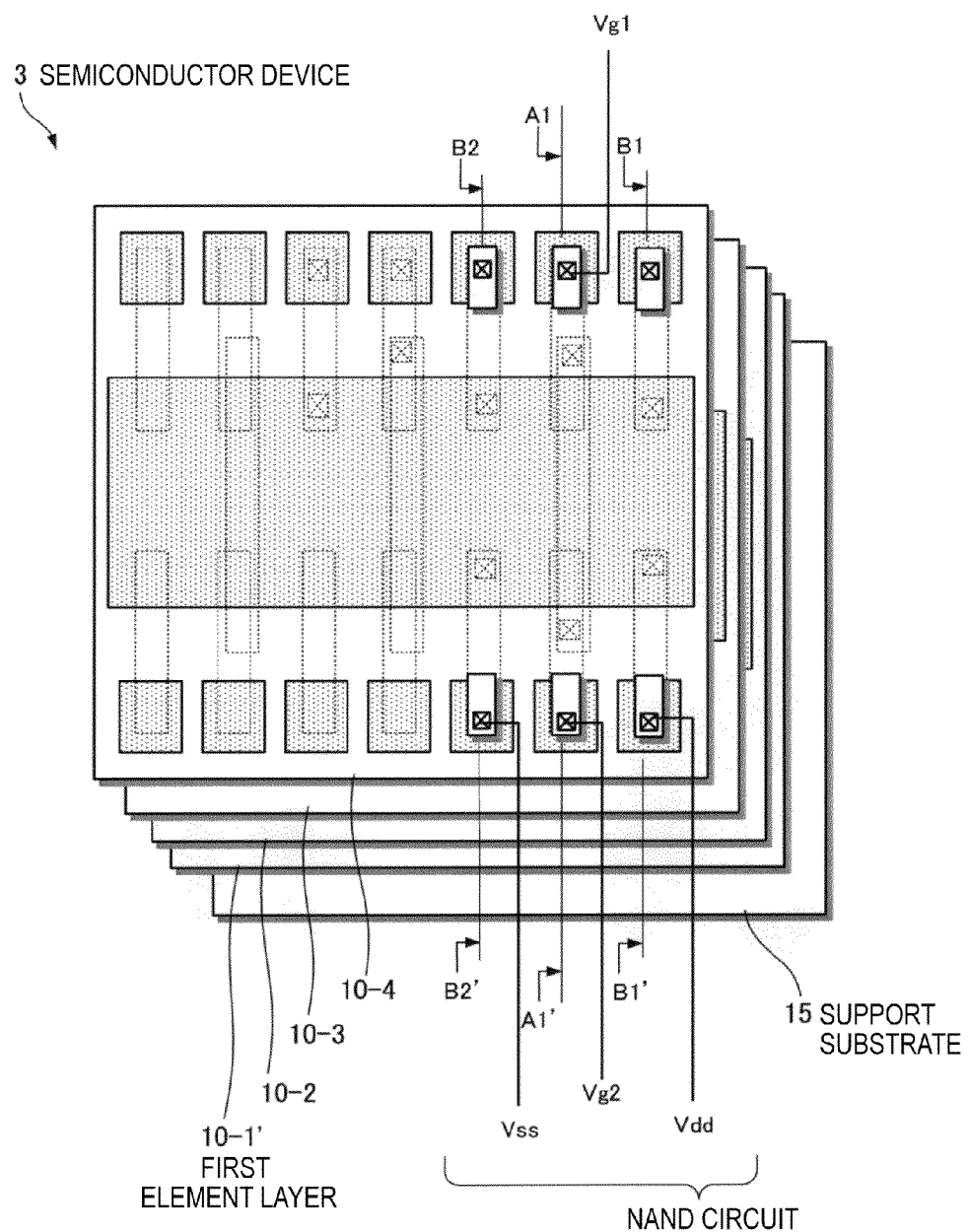
FIG. 32 is a plan view illustrating a semiconductor device according to a third embodiment.

FIG. 32 is a plan view illustrating a schematic configuration of a semiconductor device according to a third embodiment. A semiconductor device 3 of the third embodiment illustrated in the drawing has another configuration of a semiconductor device having a 3-dimensional structure in which four layers, a first element layer 10-1' to a fourth element layer 10-4, are laminated.

The semiconductor device 3 is different from the semiconductor device of the second embodiment in the first element layer 10-1' to the fourth element layer 10-4 laminated on the top of a support substrate 15 and the first element layer 10-1'. The remaining configuration is the same as that of the semiconductor device of the second embodiment.

Hereinafter, a case in which the detailed configuration of the semiconductor device 3 is applied to a semiconductor device including a NAND circuit, which is an example of a digital circuit, will be exemplified. Here, the configurations of the support substrate 15 and the first element layer 10-1' different from the configurations of the semiconductor device of the second embodiment will be described with reference to the above-described plan view of FIG. 32 and sectional views (FIGS. 33 to 35) of respective portions taken along the lines A1-A1', B1-B1', and B2-B2' of the plan view. FIG. 36 is an equivalent circuit diagram illustrating a NAND circuit formed in the semiconductor device 3.

<Support Substrate 15>

The support substrate 15 is a substrate on which the first element layer 10-1' to the fourth element layer 10-4 are mounted. In the support substrate 15, an insulation property of the surface side on which the first element layer 10-1' to the fourth element layer 10-4 are mounted may be ensured, and a material may not be limited. For example, a substrate in which a front surface of a semiconductor substrate or a metal substrate is covered with an insulation film may be used.

<First Element Layer 10-1'>

The first element layer 10-1' is different from the first element layers of the above-described first and second embodiments in that the substrate is changed to a semiconductor substrate and a semiconductor layer 21' is used, and the first element layer is the same as the second element layer 10-2 to the fourth element layer 10-4. That is, the first element layer 10-1' includes the semiconductor layer 21', n-type transistors nTr1, nTr2, and nTr3, an insulation film 27', electrodes 29', and contacts 31'.

This embodiment is characterized in that connection regions 21c' are formed in the semiconductor layer 21', and the contacts 31' are formed in portions selected according to necessity.

The first element layer 10-1' is disposed to face the support substrate 15 so that the electrodes 29' are oriented toward the side of the support substrate 15.

An intermediate layer 13-1 is disposed between the first element layer 10-1' and the second element layer 10-2. Therefore, the first element layer 10-1', the intermediate layer 13-1, the second element layer 10-2, an intermediate layer 13-2, the third element layer 10-3, an intermediate layer 13-3, the fourth element layer 10-4, and a wiring layer 11 are formed to be laminated in this order on the top of the support substrate 15.

Figure 33:
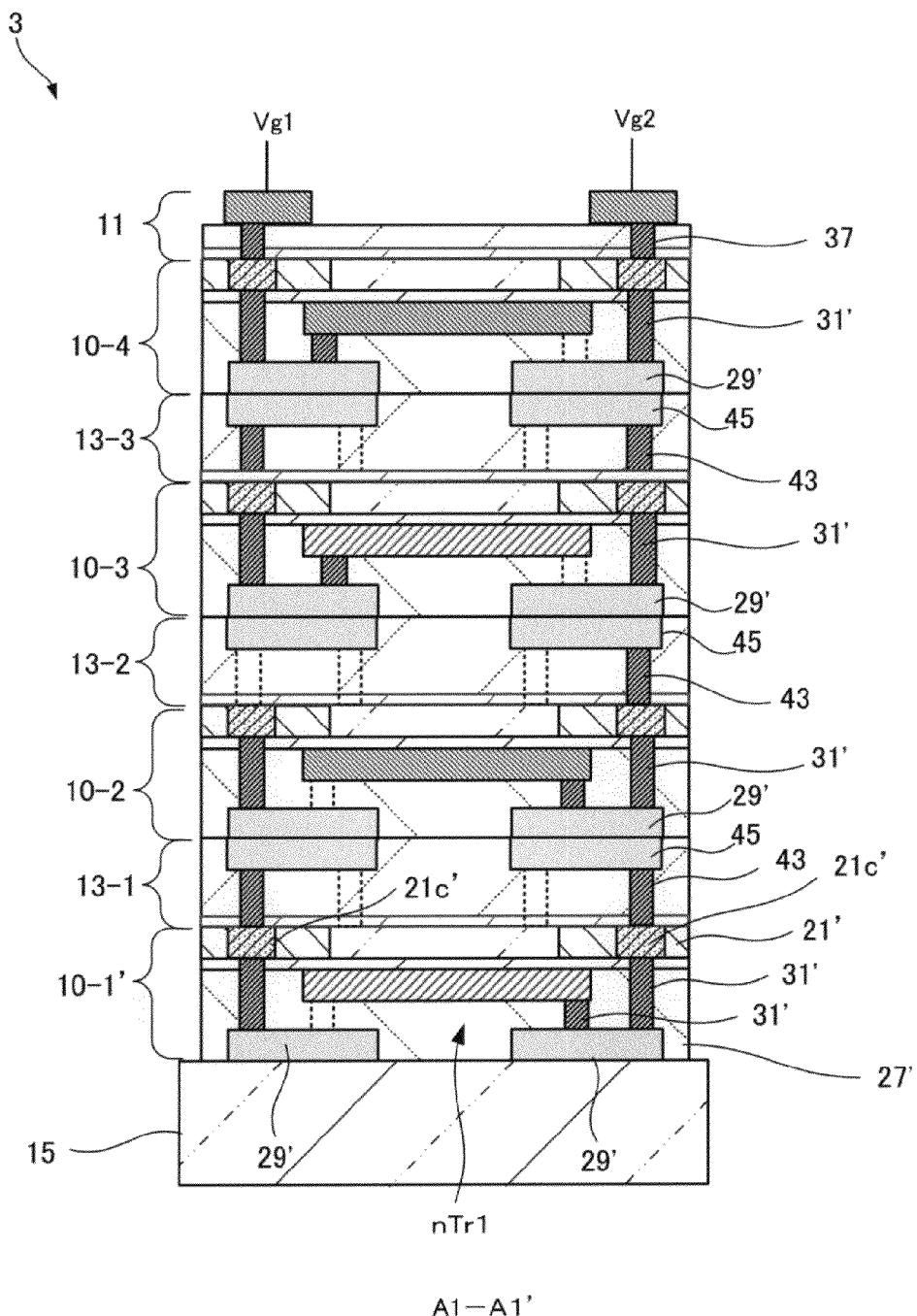
FIG. 33 is a sectional view taken along the line A1-A1' of FIG. 32.
Figure 34:
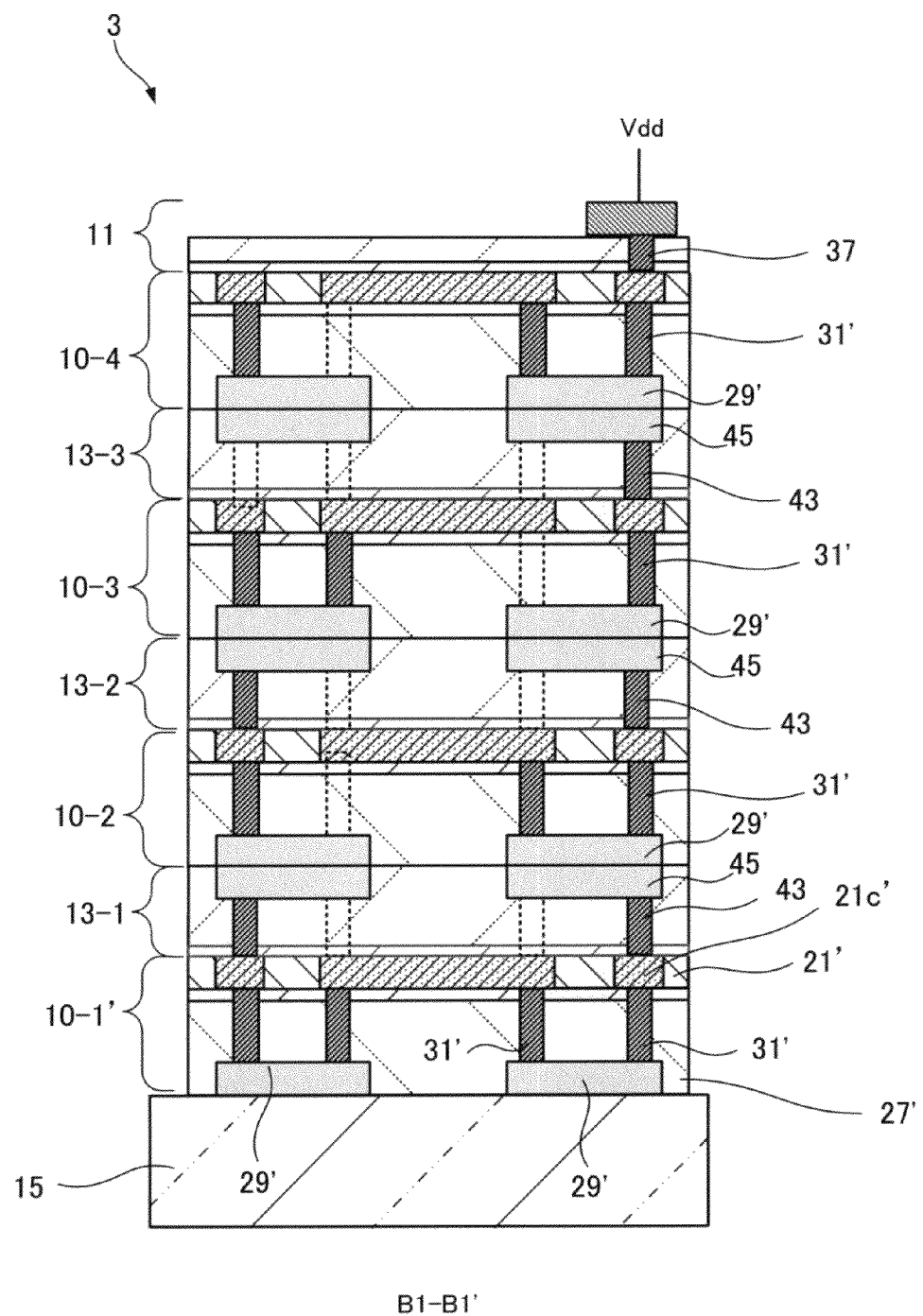
FIG. 34 is a sectional view taken along the line B1-B1' of FIG. 32.
Figure 35:
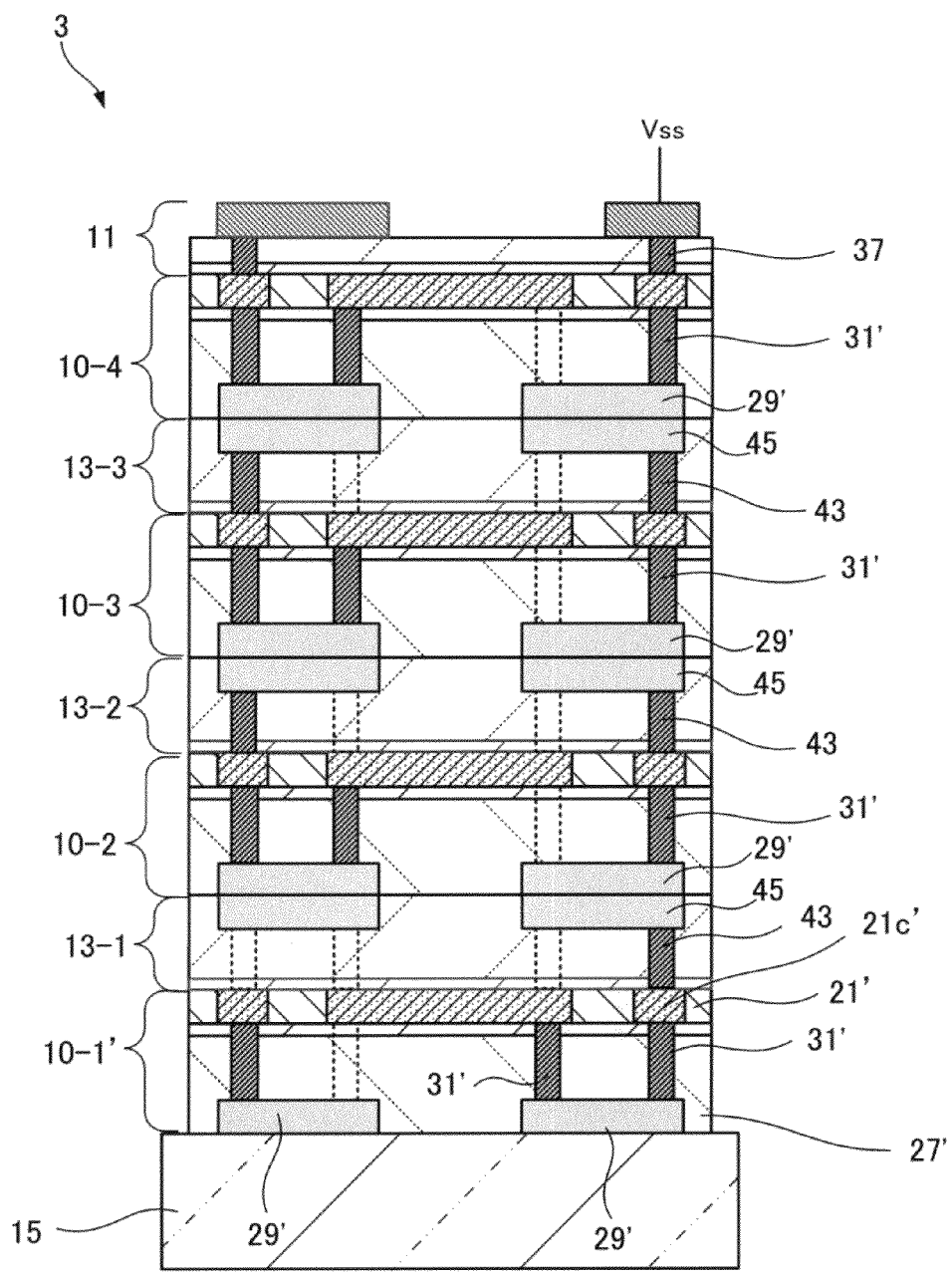
FIG. 35 is a sectional view taken along the line B2-B2' of FIG. 32.
Figure 36:
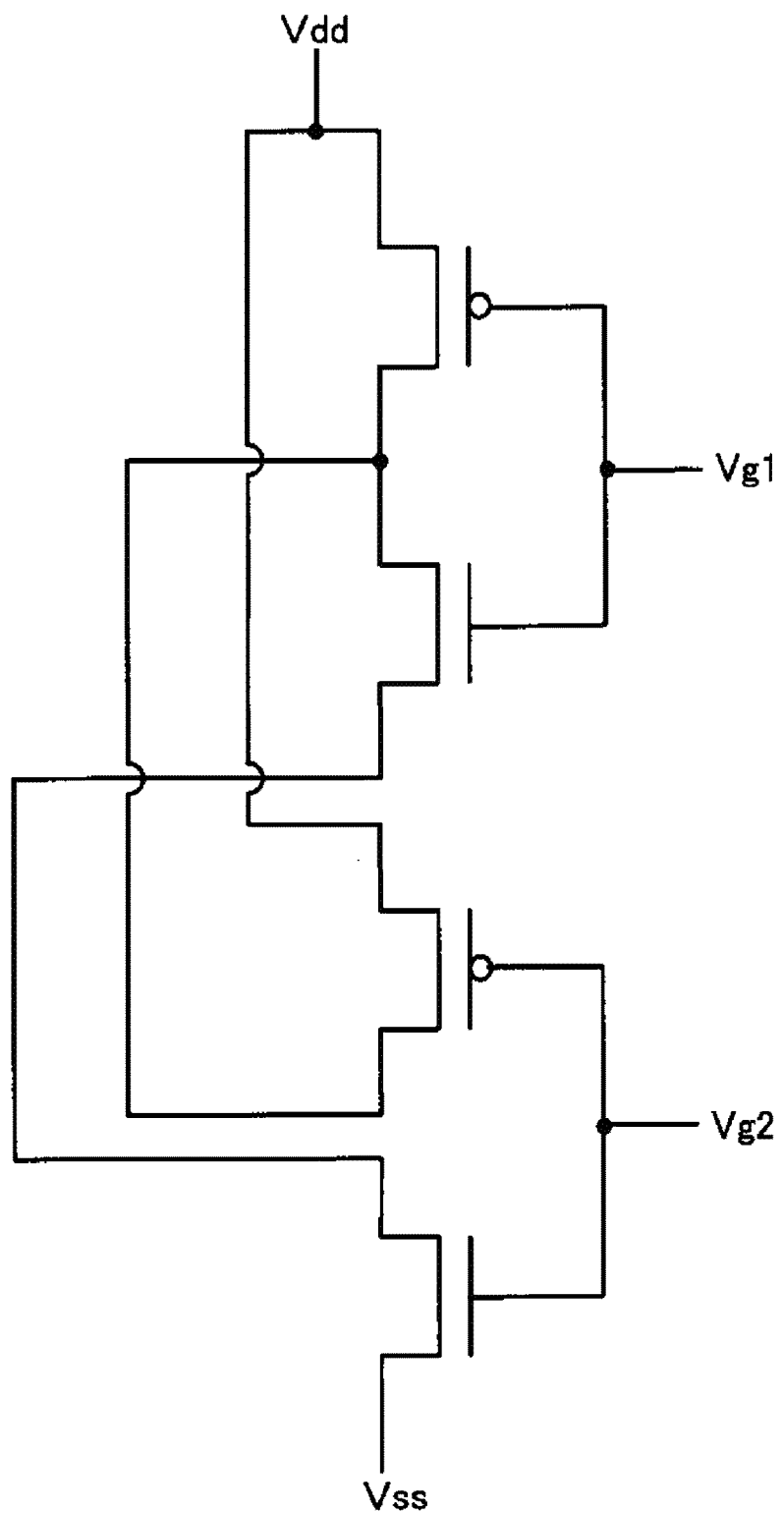
FIG. 36 is an equivalent circuit diagram illustrating a NAND circuit included in a semiconductor device according to a third embodiment.

In the semiconductor device 3 having the above-described configuration, as illustrated in sectional views of FIGS. 33 to 35, a NAND circuit in FIG. 36 is formed by disposing contacts 31', intermediate contacts 43, and upper contacts 37 formed selectively in each layer according to necessity. Here, n-type transistors nTr are formed in the first element layer 10-1' and the third element layer 10-3, and p-type transistors pTr are formed in the second element layer 10-2 and the fourth element layer 10-4.

<Advantages of Configuration According to Third Embodiment>

In the semiconductor device 3 having the above-described configuration, the connection regions 21c' obtained by metalizing parts of the same semiconductor layer 21' as the active region 21a' are also used as electrode pads in each of the element layers 10-1' to 10-4. Therefore, in the lamination structure of a plurality of element layers such as three or more element layers, potentials of the portions of the transistors of each layer can be also extracted up to the connection regions 21c' of the uppermost layer (the fourth element layer 10-4), as in the first embodiment. As a result, a desired circuit can be formed by the selection of the disposition of the contacts 31' and 37 without depending on only routing of the electrodes 29' and the wirings 39 of the element layers 10-1' to 10-4. As a result, miniaturization of the semiconductor device can be achieved.

3-(2) Manufacturing Method

Next, a method of manufacturing the semiconductor device according to the third embodiment will be described in detail with reference to FIGS. 37 to 40 which are diagrams illustrating laminating processes.

Figure 37:
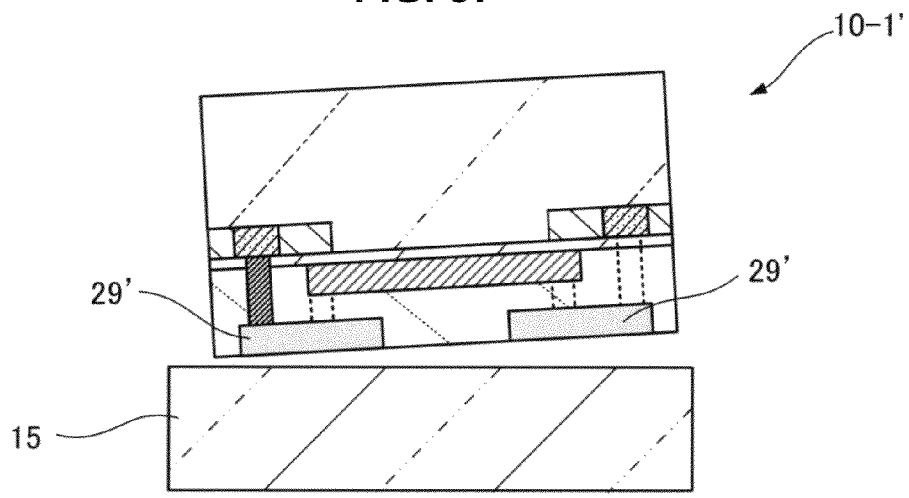
FIG. 37 is a diagram (part 1) illustrating a process of laminating the semiconductor device according to the third embodiment.

First, as illustrated in FIG. 37, which is a diagram (part 1) illustrating a laminating process, the first element layer 10-1' is laminated on one main surface side of the support substrate 15. Here, the support substrate 15 is bonded on the side of the electrodes 29' of the first element layer 10-1'. A process of manufacturing the first element layer 10-1' is performed as in the process of forming the second element layer of the first embodiment.

Figure 38:
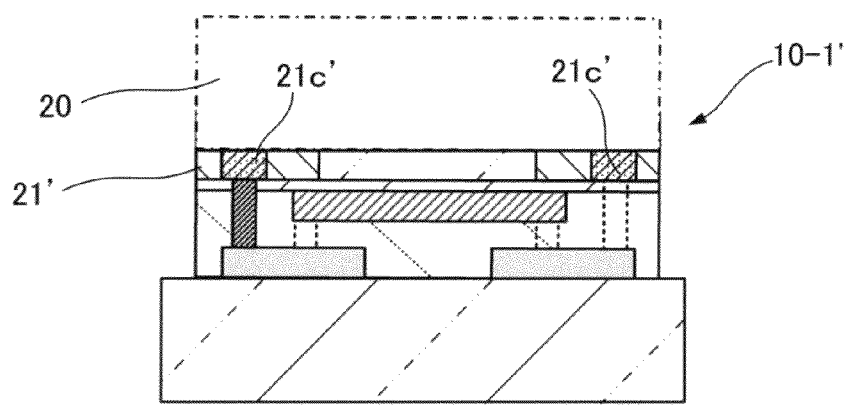
FIG. 38 is a diagram (part 2) illustrating a process of laminating the semiconductor device according to the third embodiment.

Next, as illustrated in FIG. 38, which is a diagram (part 2) illustrating a laminating process, the connection regions 21c' obtained by thinning a semiconductor substrate 20 of the first element layer 10-1' are exposed, and the semiconductor layer 21' obtained by thinning the semiconductor substrate 20 of the second element layer 10-2 is formed.

Figure 39:
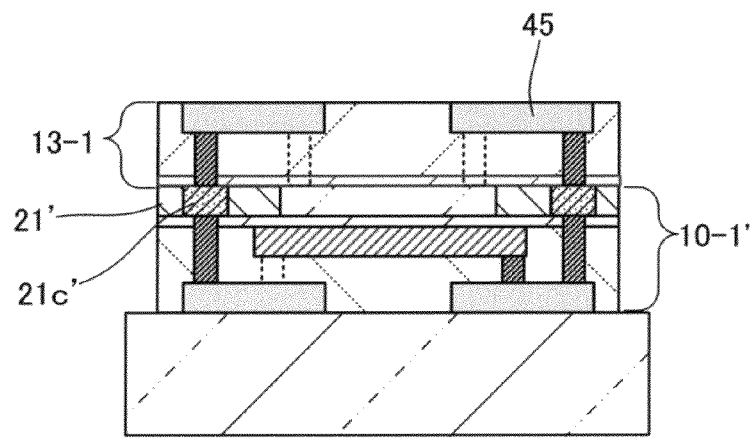
FIG. 39 is a diagram (part 3) illustrating a process of laminating the semiconductor device according to the third embodiment.

Next, as illustrated in FIG. 39, which is a diagram (part 3) illustrating a laminating process, the intermediate layer 13-1 is formed on the semiconductor layer 21' in which the connection regions 21c' of the first element layer 10-1' are exposed. The forming of the intermediate layer 13-1 is performed in the same way as described with reference to FIG. 26 in the second embodiment.

Figure 40:
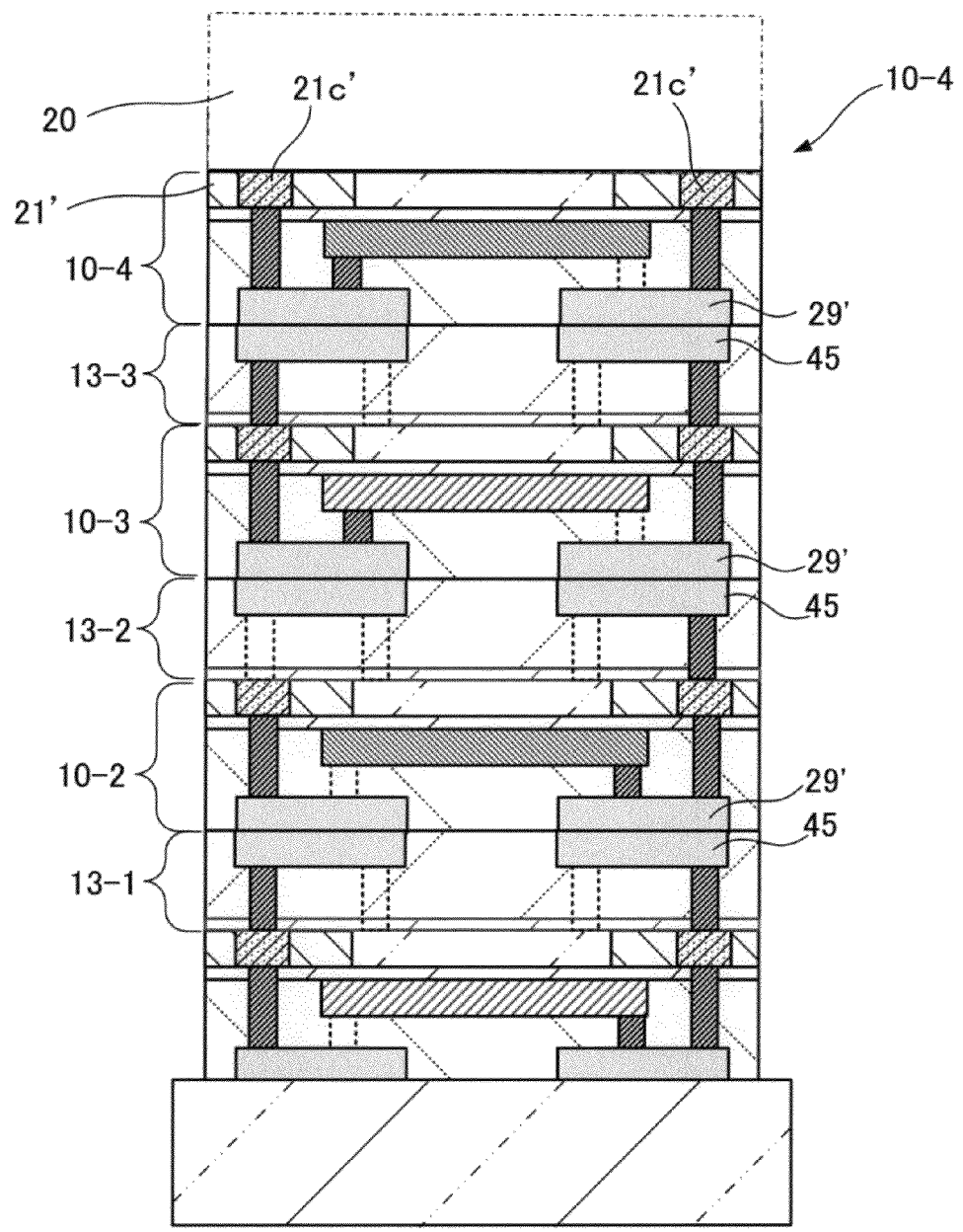
FIG. 40 is a diagram (part 4) illustrating a process of laminating the semiconductor device according to the third embodiment.

Thereafter, as illustrated in FIG. 40, which is a diagram (part 4) illustrating a laminating process, the second element layer 10-2, the intermediate layer 13-2, the third element layer 10-3, the intermediate layer 13-3, and the fourth element layer 10-4 are laminated on the intermediate layer 13-1 by repeating the same order. Then, the semiconductor layer 21' in which the connection regions 21c' are exposed by thinning the semiconductor substrate 20 of the fourth element layer 10-4 is formed.

After the above-described processes, as illustrated in FIG. 33, the semiconductor device 3 is completed by forming the wiring layer 11 on the fourth element layer 10-4.

<Advantages of Manufacturing Method According to Third Embodiment>

According to the above-described manufacturing method, the semiconductor device 3 with the above-described configuration can be manufactured. Since the electrodes 29' of the first element layer 10-1' to the fourth element layer 10-4 and the intermediate electrodes 45 of the intermediate layers 13-1, 13-2, and 13-3 are formed in the constant shapes while the constant intervals are maintained, it is possible to form the electrodes 29' and the intermediate electrodes 45 of which heights are constantly maintained. As a result, when the element layers 10-2 to 10-4 and the intermediate layers 13-1 to 13-3 are laminated to be bonded, adhesion can be improved, and thus the joining strength of these layers can be ensured.

Fourth Embodiment

Example of Lamination Structure Applied to Solid-State Imaging Device

Figure 41:
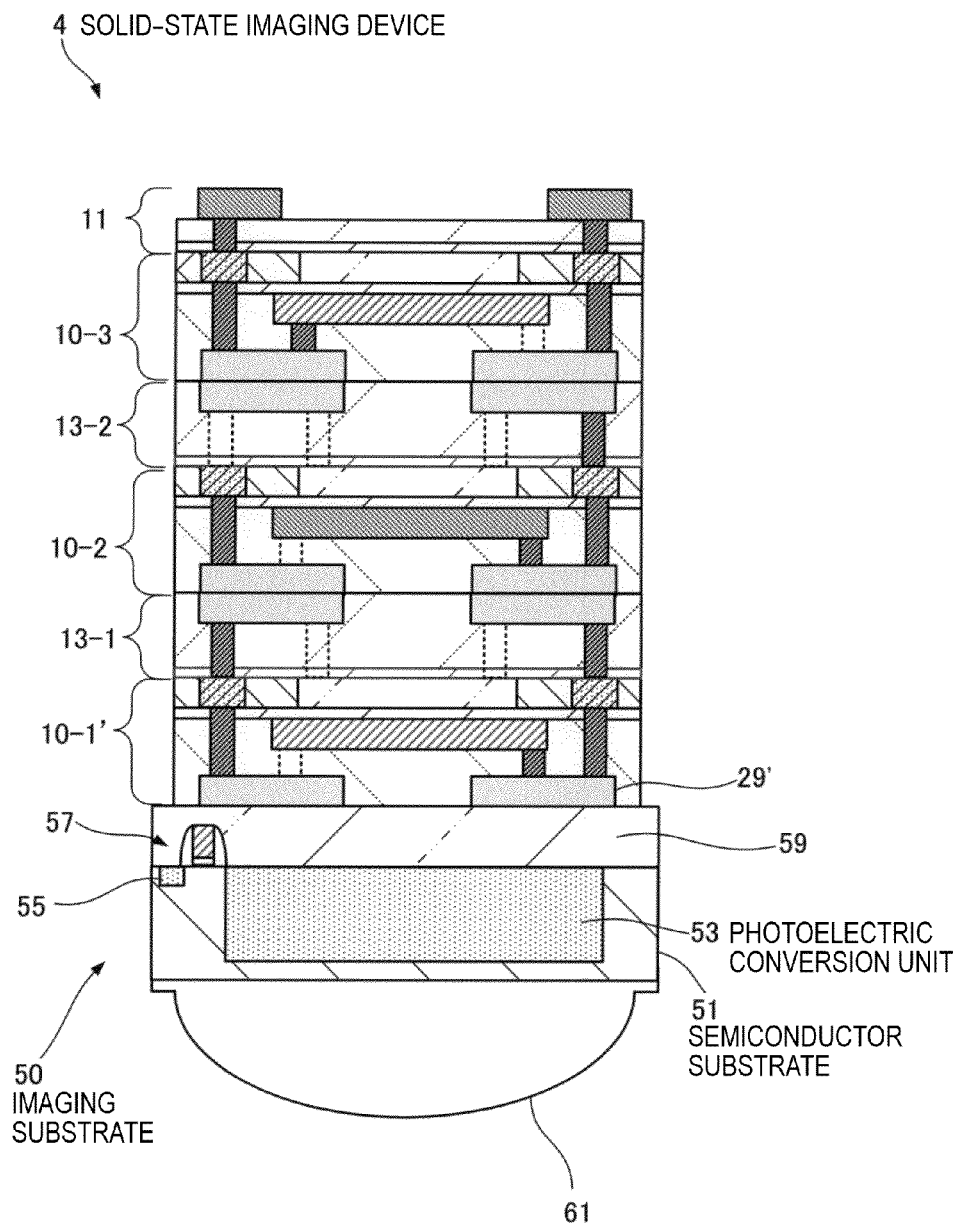
FIG. 41 is a sectional view illustrating a solid-state imaging device according to a fourth embodiment.

FIG. 41 is a sectional view illustrating a solid-state imaging device according to a fourth embodiment to which the present technology is applied. A solid-state imaging device 4 illustrated in the drawing has a configuration in which a plurality of element layers 10-1' to 10-3 are laminated on an imaging substrate 50. As the lamination structure of the element layers 10-1' to 10-3, a case to which the lamination structure of the third embodiment is applied as an example is illustrated. Therefore, the description of the lamination structure of the element layers 10-1' to 10-3 is omitted and the configuration of the imaging substrate 50 will be described.

<Imaging Substrate 50>

The imaging substrate 50 includes, for example, a semiconductor substrate 51 which includes a photoelectric conversion unit 53 configured as an impurity region and a floating diffusion 55 therein. A transfer transistor 57, other transistors (not illustrated here), and a wiring (not illustrated here) are formed on one main surface which is an opposite side to a light-reception surface of the semiconductor substrate 51, and the transfer transistor, the other transistors, and the wirings are covered with an insulation film 59. On the other hand, a microlens 61 configured to condense light to the photoelectric conversion unit 53 is formed on the side of the light-reception surface of the semiconductor substrate 51.

A laminate is configured such that the first element layer 10-1', the intermediate layer 13-1, ..., and the wiring layer 11 described above are laminated in this order on the side of the insulation film 59 of the imaging substrate 50 with such a configuration. For example, a driving circuit for imaging is configured by such a laminate. The lamination structure is not limited to the lamination structure of the third embodiment, but the lamination structure of the first embodiment or the lamination structure of the second embodiment may be applied.

Although not illustrated here, the driving circuit is assumed to be connected to the electrodes 29' of the first element layer 10-1' by contacts formed to penetrate through the insulation film 59 of the imaging substrate 50.

<Advantages of Structure According to Fourth Embodiment>

The solid-state imaging device 4 has such a lamination configuration in which the imaging substrate 50 is used as the support substrate and the first element layer 10-1', the intermediate layer 13-1, ..., and the wiring layer 11 with the above-described configurations are laminated on the top of the imaging substrate. Accordingly, since miniaturization of such a laminate in which the driving circuit and the like are formed can be achieved, miniaturization of the solid-state imaging device 4 having the laminate (semiconductor device) is realized.

Fifth Embodiment

Example of Lamination Structure Applied to FIN Structure 5-(1) Structure

Figure 42:
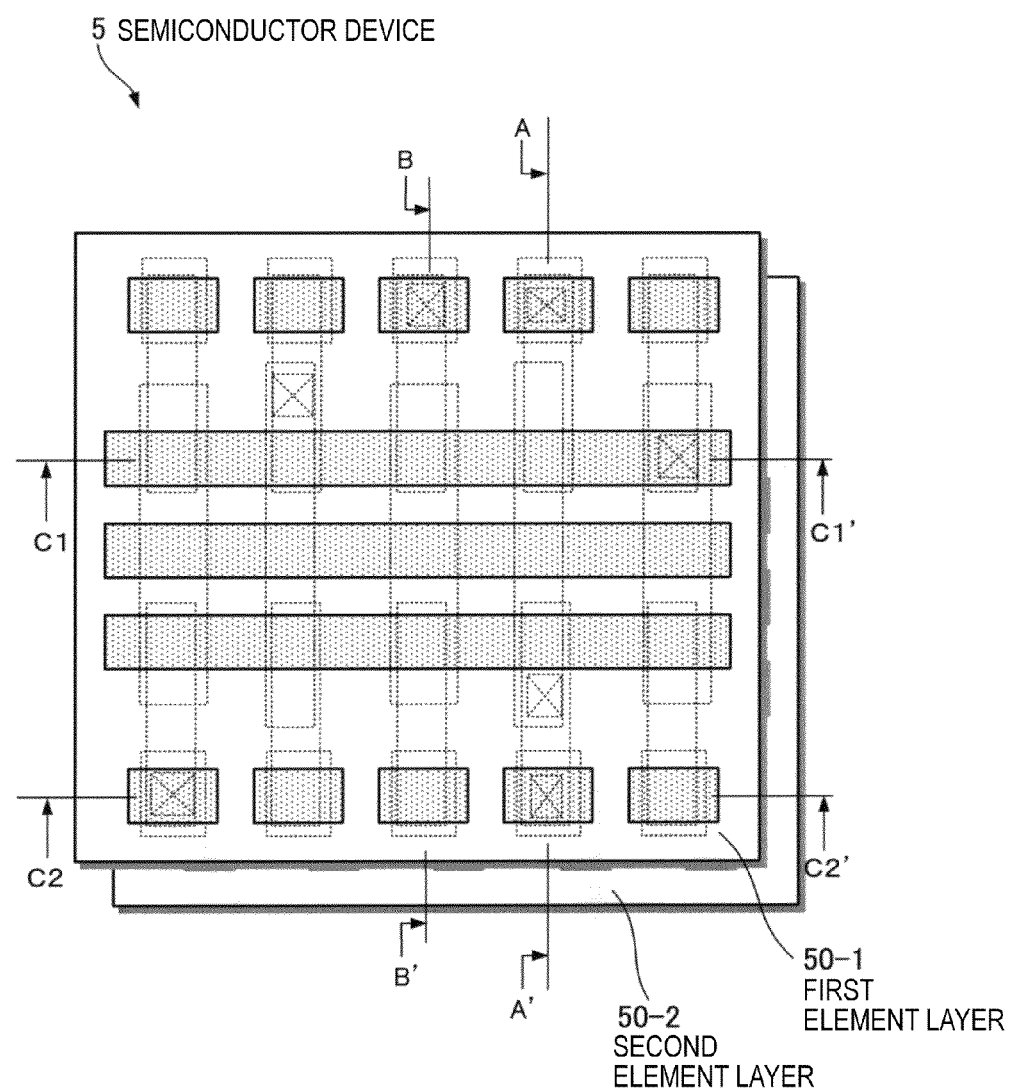
FIG. 42 is a plan view illustrating a semiconductor device (an example applied to a FIN structure) according to a fifth embodiment.
Figure 43:
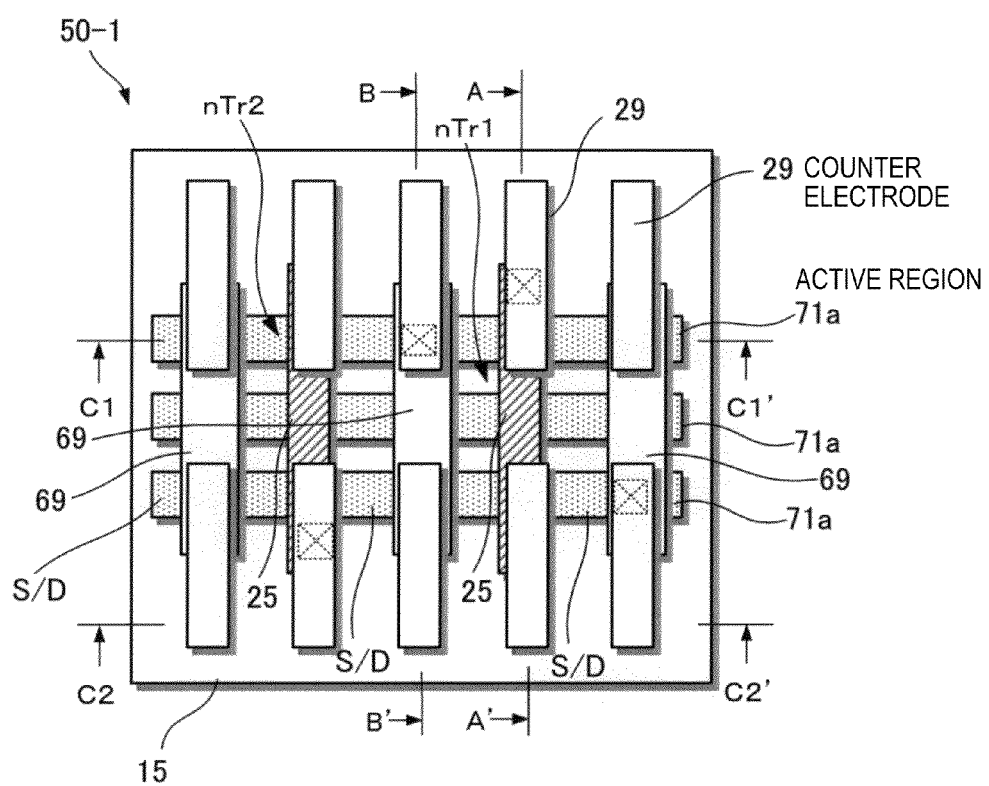
FIG. 43 is a plan view illustrating a first element layer of the semiconductor device according to the fifth embodiment.
Figure 44:
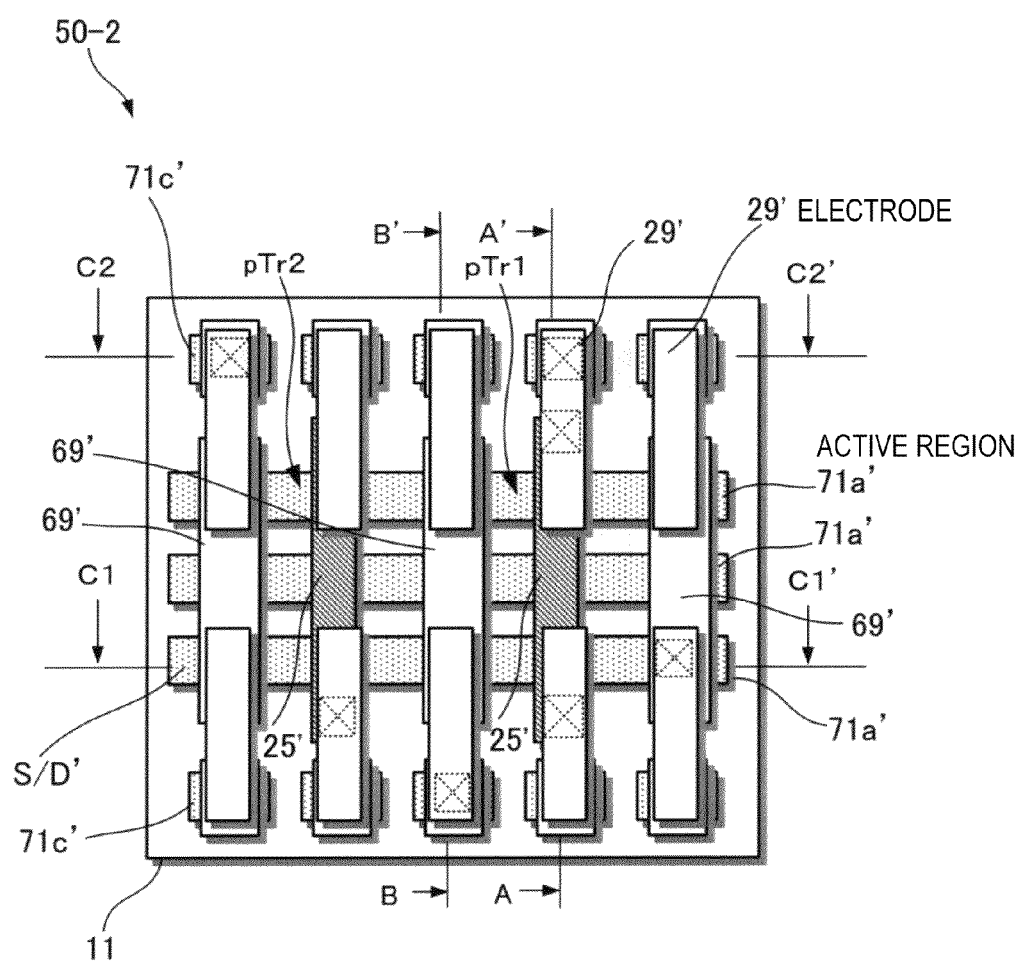
FIG. 44 is a plan view illustrating a second element layer of the semiconductor device according to the fifth embodiment.

FIG. 42 is a plan view illustrating a schematic configuration of a semiconductor device according to a fifth embodiment. A semiconductor device 5 of the fifth embodiment illustrated in the drawing is an example in which the present technology is applied to a configuration including a semiconductor device of a FIN structure and is a semiconductor element that has a 3-dimensional structure in which a first element layer 50-1 and a second element layer 50-2 including semiconductor elements of the FIN structure are laminated. FIG. 43 is a plan view illustrating an element-formed surface side of the first element layer 50-1. FIG. 44 is a plan view illustrating an element-formed surface side of the second element layer 50-2. The first element layer 50-1 and the second element layer 50-2 illustrated in these drawings are bonded to each other so that surfaces on which semiconductor elements are formed face each other, and are characterized by the connection state of the semiconductor elements between the first element layer 50-1 and the second element layer 50-2.

Hereinafter, the detailed configuration of the semiconductor device 5 will be described with reference to the above-described plan views of FIGS. 42 to 44 and sectional views (FIGS. 45 to 48) of portions taken along the lines A-A', B-B', C1-C1', and C2-C2' of these plan views. The description will be made in the order of <first element layer 50-1>, <second element layer 50-2>, and <wiring layer 11> formed on an outside of a laminate of the element layers. The same reference numerals are given to the same constituent elements as those of the above-described embodiments and the repeated description will be omitted.

<First Element Layer 50-1>

The first element layer 50-1 illustrated in the plan views of FIGS. 42 and 43 and the sectional views of FIGS. 45 to 48 includes n-type transistors nTr1 and nTr2 on one main surface of the support substrate 15. A laminated insulation film 27 (illustrated only in the sectional views) covering such n-type transistors nTr1 and nTr2 and counter electrodes 29 are formed in this order on the one main surface side of the support substrate 15, and contacts 31 are also formed to penetrate through the laminated insulation film 27. The details of these constituent elements are as follows.

[Support Substrate 15]

The support substrate 15 is a substrate on which the n-type transistors nTr1 and nTr2 are mounted. In the support substrate 15, an insulation property of the surface side on which n-type transistors nTr1 and nTr2 are mounted may be ensured, and a material may not necessarily be limited. For example, a substrate in which a front surface of a semiconductor substrate or a metal substrate is covered with an insulation film may be used.

[n-Type Transistors nTr1 and nTr2]

The n-type transistors nTr1 and nTr2 are elements that are formed using a plurality of active regions 71a obtained by patterning a semiconductor layer. Each of these n-type transistors nTr1 and nTr2 includes a gate insulation film 23 (illustrated only in the sectional view) covering the active region 71a and a gate electrode 25 disposed to traverse the active regions 71a via this gate insulation film. Therefore, these n-type transistors nTr1 and nTr2 are configured as tri-gate type transistors in which channels are formed on three surfaces of the active regions 71a which the gate electrodes 25 are disposed to face.

Here, the gate insulation film 23, the gate electrode 25, and the semiconductor layer forming the active regions 71a are formed using materials suitable for the n-type transistor, as in the other embodiments.

In each of the n-type transistors nTr1 and nTr2, the active region 71a interleaved with the gate electrode 25 and located at both sides thereof is configured as a source and drain S/D (see FIGS. 43 to 47), and the source and drain S/D is configured to be shared by the adjacent transistors. This source and drain S/D is an n-type region and may be metalized. The active region 71a superimposed on the gate electrode 25 is a portion serving as a channel region and remaining as a region which does not become the n-type region, is not metalized, and thus remains as a region in which semiconductor characteristics are maintained.

Source and drain electrodes 69 disposed in parallel to the gate electrodes 25 are connected to each source and drain S/D. These source and drain electrodes 69 are electrodes that are formed of a metal material and have satisfactory conductivity.

Figure 45:
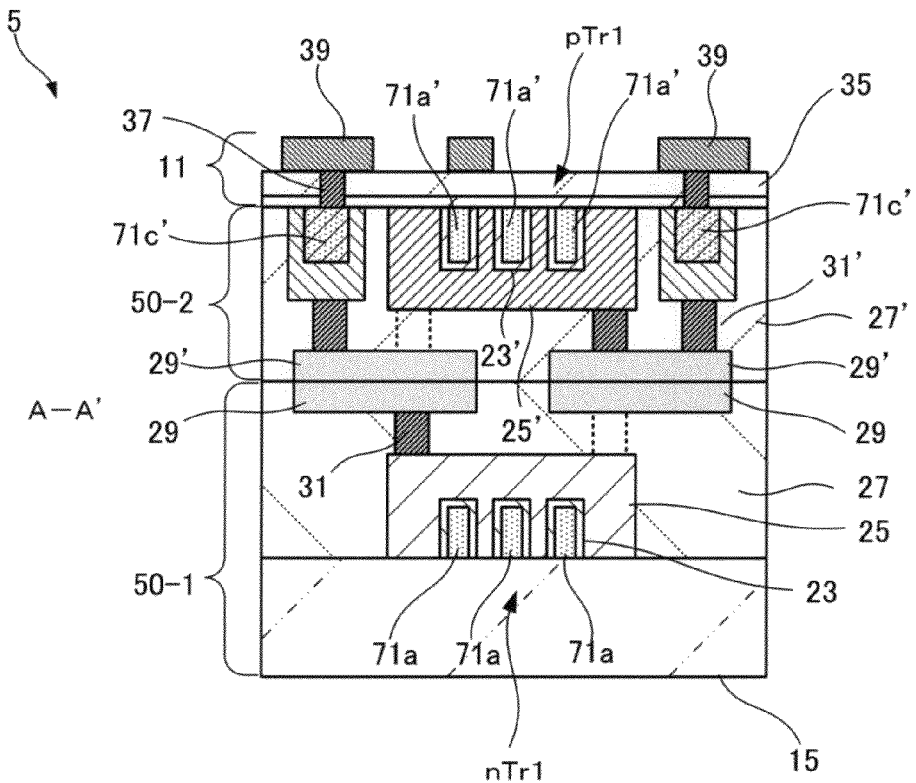
FIG. 45 is a sectional view taken along the line A-A' of FIG. 42.

FIG. 45 is a sectional view taken in the extension direction of the gate electrode 25 in the n-type transistor nTr1. As illustrated in the drawing, each gate electrode 25 is assumed to be extracted with a sufficient length up to a position deviated from the active region 71a so that contact with this gate electrode 25 is achieved at a position not superimposed on the active region 71a.

The semiconductor layer forming the above-described active region 71a may be a layer formed as a front surface layer of a semiconductor substrate when the support substrate 15 is configured as the semiconductor substrate. In this case, the front surface layer (semiconductor layer) of the semiconductor substrate may be formed to be patterned as a convex active region 71a and the front surface of the semiconductor substrate on the bottom of the active region 71a may be formed to be covered with an insulation film.

[Laminated Insulation Film 27]

The laminated insulation film 27 is formed to embed the n-type transistors nTr1 and nTr2 on the one main surface side of the support substrate 15 and is formed as a planarized insulation film with a planar surface. The laminated insulation film 27 is formed to be joined with an insulation film 27' of the second element layer 50-2 to be described below.

[Counter Electrodes 29]

The counter electrodes 29 are the same as those of the first embodiment. The counter electrodes are arranged regularly at constant intervals and are configured as embedded electrodes that are embedded in the laminated insulation film 27.

[Contacts 31]

The contacts 31 are the same as those of the first embodiment. The contacts are formed selectively in portions necessary according to a circuit formed using the n-type transistors nTr1 and nTr2 to penetrate through the laminated insulation film 27. However, the contacts 31 come into contact with the sources and drains S/D via the source and drain electrodes 69.

<Second Element Layer 50-2>

The second element layer 50-2 illustrated in the plan views of FIGS. 42 and 44 and the sectional views of FIGS. 45 to 48 includes p-type transistors pTr1 and pTr2 on one main surface of the wiring layer 11. A laminated insulation film 27' (illustrated only in the sectional views) covering these p-type transistors pTr1 and pTr2 and electrodes 29' are formed in this order on the one main surface side of the wiring layer 11, and contacts 31' are also formed to penetrate through the insulation film 27'.

In particular, this embodiment is characterized by the fact that connection regions 71c' are included on the outside of the p-type transistors pTr1 and pTr2, which is different from the first element layer 50-1. Hereinafter, these constituent elements will be described in detail.

[p-Type Transistors pTr1 and pTr2]

The p-type transistors pTr1 and pTr2 are elements that are formed using a plurality of active regions 71a' obtained by patterning a semiconductor layer. Each of these p-type transistors pTr1 and pTr2 includes a gate insulation film 23' (illustrated only in the sectional view) covering the active region 71a' and a gate electrode 25' disposed to traverse the active regions 71a' via this gate insulation film. Therefore, these p-type transistors pTr1 and pTr2 are formed as tri-gate type transistors in which channels are formed on three surfaces of the active regions 71a' which the gate electrodes 25' are disposed to face.

Here, the gate insulation film 23', the gate electrode 25', and the semiconductor layer forming the active regions 71a' are formed using materials suitable for the p-type transistor, as in the other embodiments.

In each of the p-type transistors pTr1 and pTr2, the active region 71a interleaved with the gate electrode 25' and located at both sides thereof is configured as a source and drain S/D', and the source and drain S/D' is configured to be shared by the adjacent transistors. This source and drain S/D' is an p-type region and may be metalized. The active region 71a' superimposed on the gate electrode 25' is a portion serving as a channel region and remaining as a region which does not become the p-type region, is not metalized, and thus remains as a region in which semiconductor characteristics are maintained.

Source and drain electrodes 69' disposed in parallel to the gate electrodes 25' are connected to each source and drain S/D'. These source and drain electrodes 69' are electrodes that are formed of a metal material and have satisfactory conductivity.

FIG. 45 is a sectional view taken in the extension direction of the gate electrode 25' in the p-type transistor pTr1. As illustrated in the drawing, each gate electrode 25' is assumed to be extracted with a sufficient length up to a position deviated from the active region 71a' so that contact with this gate electrode 25' is achieved at a position not superimposed on the active region 71a'.

[Connection Regions 71c']

The connection regions 71c' are portions inherent in the second element layer 50-2 and obtained by patterning the same semiconductor layer as that of the active region 71a'. These connection regions 71c' are regions that are formed such that the semiconductor layer patterned in an island shape independent from the active region 71a' is metalized, and may have the same configuration as the source and drain S/D' formed in the active region 71a'. Each connection region 71c' is formed in an independent island shape at a position superimposed on one end side of each electrode 29' to be described below on the outside of the active region 71a'.

Accordingly, in the case of the exemplary this configuration in which ten electrodes 29' are formed in the second element layer 50-2, the connection region 71c' is formed at each of the ten independent positions.

Figure 48:
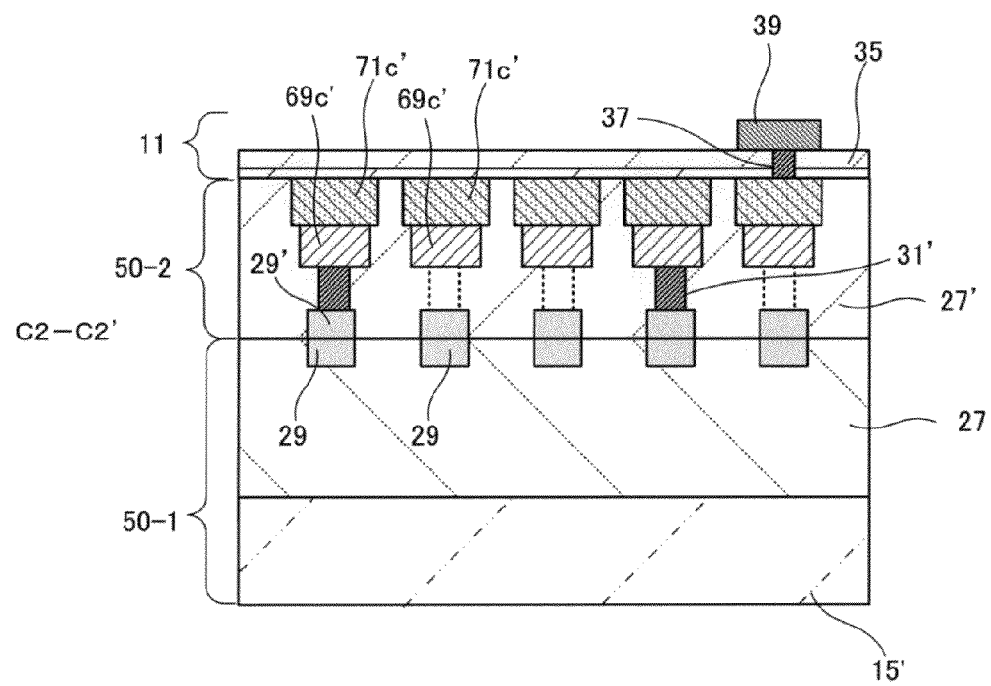
FIG. 48 is a sectional view taken along the line C2-C2' of FIG. 42.

As illustrated in the sectional view of FIG. 48, a connection electrode 69' formed of the same layer as the source and drain electrode 69' may be formed on this connection region 71c'.

[Insulation Film 27']

The insulation film 27' is formed to embed the p-type transistors pTr1 and pTr2 on the one main surface side of the wiring layer 11 and is formed as a planarized insulation film with a planar surface. The insulation film 27' is formed to be joined with the laminated insulation film 27 of the first element layer 50-1.

[Electrodes 29']

The electrodes 29' are the same as those of the first embodiment. The electrodes are arranged regularly at constant intervals and are configured as embedded electrodes that are embedded in the insulation film 27'.

[Contacts 31']

The contacts 31' are the same as those of the first embodiment. The contacts are formed selectively in the portions necessary according to a circuit formed using these p-type transistors pTr1 and pTr2 to penetrate through the insulation film 27'.

<Wiring Layer 11>

The wiring layer 11 is the same as that of the other embodiments. The wiring layer has a configuration in which an upper insulation film 35 (illustrated only in the sectional view), upper contacts 37, and wirings 39 are disposed from the side of the second element layer 50-2.

<Advantages of Structure According to Fifth Embodiment>

In the semiconductor device 5 having the above-described configuration, the connection regions 71c' obtained by metalizing parts of the same semiconductor layer as the active region 71a' are also used as electrode pads. Therefore, potentials of respective portions of the p-type transistors pTr1 and pTr2 can be extracted to the connection regions 71c' by selectively disposing the contacts 31' between the connection regions 71c' and the electrodes 29' and between the p-type transistors pTr1 and pTr2 and the electrodes 29'. Further, since the counter electrodes 29 connected to the portions of the n-type transistors nTr1 and nTr2 are joined with the electrodes 29', the potentials of the respective portions of the n-type transistors nTr1 and nTr2 can be extracted to these connection regions 71c' via these counter electrodes 29 and these electrodes 29'.

As a result, as in the first embodiment, a desired circuit can be formed by the selection of the disposition of the contacts 31, 31', and 37 without depending on only routing of the counter electrodes 29, the electrodes 29', and the wirings 39. As a result, miniaturization of the semiconductor device can be achieved.

<5-(2) Manufacturing Method>

Next, a method of manufacturing the semiconductor device according to the fifth embodiment will be described in detail with reference to the drawings. Here, the description will be made in the order of <process of manufacturing first element layer 50-1>, <process of manufacturing second element layer 50-2>, and <lamination process>.

<Process of Manufacturing First Element Layer 50-1>

FIGS. 49 to 52 are diagrams illustrating manufacturing processes to describe processes of manufacturing the first element layer 50-1 and are plan views illustrating one main surface side of the support substrate 15. As illustrated in these drawings, the first element layer 50-1 is manufactured as follows.

Figure 49:
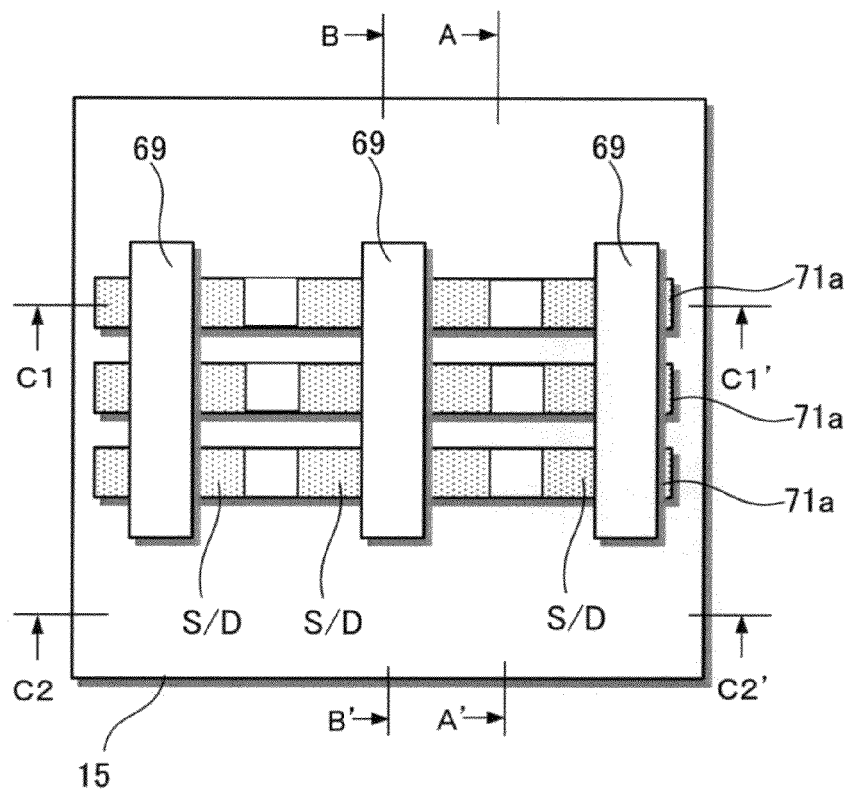
FIG. 49 is a diagram (part 1) illustrating a process of manufacturing the first element layer of the semiconductor device according to the fifth embodiment.

First, as illustrated in FIG. 49, which is a diagram (part 1) illustrating the manufacturing process, the plurality of active regions 71a obtained by patterning the semiconductor layer are pattern-formed on the one main surface side of the support substrate 15. When a semiconductor substrate is used as the support substrate 15, the front surface layer of the semiconductor substrate is processed as the convex active regions 71a, and the front surface of the semiconductor substrate is covered with an insulation film on the bottoms of the active regions 71a.

Thereafter, n-type sources and drains S/D are formed in the active regions 71a using dummy gates (not illustrated here) as masks. Next, the source and drain electrodes 69 traversing the active regions 71a are formed on the tops of the respective sources and drains S/D.

Figure 50:
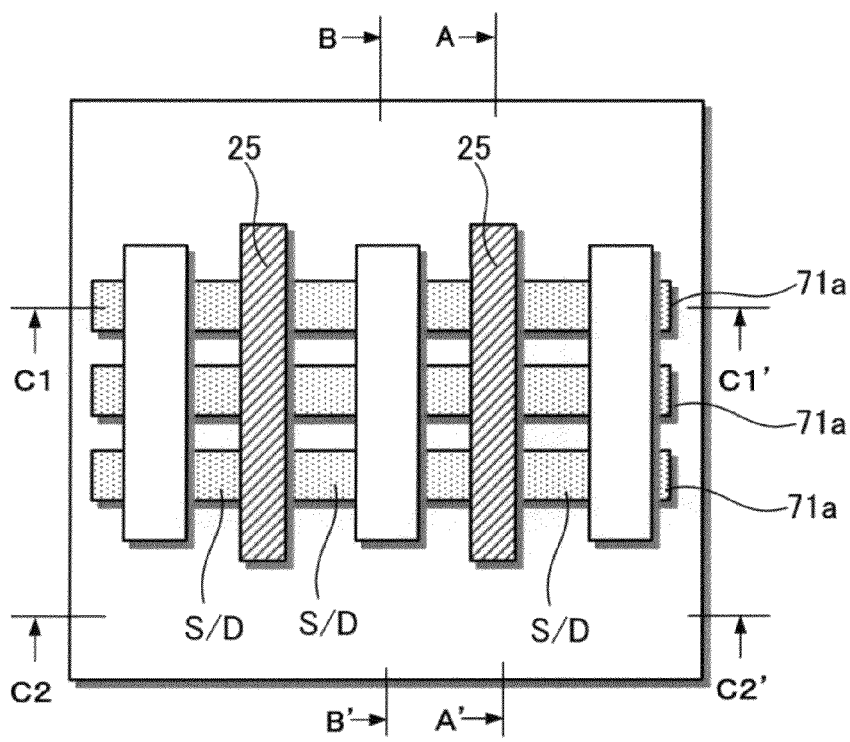
FIG. 50 is a diagram (part 2) illustrating a process of manufacturing the first element layer of the semiconductor device according to the fifth embodiment.

Next, as illustrated in FIG. 50, which is a diagram (part 2) illustrating the manufacturing process, the above-described dummy gates are removed, and then the gate electrodes 25 are formed via the gate insulation film (not illustrated here) to traverse the active regions 71a between the sources and drains S/D.

Figure 51:
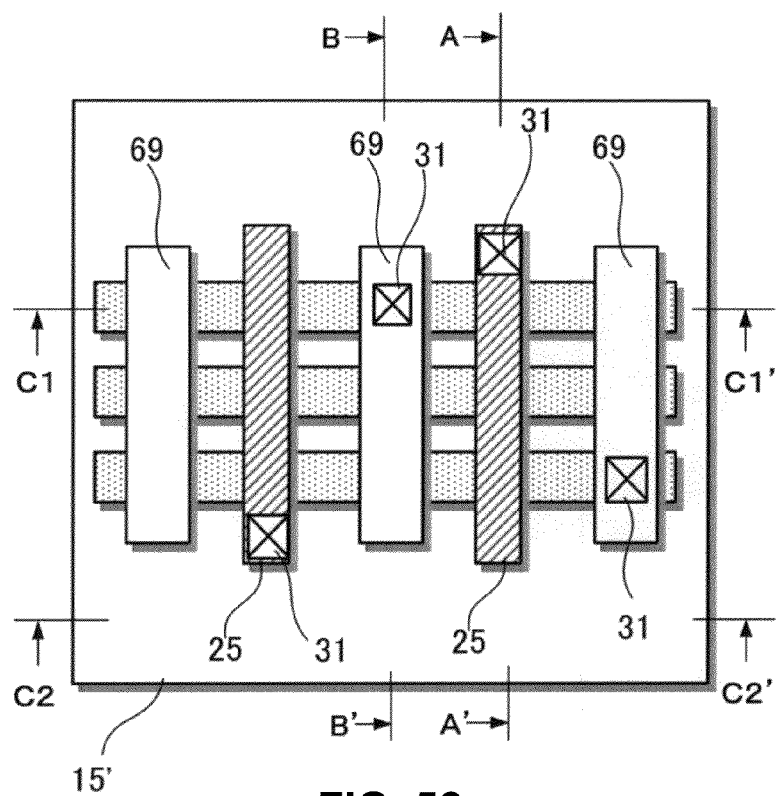
FIG. 51 is a diagram (part 3) illustrating a process of manufacturing the first element layer of the semiconductor device according to the fifth embodiment.

Thereafter, as illustrated in FIG. 51, which is a diagram (part 3) illustrating the manufacturing process, the laminated insulation film 27 (not illustrated here) is formed on the one main surface side of the support substrate 15 to cover the gate electrodes 25. Subsequently, the contacts 31 penetrating this laminated insulation film 27 and reaching the gate electrodes 25 and the source and drain electrodes 69 are formed in the portions selected according to necessity. Thereafter, the laminated insulation film 27 is further accumulated.

Figure 52:
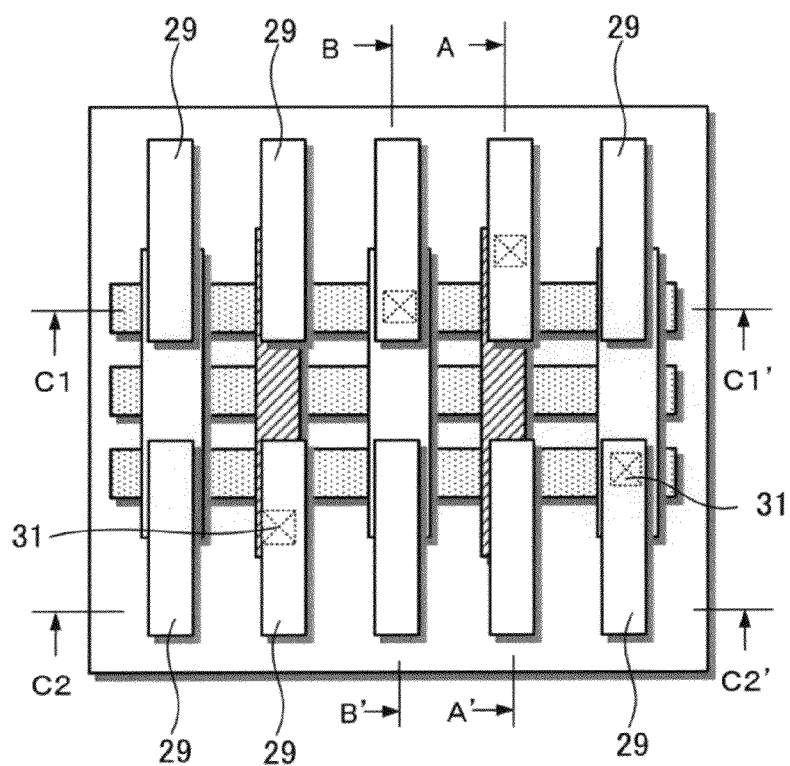
FIG. 52 is a diagram (part 4) illustrating a process of manufacturing the first element layer of the semiconductor device according to the fifth embodiment.

After the above-described processes, as illustrated in FIG. 52, which is a diagram (part 4) illustrating the manufacturing process, the counter electrodes 29 of which parts are connected to the contacts 31 are formed by applying an embedded-electrode process (a so-called damascene process) to the accumulated laminated insulation film 27. In particular, here, it is important to form the counter electrodes 29 with the constant shape, while the constant intervals are maintained.

As described above, the above-described first element layer 50-1 can be obtained. The processing order is not particularly limited except that the contacts 31 are formed only in the portions selected from the preset portions and the counter electrodes 29 are formed while the constant intervals are maintained, and the manufacturing of the above-described first element layer 50-1 is performed in a normal order. For example, a dual damascene process may be applied when the contacts 31 and the counter electrodes 29 are formed.

<Process of Manufacturing Second Element Layer 50-2>

FIGS. 53 to 56 are diagrams illustrating manufacturing processes to describe processes of manufacturing the second element layer 50-2 and are plan views illustrating one main surface side of a manufacturing substrate 73. As illustrated in these drawings, the second element layer 50-2 is manufactured as follows.

Figure 53:
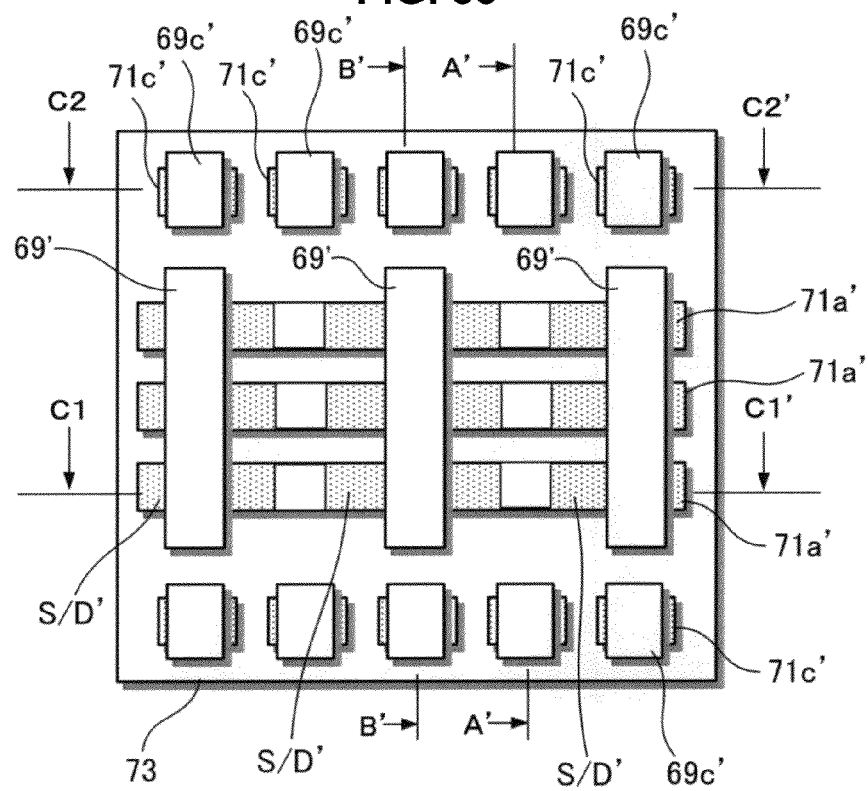
FIG. 53 is a diagram (part 1) illustrating a process of manufacturing the second element layer of the semiconductor device according to the fifth embodiment.

First, as illustrated in FIG. 53, which is a diagram (part 1) illustrating the manufacturing process, the plurality of active regions 71a' obtained by patterning the semiconductor layer and the connection regions 71c' with an island shape independent from the active region are pattern-formed on the one main surface side of the manufacturing substrate 73 with an insulation property. When a semiconductor substrate is used as the manufacturing substrate 73, the front surface layer of the semiconductor substrate is processed as the convex active regions 71a' and the island-shaped connection regions 71c', and the front surface of the semiconductor substrate is covered with an insulation film on the bottoms of the active regions 71a' and the connection regions 71c'.

Thereafter, n-type sources and drains S/D' are formed in the active regions 71a' using dummy gates (not illustrated here) as masks. Further, in the same process as the process of forming the sources and drains S/D', the connection regions 71c' are metalized. Next, the source and drain electrodes 69' traversing the active regions 71a' are formed on the tops of the respective sources and drains S/D'. In the same process as this process, the connection electrodes 69c' are formed on the tops of the connection regions 71c'.

Figure 54:
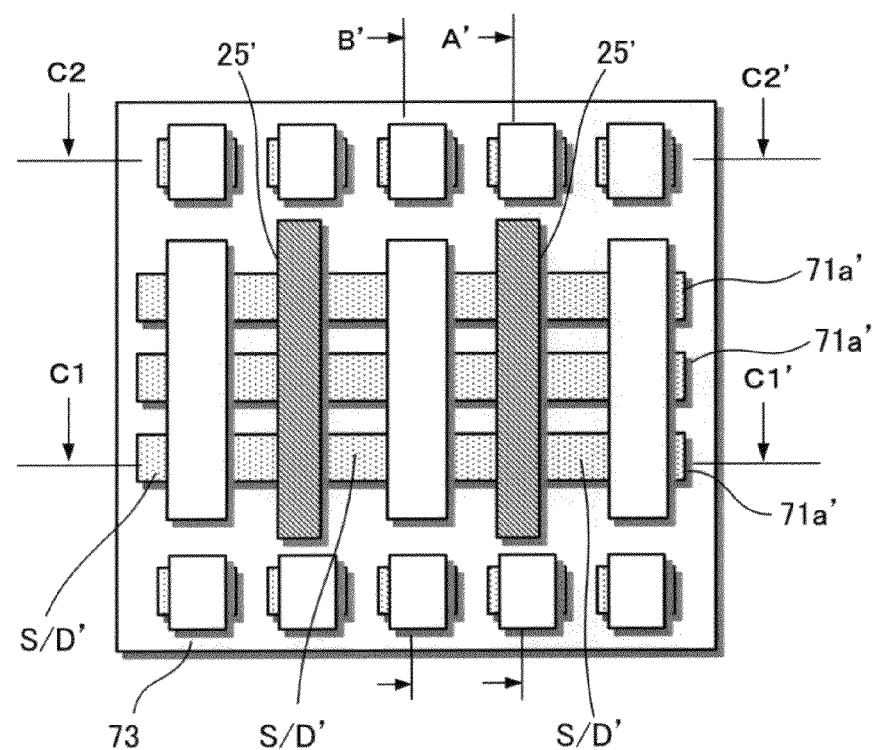
FIG. 54 is a diagram (part 2) illustrating a process of manufacturing the second element layer of the semiconductor device according to the fifth embodiment.

Next, as illustrated in FIG. 54, which is a diagram (part 2) illustrating the manufacturing process, the above-described dummy gates are removed, and then the gate electrodes 25' are formed via the gate insulation film (not illustrated here) to traverse the active regions 71a' between the sources and drains S/D'.

Figure 55:
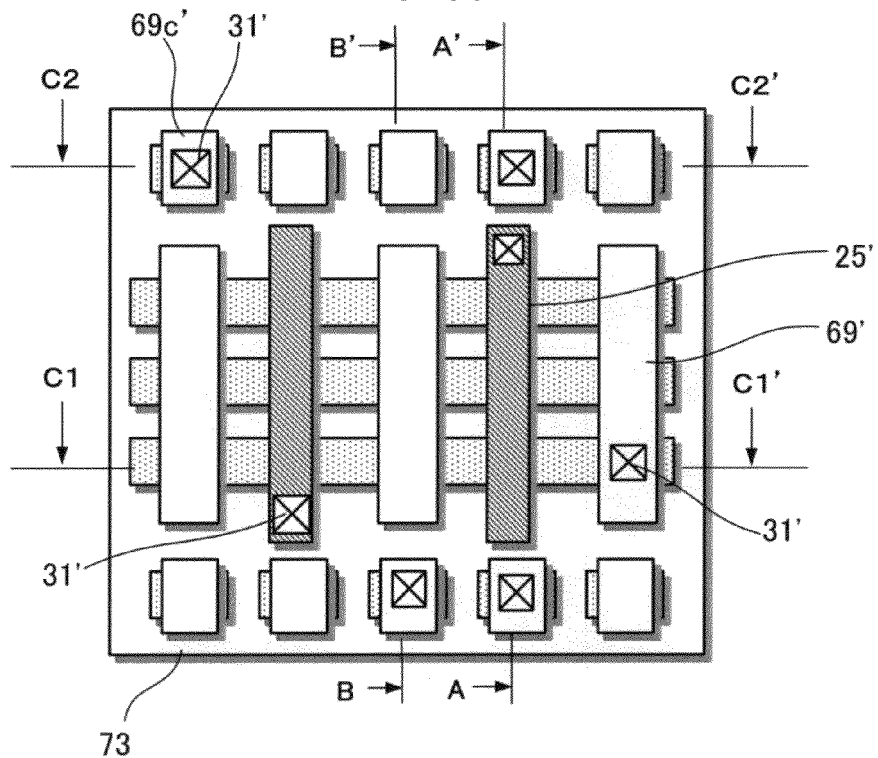
FIG. 55 is a diagram (part 3) illustrating a process of manufacturing the second element layer of the semiconductor device according to the fifth embodiment.

Thereafter, as illustrated in FIG. 55, which is a diagram (part 3) illustrating the manufacturing process, the laminated insulation film 27' (not illustrated here) is formed on the one main surface side of the manufacturing substrate 73 to cover the gate electrodes 25'. Subsequently, the contacts 31' penetrating this laminated insulation film 27' and reaching the gate electrodes 25', the source and drain electrodes 69', and the connection electrodes 69c' are formed in the portions selected according to necessity. Thereafter, the laminated insulation film 27' is further accumulated.

Figure 56:
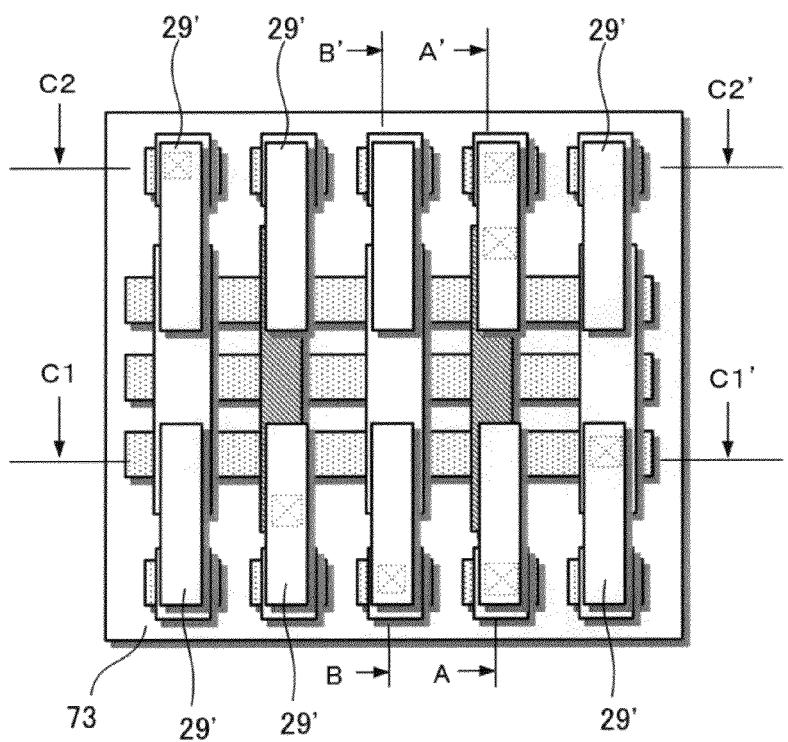
FIG. 56 is a diagram (part 4) illustrating a process of manufacturing the second element layer of the semiconductor device according to the fifth embodiment.

After the above-described processes, as illustrated in FIG. 56 which is the diagram (part 4) illustrating the manufacturing process, the counter electrodes 29' of which parts are connected to the contacts 31' are formed by applying an embedded-electrode process (a so-called damascene process) to the accumulated laminated insulation film 27'. In particular, here, it is important to form the counter electrodes 29' with the constant shape while the constant intervals are maintained.

As described above, the above-described second element layer 50-2 can be obtained. The processing order is not particularly limited except that the contacts 31' are formed only in the portions selected from the preset portions and the electrodes 29' are formed while the constant intervals are maintained, and the manufacturing of the above-described second element layer 50-2 is performed in a normal order. For example, a dual damascene process may be applied when the contacts 31' and the electrodes 29' are formed.

<Lamination Process>

Figure 57:
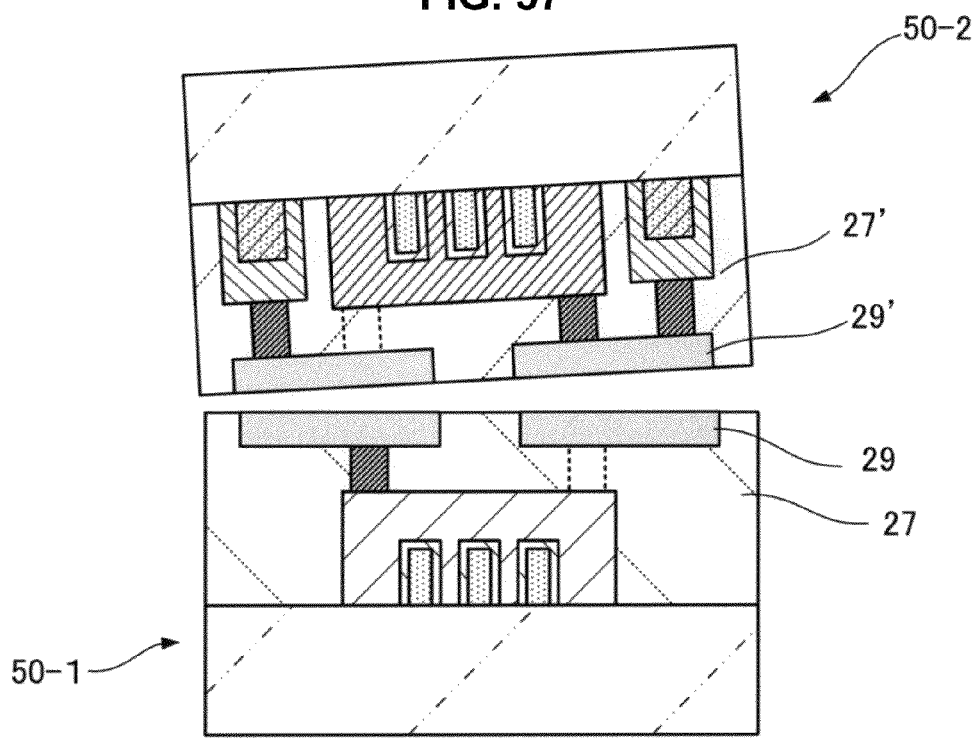
FIG. 57 is a diagram (part 1) illustrating a process of laminating the semiconductor device according to the fifth embodiment.
Figure 58:
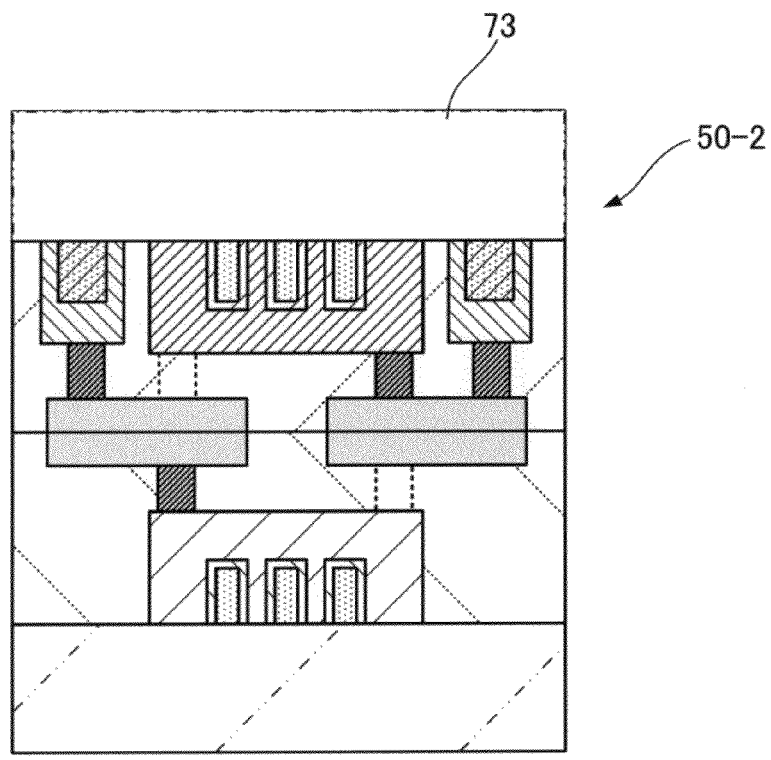
FIG. 58 is a diagram (part 2) illustrating a process of laminating the semiconductor device according to the fifth embodiment.

FIGS. 57 and 58 are diagrams illustrating a laminating process to describe the process of laminating the first element layer 50-1 and the second element layer 50-2 and correspond to the sectional views taken along the line A-A' of the above-described plan views. As illustrated in the drawings, the process of laminating the first element layer 50-1 and the second element layer 50-2 is performed as follows.

First, as illustrated in FIG. 57, which is a diagram (part 1) illustrating the laminating process, the first element layer 50-1 and the second element layer 50-2 are disposed to face each other so that the counter electrodes 29 of the first element layer 50-1 face the electrodes 29' of the second element layer 50-2. At this time, the first element layer 50-1 and the second element layer 50-2 are aligned so that the counter electrodes 29 and the electrodes 29' correspond to each other in a one-to-one manner. In this state, the counter electrodes 29 of the first element layer 50-1 are joined with the electrodes 29' of the second element layer 50-2. Further, the first element layer 50-1 is bonded to the second element layer 50-2 by joining the laminated insulation film 27 of the first element layer 50-1 with the insulation film 27' of the second element layer 50-2.

Next, as illustrated in FIG. 58, which is a diagram (part 2) illustrating the laminating process, the manufacturing substrate 73 is peeled from the side of the second element layer 50-2. When a semiconductor substrate is used as the manufacturing substrate 73, the semiconductor substrate is cut until the insulation film on the bottoms of the active regions 71a' and the connection regions 71c' is exposed, and the insulation film is also removed, as necessary.

Figure 46:
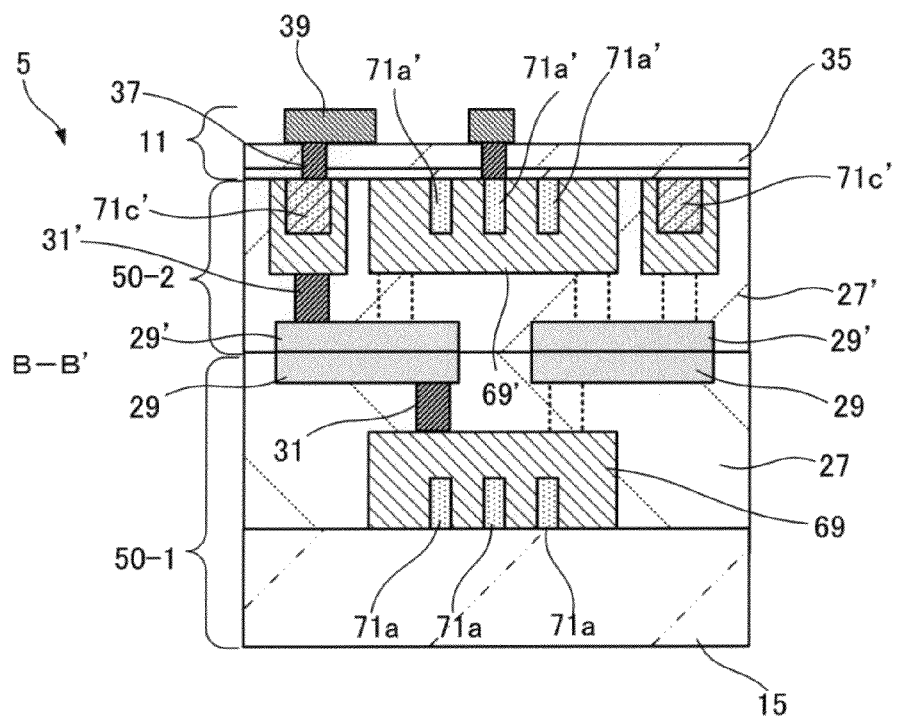
FIG. 46 is a sectional view taken along the line B-B' of FIG. 42.
Figure 47:
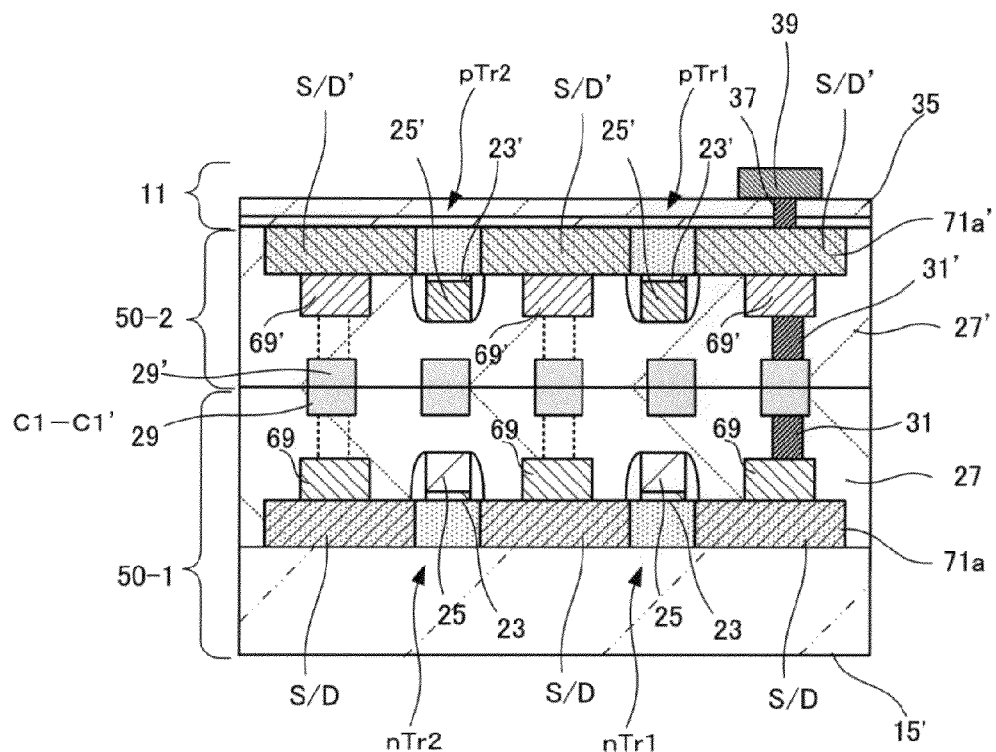
FIG. 47 is a sectional view taken along the line C1-C1' of FIG. 42.

Thereafter, as illustrated in FIGS. 45 and 46, the wiring layer 11 is formed on the side of the second element layer 50-2. The forming of the wiring layer 11 is performed in the same way as that described in the first embodiment with reference to FIG. 21. As described above, the semiconductor device 5 is completed.

<Advantages of Manufacturing Method According to Fifth Embodiment>

According to the above-described manufacturing method, the semiconductor device 5 with the above-described configuration can be manufactured. Since the counter electrodes 29 of the first element layer 50-1 and the electrodes 29' of the second element layer 50-2 are formed in the constant shapes while the constant intervals are maintained, it is possible to form the counter electrodes 29 and the electrodes 29' of which heights are constantly maintained. As a result, when the first element layer 50-1 and the second element layer 50-2 are laminated to be bonded, adhesion can be improved, and thus the joining strength of the first element layer 50-1 and the second element layer 50-2 can be ensured.

5-(3) Modification Example 1 (Example of Lamination Structure of 3 or More Layers)

Figure 59:
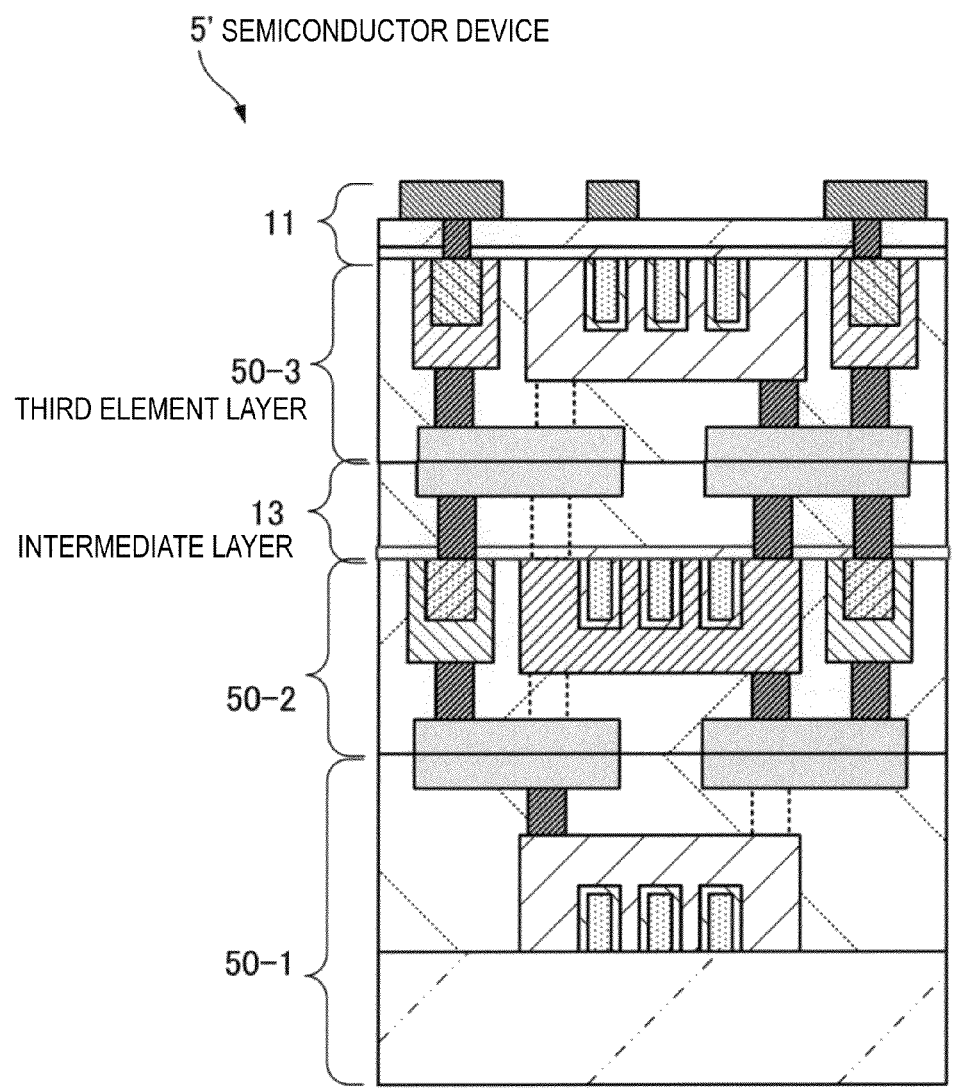
FIG. 59 is a sectional view according to modification example 1 of the fifth embodiment.

FIG. 59 is a sectional view illustrating a schematic configuration of a semiconductor device 5' according to modification example 1 of the fifth embodiment. The semiconductor device 5' of modification example 1 illustrated in the drawing has a configuration in which three or more semiconductor layers are laminated. Here, an example of a 3-layered lamination structure in which a third element layer 50-3 is further laminated on the side of the second element layer 50-2 is illustrated.

In this case, the configurations of the third element layer 50-3 and upper element layers are assumed to be the same as those of the second element layer 50-2. The same intermediate layer 13 as that described in the second embodiment may be disposed with the same configuration between the second element layer 50-2 and the third element layer 50-3 and the upper element layers.

<5-(4) Manufacturing Method of Modification Example 1>

Manufacturing of the semiconductor device 5' of such modification example 1 is performed as follows.

Figure 60:
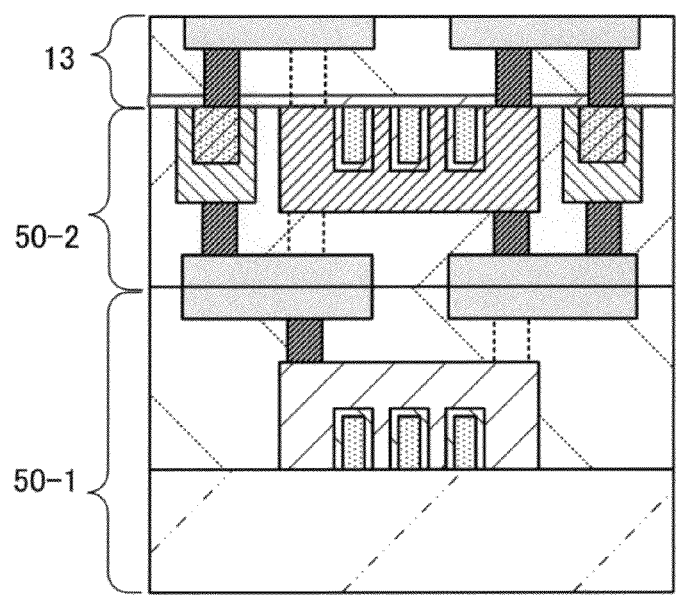
FIG. 60 is a diagram (part 1) illustrating a laminating process according to modification example 1 of the fifth embodiment.

First, as illustrated in FIG. 60, which is a diagram (part 1) illustrating a laminating process, the first element layer 50-1 and the second element layer 50-2 are laminated, and a manufacturing substrate on the side of the second element layer 50-2 is peeled. So far, the manufacturing is performed in the same way as that described in the fifth embodiment. Thereafter, the intermediate layer 13 is formed on the side of the second element layer 50-2. The forming of the intermediate layer 13 is performed as in the forming of the intermediate layer 13-1 described in the second embodiment with reference to FIG. 26.

Figure 61:
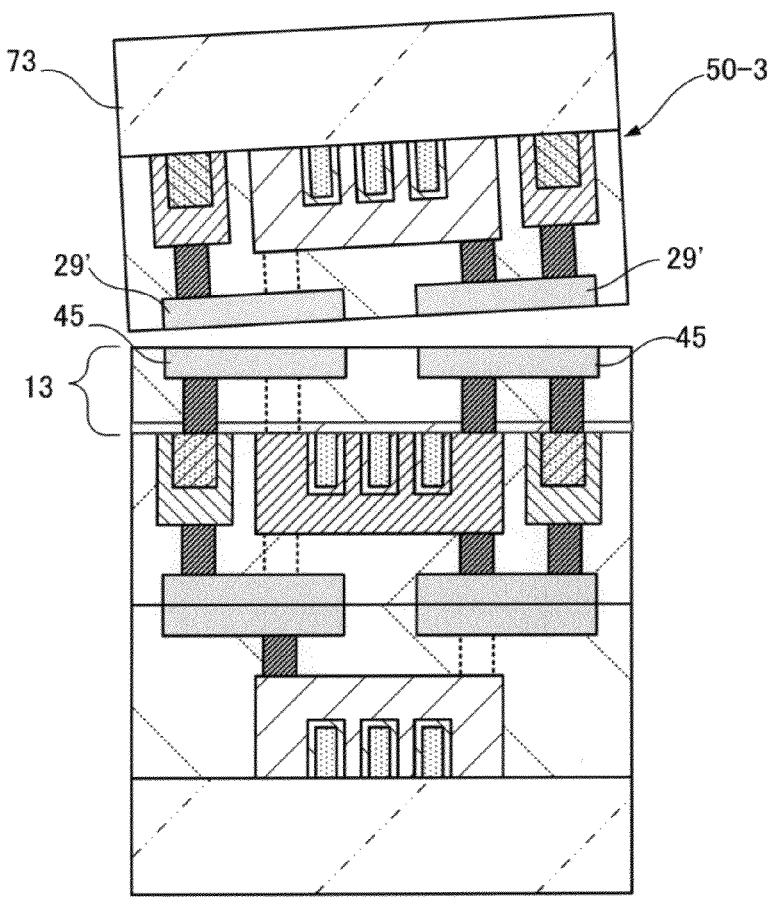
FIG. 61 is a diagram (part 2) illustrating a laminating process according to modification example 1 of the fifth embodiment.
Figure 62:
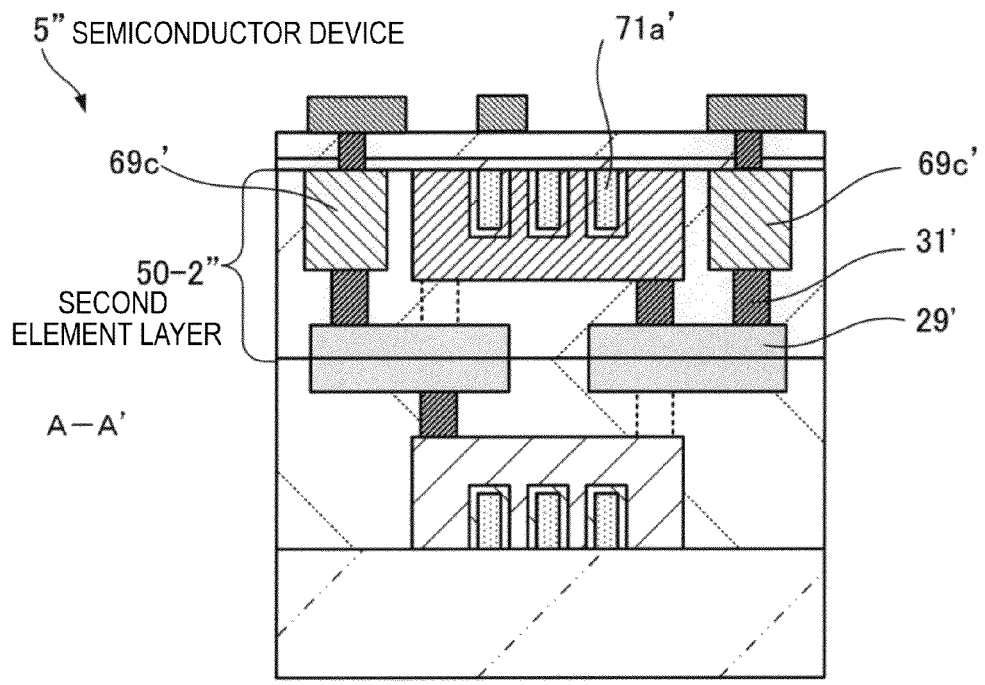
FIG. 62 is a sectional view according to modification example 2 of the fifth embodiment (corresponding to the view taken along the line A-A' of FIG. 42)
Figure 63:
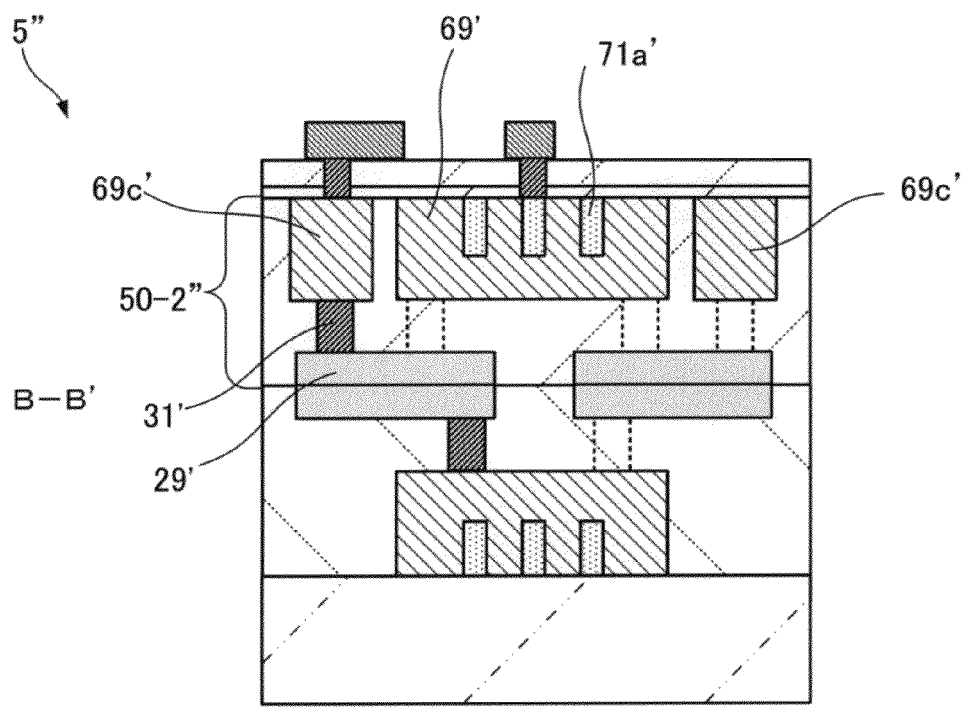
FIG. 63 is a sectional view according to modification example 2 of the fifth embodiment (corresponding to the view taken along the line B-B' of FIG. 42)
Figure 64:
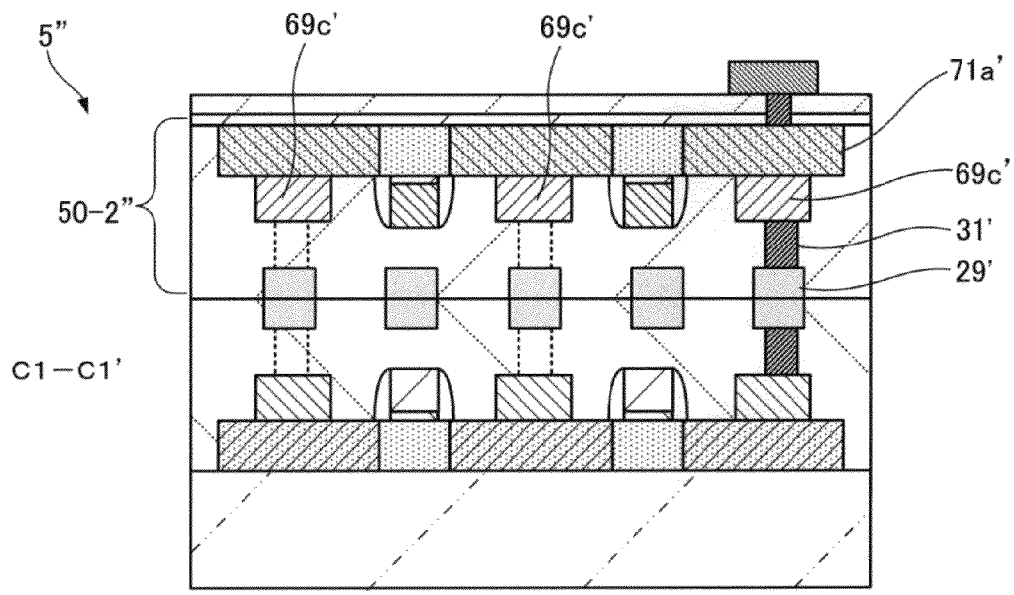
FIG. 64 is a sectional view according to modification example 2 of the fifth embodiment (corresponding to the view taken along the line C1-C1' of FIG. 42)
Figure 65:
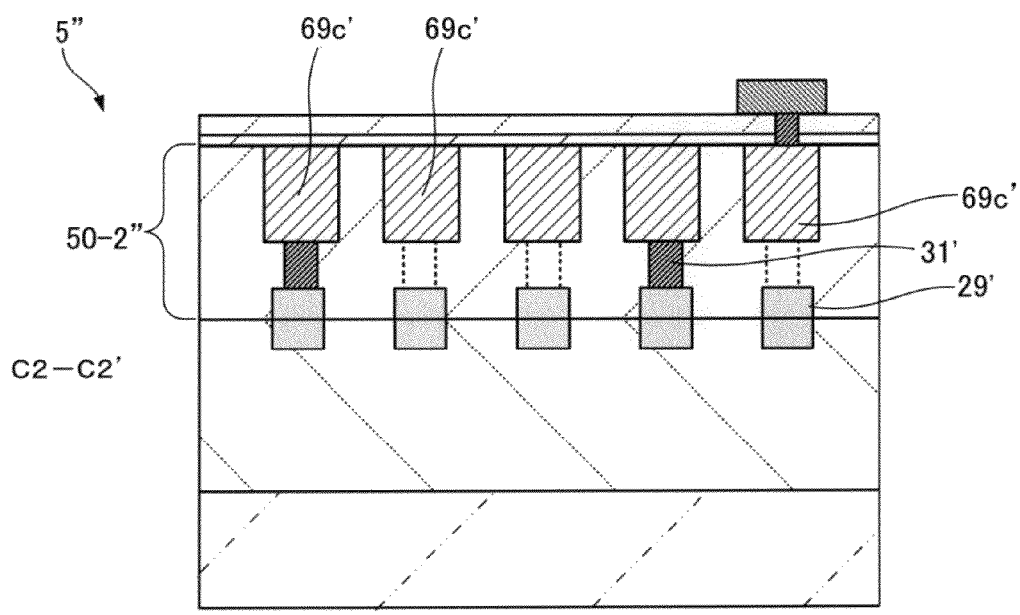
FIG. 65 is a sectional view according to modification example 2 of the fifth embodiment (corresponding to the view taken along the line C2-C2' of FIG. 42)

Next, as illustrated in FIG. 61, which is a diagram (part 2) illustrating a laminating process, the third element layer 50-3 is laminated on the surface in which the intermediate electrodes 45 are formed in the intermediate layer 13. The process of manufacturing the third element layer 50-3 is performed as in the process of manufacturing the second element layer 50-2 described in the fifth embodiment with reference to FIGS. 53 to 56. The laminating of the third element layer 50-3 on the intermediate layer 13 is performed as in the joining of the intermediate electrodes 45 of the intermediate layer 13 with the electrodes 29' of the third element layer 50-3 in the one-to-one manner. Thereafter, a manufacturing substrate 73 is peeled from the third element layer 50-3.

Subsequently, as illustrated in FIG. 59, the semiconductor device 5' of modification example 1 is completed by forming a wiring layer 11 on the third element layer 50-3.

A lamination example of a structure of three or more layers when the present technology is applied to a configuration including a semiconductor element with a FIN structure is not limited to this modification example 1. For example, as described in the second embodiment, a configuration in which element layers which all have the same configuration in addition to a first element layer are laminated via intermediate layers can also be exemplified.

In the semiconductor device 5' of the above-described modification example 1, potentials of the portions of the transistors of each layer can be also extracted up to the connection regions 71c' of the uppermost layer. As a result, it is possible to achieve miniaturization of the semiconductor device 5' in which a plurality of element layers with the FIN structure such as three or more element layers are laminated.

<5-(5) Modification Example 2 (Example of Direct Connection Between Contacts)>

Sectional views of FIGS. 62 to 65 are sectional views illustrating a schematic configuration of a semiconductor device 5" of modification example 2 of the fifth embodiment. These sectional views correspond to the portions taken along the lines A-A', B-B', C1-C1', and C2-C2' of the plan views of FIGS. 42 to 45 illustrating the configuration of the semiconductor device of the fifth embodiment. The semiconductor device 5" of modification example 2 illustrated in these drawings is different from the semiconductor device of the fifth embodiment in that a second element layer 50-2" includes no connection regions obtained by metalizing a semiconductor layer. The remaining configuration is the same.

That is, in the second element layer 50-2" included in the semiconductor device 5" of modification example 2, only connection electrodes 69c' obtained by patterning the same layer as source and drain electrodes 69' in an independent island shape are formed on the outside of active regions 71a' formed by the semiconductor layer. Electrodes 29' are formed to be connected to the connection electrodes 69c' in portions selected according to necessity.

In the semiconductor device 5" with such a configuration according to modification example 2, potentials of the portions of the transistors of each layer can be extracted up to the connection electrodes 69c' of the uppermost layer. As a result, it is possible to achieve miniaturization of the semiconductor device 5″ in which a plurality of element layers with the FIN structure such as three or more element layers are laminated.

The above-described fifth embodiment including modification examples 1 and 2 of the fifth embodiment can be applied the laminate forming the driving circuit of the solid-state imaging device described in the fourth embodiment.

Sixth Embodiment

Example of Lamination Structure Using Tantalum Oxide Layer 6-(1) Structure

Figure 66:
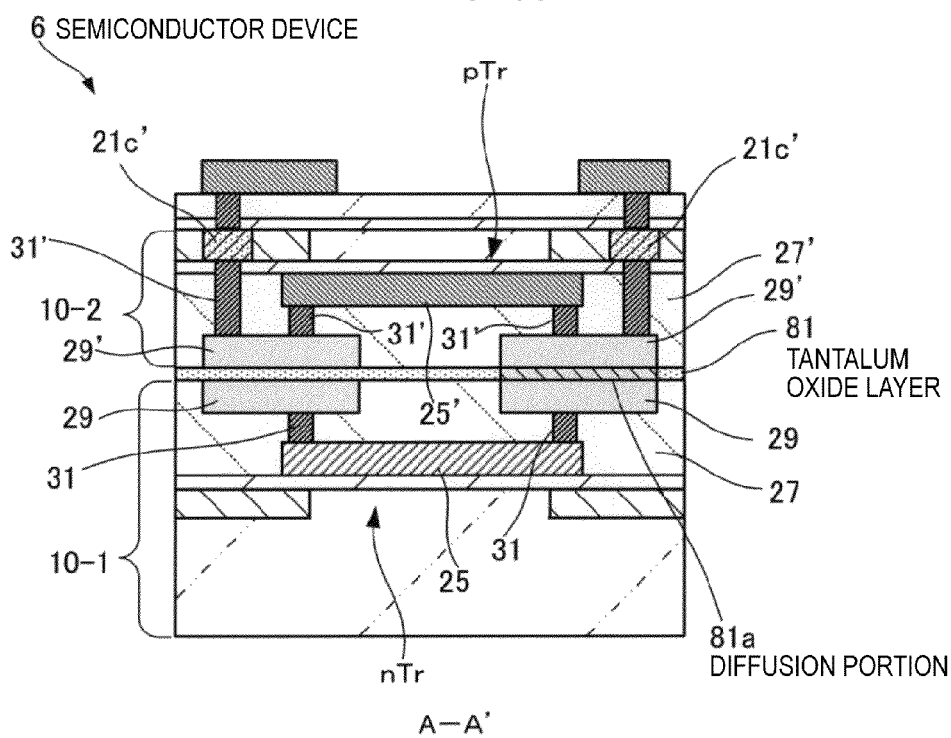
FIG. 66 is a sectional view illustrating characteristic portions of a semiconductor device according to a sixth embodiment.

FIG. 66 is a sectional view illustrating characteristic portions of a semiconductor device according to a sixth embodiment. The semiconductor device 6 of the sixth embodiment illustrated in the drawing is characterized by the fact that a tantalum oxide layer 81 is formed in the semiconductor device of the first embodiment described with reference to FIGS. 1 to 12. The sixth embodiment is different from the first embodiment in that contacts 31 and 31' are formed in all of the portions of a first element layer 10-1 and a second element layer 10-2. Hereinafter, the details of the semiconductor device 6 of the sixth embodiment will be described selecting only portions different from those of the first embodiment. The same reference numerals are given to the same constituent elements as those of the first embodiment and the repeated description will be omitted.

[Contacts 31 of First Element Layer 10-1]

Contacts 31 of the first element layer 10-1 are formed in all of the portions that connect gate electrodes 25 of an n-type transistor nTr, here, sources and drains S/D (not illustrated here), to counter electrodes 29.

[Contacts 31' of Second Element Layer 10-2]

Contacts 31' of the second element layer 10-2 are formed in all of the portions that connect gate electrodes 25' of a p-type transistor pTr, here, sources and drains S/D' (not illustrated here) and connection regions 21c', to electrodes 29'.

[Tantalum Oxide Layer 81]

The tantalum oxide layer 81 is formed to be interposed between the first element layer 10-1 and the second element layer 10-2. Thus, the tantalum oxide layer 81 is formed between all of the counter electrodes 29 of the first element layer 10-1 and all of the electrodes 29' of the second element layer 10-2 disposed to face each other in a one-to-one manner.

A diffusion portion 81a to which at least one of the material of the counter electrode 29 and the material of the electrode 29' diffuses is formed only in the tantalum oxide layer 81 between the counter electrode 29 and the electrode 29' to be connected according to necessity. The diffusion portion 81a becomes a portion with conductivity by the diffusion of the material of the electrode.

6-(2) Manufacturing Method

The above-described semiconductor device 6 is manufactured as follows.

Figure 67:
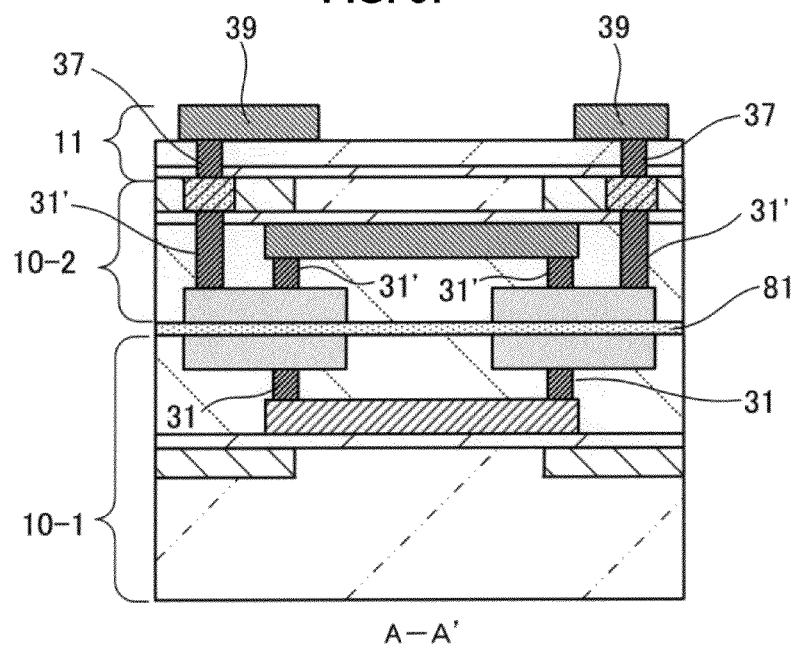
FIG. 67 is a sectional view illustrating a method of manufacturing the semiconductor device according to the sixth embodiment.

First, as illustrated in FIG. 67, the first element layer 10-1 in which the contacts 31 are formed in all of the portions and the second element layer 10-2 in which the contacts 31' are formed in all of the portions are laminated with the tantalum oxide layer 81 interposed therebetween. The tantalum oxide layer 81 may be formed on the side of the first element layer 10-1, may be formed on the side of the second element layer 10-2, or may be formed on both sides of the first and second element layers, before the first element layers 10-1 and second element layer 10-2 are laminated. At this time, the counter electrodes 29 of the first element layer 10-1 and the electrodes 29' of the second element layer 10-2 correspond to each other in a one-to-one manner. Thereafter, the wiring layer 11 is formed on the side of the second element layer 10-2. At this time, even in the wiring layer 11, upper contacts 37 are formed in all of the portions and wirings 39 connected to the upper contacts 37 are formed.

In this state, using the selected wiring 39 as a terminal, a voltage is applied between the counter electrode 29 and the electrode 29' to be connected according to necessity. Thus, at least one of the electrode materials of the counter electrode 29 and the electrode 29' diffuses to the tantalum oxide layer 81 between the counter electrode 29 and the electrode 29' of the portion to which the voltage is applied. Thus, the diffusion portion 81a with conductivity illustrated in FIG. 66 is formed only in a necessary portion by the application of the voltage between the selected counter electrode 29 and the selected electrode 29'.

At this time, when the counter electrode 29 and the electrode 29' are formed of copper (Cu), copper (Cu) diffuses from both of the counter electrode 29 and the electrode 29' to the tantalum oxide layer 81 and the diffusion portion 81a with conductivity is formed.

As described above, the semiconductor device 6 of the sixth embodiment is completed.

According to this sixth embodiment, after the semiconductor device is manufactured through the semiconductor process, a desired circuit can be formed by application of a voltage via the selected wirings 39.

<6-(3) Modification Example>

Figure 68:
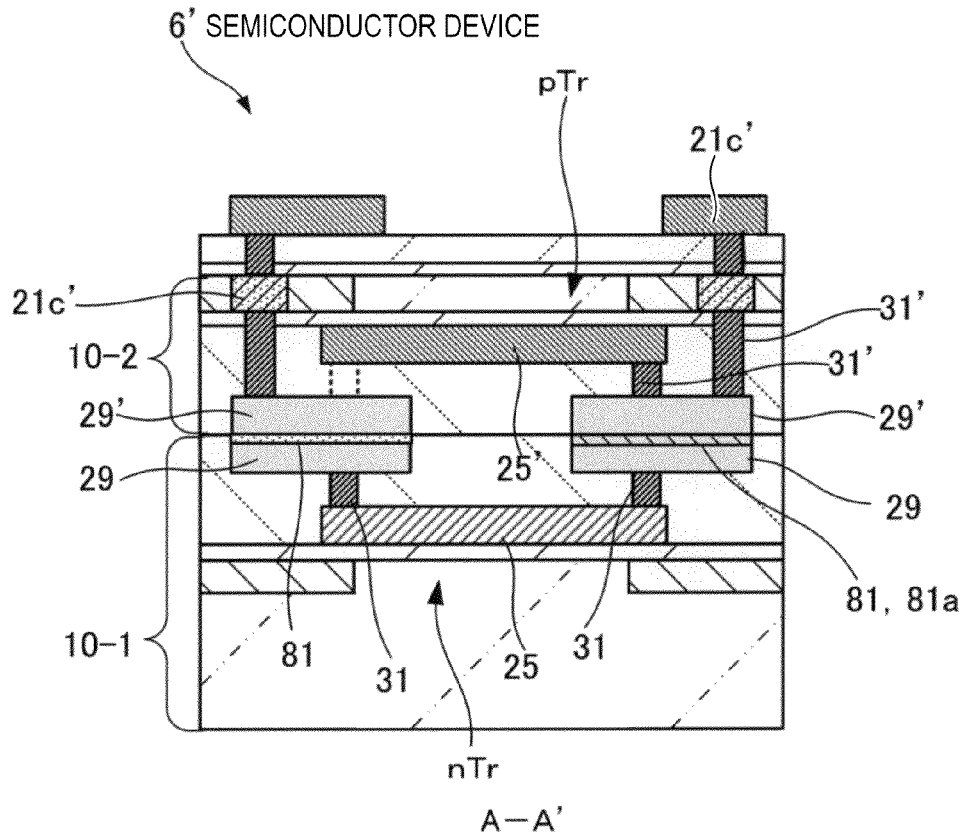
FIG. 68 is a sectional view illustrating characteristic portions according to a modification example of the sixth embodiment.

FIG. 68 is a sectional view illustrating characteristic portions according to a modification example of the sixth embodiment. A semiconductor device 6' of the modification example illustrated in the drawing is different from the semiconductor device 6 of the sixth embodiment in that a tantalum oxide layer 81 is partially formed. Further, contacts 31 and 31' are assumed to be formed in selected portions in a first element layer 10-1 and a second element layer 10-2. Hereinafter, the details of the semiconductor device 6' of the modification example of the sixth embodiment will be described selecting only characteristic portions. The same reference numerals are given to the same constituent elements as those of the first and sixth embodiments and the repeated description will be omitted.

[Contacts 31 of First Element Layer 10-1]

Contacts 31 of the first element layer 10-1 are formed in portions selected from portions that connect gate electrodes 25 of an n-type transistor nTr, here, sources and drains S/D (not illustrated here), to counter electrodes 29.

[Contacts 31' of Second Element Layer 10-2]

Contacts 31' of the second element layer 10-2 are formed in portions selected from portions that connect gate electrodes 25' of a p-type transistor pTr, here, sources and drains S/D' (not illustrated here) and connection regions 21c', to electrodes 29'.

[Tantalum Oxide Layer 81]

The tantalum oxide layer 81 is formed between electrodes selected from the counter electrodes 29 of the first element layer 10-1 and the electrodes 29' of the second element layer 10-2. Here, in the drawing, a portion in which the tantalum oxide layer 81 is interposed between both of two counter electrode 29 and electrode 29' is illustrated.

A diffusion portion 81a to which at least one of the material of the counter electrode 29 and the material of the electrode 29' diffuses is formed only in the tantalum oxide layer 81 between the counter electrode 29 and the electrode 29' to be connected according to necessity. The diffusion portion 81a becomes a portion with conductivity by the diffusion of the material of the electrode.

<6-(4) Manufacturing Method of Modification Example>

The semiconductor device 6' of such a modification example is manufactured as follows.

Figure 69:
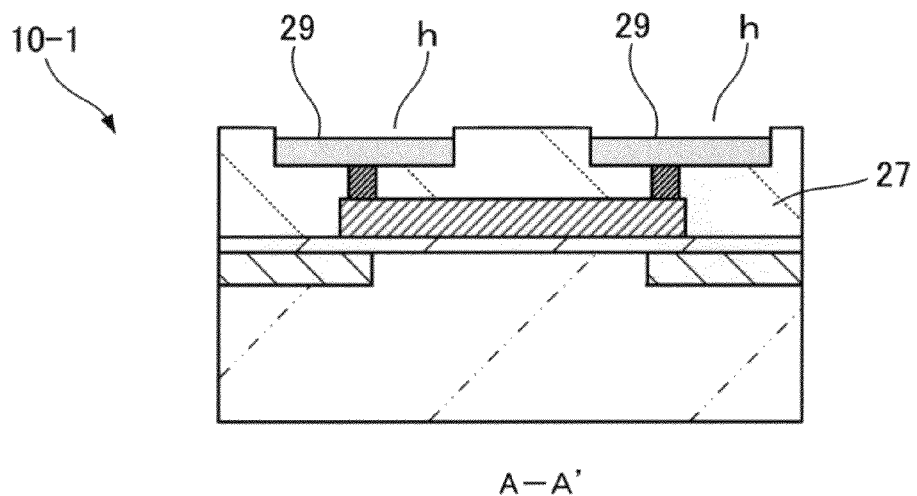
FIG. 69 is a sectional view (part 1) illustrating a manufacturing method according to a modification example of the sixth embodiment.

First, as illustrated in a sectional view (part 1) of FIG. 69, the first element layer 10-1 is prepared. A process of manufacturing the first element layer 10-1 is performed in the same way as that described in the first embodiment. Thereafter, the counter electrode 29 selected in the first element layer 10-1 is thinned and a groove h is formed on the top of the counter electrode 29 in a laminated insulation film 27.

Figure 70:
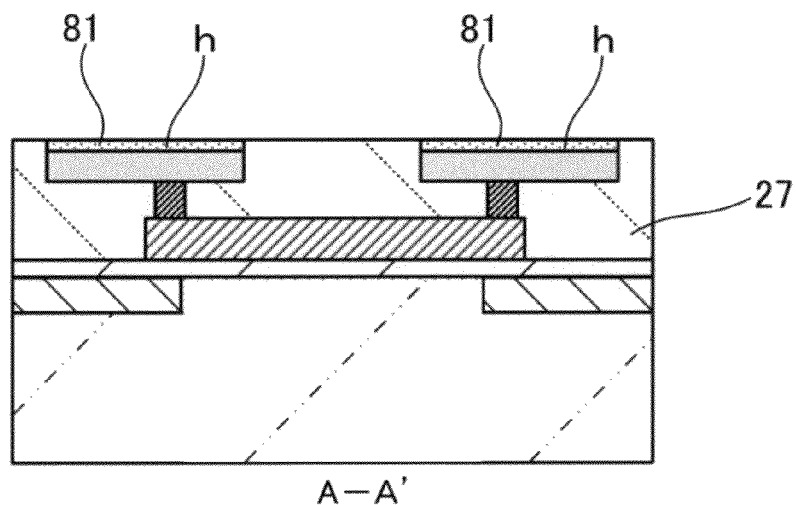
FIG. 70 is a sectional view (part 2) illustrating a manufacturing method according to a modification example of the sixth embodiment.

Next, as illustrated in a sectional view (part 2) of FIG. 70, the tantalum oxide layer 81 is formed in the groove h formed in the first element layer 10-1. At this time, the surface of the tantalum oxide layer 81, the surface of the laminated insulation film 27, and the surface of the counter electrode 29 that is not thinned are set to have the same height.

Figure 71:
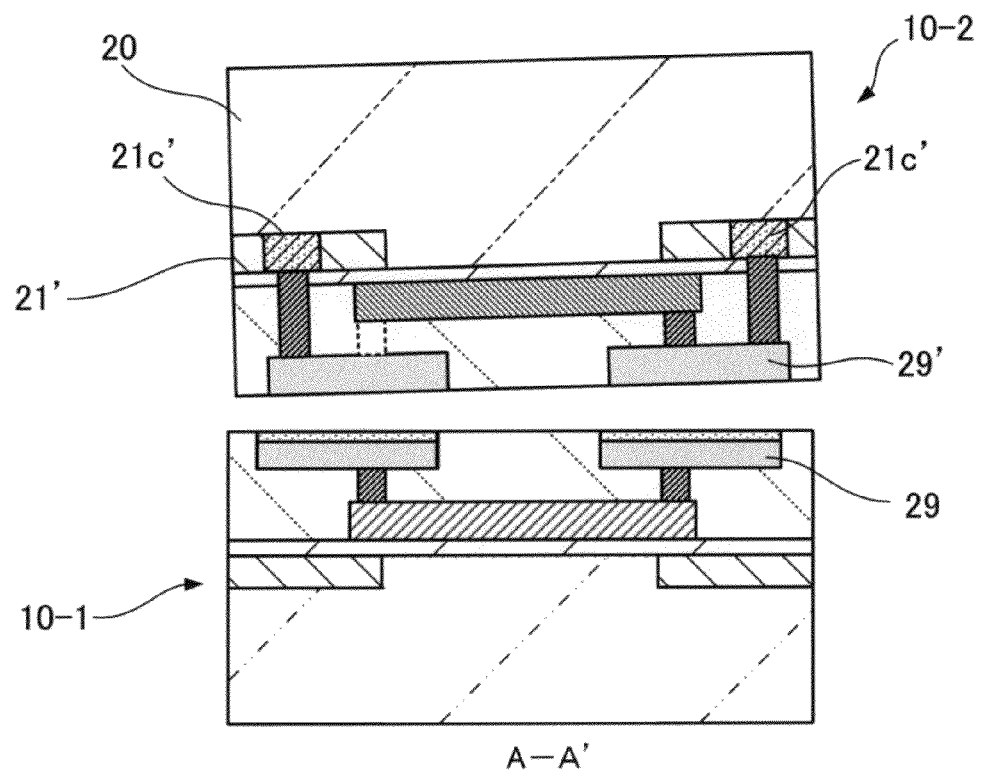
FIG. 71 is a sectional view (part 3) illustrating a manufacturing method according to a modification example of the sixth embodiment.

Next, as illustrated in a sectional view (part 3) of FIG. 71, the second element layer 10-2 prepared in the same manufacturing process as that described in the first embodiment is laminated on the first element layer 10-1. At this time, as in the first embodiment, the first element layer 10-1 and the second element layer 10-2 are laminated so that the counter electrodes 29 of the first element layer 10-1 and the electrodes 29' of the second element layer 10-2 correspond to each other in a one-to-one manner. Thereafter, a semiconductor layer 21' obtained by thinning a semiconductor substrate 20 on the side of the second element layer 10-2 is formed by cutting the semiconductor substrate 20 on the side of the second element layer 10-2 until connection regions 21c' are exposed.

A tantalum oxide layer 81 may be formed also in the second element layer 10-2, as in the first element layer 10-1. In this case, the tantalum oxide layer 81 may not be formed in the first element layer 10-1.

Figure 72:
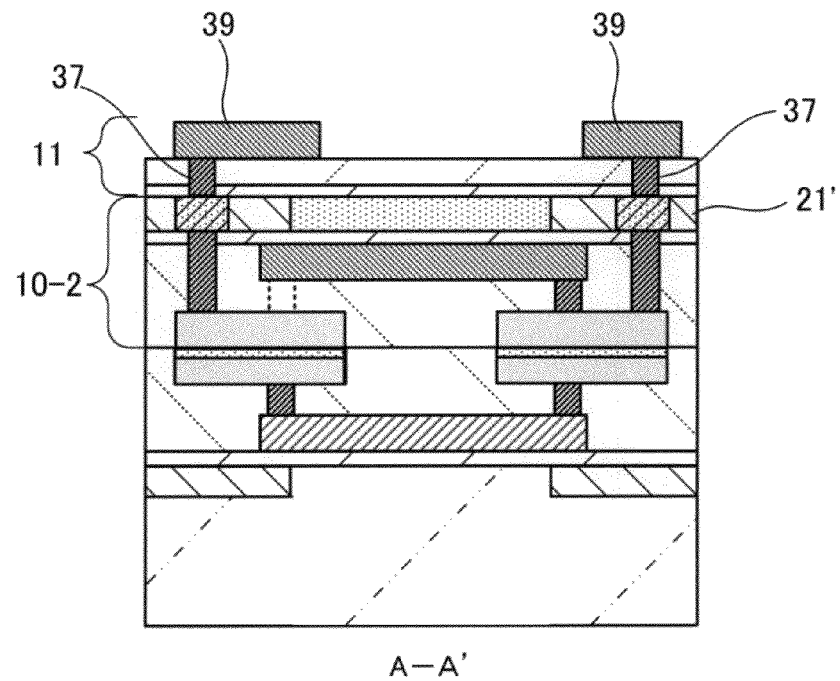
FIG. 72 is a sectional view (part 4) illustrating a manufacturing method according to a modification example of the sixth embodiment.

Next, as illustrated in a sectional view (part 4) of FIG. 72, a wiring layer 11 is formed on the side of the second element layer 10-2. At this time, in the wiring layer 11, upper contacts 37 are formed in selected portions and wirings 39 connected to the upper contacts 37 are formed.

After the above-described processes, using the selected wiring 39 as a terminal, a voltage is applied between the counter electrode 29 and the electrode 29' to be connected according to necessity. Thus, at least one of the electrode materials of the counter electrode 29 and the electrode 29' diffuses to the tantalum oxide layer 81 between the counter electrode 29 and the electrode 29' of the portion to which the voltage is applied.

Thus, the diffusion portion 81a with conductivity illustrated in FIG. 68 is formed only in the selected portion. At this time, when the counter electrode 29 and the electrode 29' are formed of copper (Cu), copper (Cu) diffuses from both of the counter electrode 29 and the electrode 29' to the tantalum oxide layer 81 and the diffusion portion 81a with conductivity is formed.

As described above, the semiconductor device 6' of the modification example of the sixth embodiment is completed.

According to the modification example of the sixth embodiment, after the semiconductor device is manufactured through the semiconductor process, a desired circuit can be formed by application of a voltage via the selected wirings 39. In this case, circuit design with a higher degree of freedom can be realized by the selection of the gap between the counter electrode 29 and the electrode 29' in which the tantalum oxide layer 81 is formed and the selection of the formation of the diffusion portion 81a by the application of a voltage to the tantalum oxide layer 81 in addition to the selection of the portions in which the contacts 31 and 31' are disposed.

In the above-described sixth embodiment, the configuration in which the tantalum oxide layer 81 is formed in the configuration of the first embodiment has been described. However, this sixth embodiment is applicable to all of the second to fifth embodiments including the modification examples, and the same advantages can be obtained.

Seventh Embodiment

Electronic Device Using Solid-State Imaging Device

The solid-state imaging device related to the present technology described in the above-described fourth embodiment can be provided, for example, as a solid-state imaging device for an electronic device such as a camera system such as a digital camera or a video camera, a cellular phone having an imaging function, or other devices including an imaging function.

Figure 73:
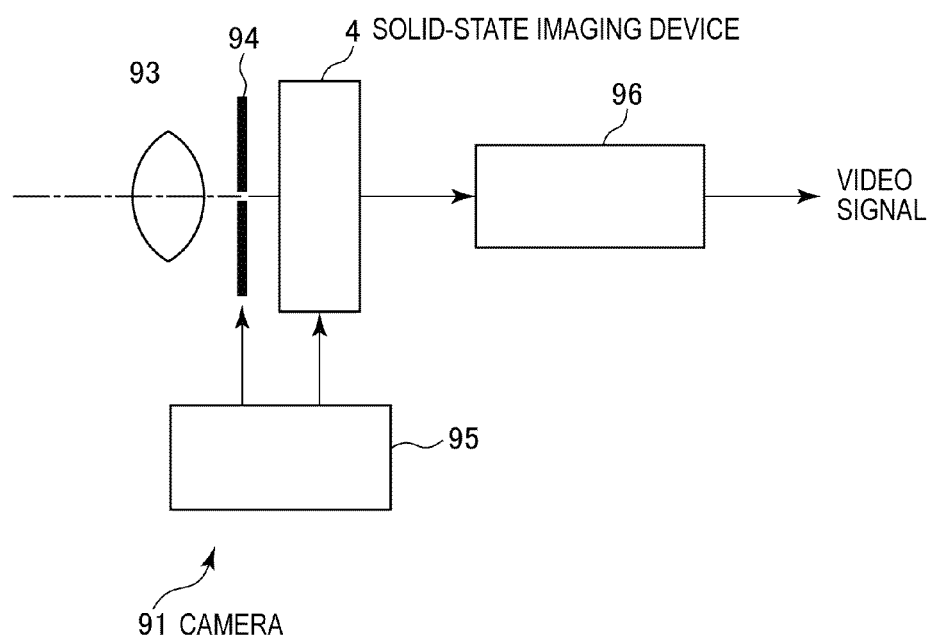
FIG. 73 is a diagram illustrating the configuration of an electronic device according to a seventh embodiment.

FIG. 73 is a diagram illustrating the configuration of a camera using a solid-state imaging device and an electronic device using the camera as examples of a camera and an electronic device according to an embodiment of the present technology. An electronic device 90 according to this embodiment includes a video camera 91 capable of capturing a still image and a moving image. The video camera 91 includes a solid-state imaging device 4, an optical system 93 that guides incident light to a light-receiving sensor unit of the solid-state imaging device 4, a shutter device 94, a driving circuit 95 that drives the solid-state imaging device 4, and a signal processing circuit 96 that processes an output signal of the solid-state imaging device 4.

The solid-state imaging device 4 is a solid-state imaging device that has the configuration described in the above-described fourth embodiment. The optical system (optical lens) 93 forms image light (incident light) from a subject as an image on an imaging surface of the solid-state imaging device 4. A plurality of pixels are arrayed in the imaging surface and incident light from the optical system 93 is guided to an imaging region in which photoelectric conversion units included in the pixels are arrayed. Thus, signal charge is accumulated in the photoelectric conversion units of the solid-state imaging device 4 for a given period. The optical system 93 may also be an optical lens system that includes a plurality of optical lenses. The shutter device 94 controls a light radiation period and a light blocking period for the solid-state imaging device 4. The driving circuit 95 supplies driving signals to the solid-state imaging device 4 and the shutter device 94 and controls an operation of outputting a signal to the signal processing circuit 96 of the solid-state imaging device 4 and a shutter operation performed by the shutter device 94 based on the supplied driving signals (timing signals). That is, the driving circuit 95 performs an operation of transmitting a signal from the solid-state imaging device 4 to the signal processing circuit 96 by supplying the driving signals (timing signals). The signal processing circuit 96 performs various kinds of signal processing on the signal transmitted from the solid-state imaging device 4. A video signal subjected to the signal processing is stored in a storage medium such as a memory or is output to a monitor.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A semiconductor device including:
a semiconductor layer that includes an active region;
semiconductor elements that are formed using the active region;
connection regions that are obtained by metalizing parts of the semiconductor layer in an island shape isolated from the active region;
an insulation film that is formed to cover one main surface side of the semiconductor layer;
electrodes that are disposed to face the semiconductor elements and the connection regions via the insulation film; and
contacts that penetrate through the insulation film to be selectively formed in portions according to necessity among portions that connect the semiconductor elements or the connection regions to the electrodes.

(2) The semiconductor device according to (1), wherein connection states between the semiconductor elements and the connection regions via the electrodes are selected by selection of positions at which the contacts are formed.

(3) The semiconductor device according to (1) or (2), further including:
counter electrodes that are disposed at positions facing the electrodes and are connected to the electrodes;
a laminated insulation film that is formed over one main surface side of the insulation film to cover the counter electrodes;
other semiconductor elements that are formed over the laminated insulation film of an opposite side to the counter electrodes with the laminated insulation film interposed therebetween; and
other contacts that penetrate through the laminated insulation film to be selectively formed in portions according to necessity among portions that connect the other semiconductor elements to the counter electrodes.

(4) The semiconductor device according to (3), wherein the other semiconductor elements are formed using a front surface layer of a semiconductor substrate.

(5) The semiconductor device according to any one of (1) to (4), wherein the plurality of electrodes are disposed at constant intervals within a surface of the insulation film.

(6) The semiconductor device according to any one of (1) to (5), further including:
an upper insulation film that is formed over an opposite side to the insulation film with the semiconductor layer interposed therebetween;
an upper contact that penetrates through the upper insulation film to be selectively formed in a portion according to necessity among portions connected to the connection regions or the active region; and
a wiring that is formed over the upper insulation film so that the wiring is connected to the upper contact.

(7) The semiconductor device according to any one of (1) to (6), wherein the insulation film, the electrodes, and the contacts are formed on both surfaces of the semiconductor layer.

(8) The semiconductor device according to any one of (1) to (7), wherein a support substrate is formed to come into contact with the electrodes disposed on one surface of the semiconductor layer.

(9) The semiconductor device according to any one of (1) to (8),
wherein the semiconductor layer is patterned in the active region and the connection regions, and
wherein the semiconductor elements each include a gate electrode traversing the patterned active region.

(10) The semiconductor device according to (3), wherein, between an electrode according to necessity among the plurality of electrodes and the counter electrode disposed to face this electrode, a tantalum oxide layer having conductivity is formed by diffusing at least one of materials of this electrode and this counter electrode.

(11) The semiconductor device according to (3),
wherein a tantalum oxide layer is formed between all of the plurality of electrodes and all of the plurality of counter electrodes disposed to face the electrodes, and
wherein, to the tantalum oxide layer located between an electrode according to necessity among the plurality of electrodes and the counter electrode disposed to face this electrode, at least one of materials of this electrode and this counter electrode diffuses.

(12) The semiconductor device according to (3), wherein the semiconductor elements and the other semiconductor elements are formed using different semiconductor materials.

(13) The semiconductor device according to (3), wherein a digital circuit is formed by connecting the semiconductor elements to the other semiconductor elements via the connection electrodes and the connection regions.

(14) The semiconductor device according to any one of (1) to (13), wherein the semiconductor layer is formed of silicon (Si), germanium (Ge), silicon germanium (SiGe), silicon carbide (SiC), carbon (C), carbon nanotube, graphene, gallium arsenide (GaAs), and indium gallium arsenide (InGaAs).

(15) A solid-state imaging device including:
an imaging substrate that includes a photoelectric conversion unit;
a semiconductor layer that includes an active region and is formed over one main surface side of the imaging substrate;
semiconductor elements that are formed using the active region;
connection regions that are obtained by metalizing parts of the semiconductor layer in an island shape isolated from the active region;
an insulation film that is formed to cover one main surface side of the semiconductor layer;
electrodes that are disposed to face the semiconductor elements and the connection regions via the insulation film; and
contacts that penetrate through the insulation film to be selectively formed in portions according to necessity among portions that connect the semiconductor elements or the connection regions to the electrodes.

(16) A method of manufacturing a semiconductor device, including:
forming an active region in a semiconductor layer and forming connection regions obtained by metalizing the semiconductor layer in an island shape isolated from the active region;
forming semiconductor elements using the active region;
forming an insulation film that covers one main surface side of the semiconductor layer;
forming contacts that penetrate the insulation film selectively in portions according to necessity among portions that reach the semiconductor elements or the connection regions; and
forming electrodes of which parts are connected to the contacts in positions at which the semiconductor elements face the connection regions via the insulation film.

(17) The method of manufacturing the semiconductor device according to (16), further including:
bonding an element substrate that includes counter electrodes disposed to face the electrodes, to a substrate in which the semiconductor elements and the electrodes are formed, so that the electrodes are joined with the counter electrodes.

(18) The method of manufacturing the semiconductor device according to (16) or (17), wherein the plurality of electrodes are formed at constant intervals within a surface of the insulation film.

(19) The method of manufacturing the semiconductor device according to any one of (16) to (18), further including: after the electrodes are formed,
bonding a substrate to a side of the electrodes;
exposing the connection regions from an opposite side to the insulation film;
forming an insulation film over the semiconductor layer to which the connection regions are exposed; and
forming contacts penetrating the insulation film selectively in portions according to necessity among portions reaching the connection regions or the active region.

(20) The method of manufacturing the semiconductor device according to any one of (16) to (19), wherein, in the step of forming of the electrodes, grooves are formed in the insulation film, electrode material films are formed to be embedded in the grooves, and the electrode material films on the insulation film are removed, so that the electrode material films remain only in the grooves.

The present disclosure contains subject matter related to that disclosed in Japanese Priority Patent Application JP 2012-218000 filed in the Japan Patent Office on Sep. 28, 2012, the entire content of which is hereby incorporated by reference.

What is claimed is:

1. A semiconductor device comprising:
a semiconductor layer that includes an active region;
semiconductor elements that are formed using the active region;
connection regions that are obtained by metalizing parts of the semiconductor layer in an island shape isolated from the active region;
an insulation film that is formed to cover one main surface side of the semiconductor layer;
electrodes that are disposed to face the semiconductor elements and the connection regions via the insulation film;
contacts that penetrate through the insulation film to be selectively formed in portions according to necessity among portions that connect the semiconductor elements or the connection regions to the electrodes;
counter electrodes that are disposed at positions facing the electrodes and are connected to the electrodes;
a laminated insulation film that is formed over one main surface side of the insulation film to cover the counter electrodes;
other semiconductor elements that are formed over the laminated insulation film of an opposite side to the counter electrodes with the laminated insulation film interposed therebetween; and
other contacts that penetrate through the laminated insulation film to be selectively formed in portions according to necessity among portions that connect the other semiconductor elements to the counter electrodes,
wherein,
between an electrode according to necessity among the plurality of electrodes and the counter electrode disposed to face this electrode, a tantalum oxide layer having conductivity is formed by diffusing at least one of materials of this electrode and this counter electrode.

2. The semiconductor device according to claim 1, wherein connection states between the semiconductor elements and the connection regions via the electrodes are selected by selection of positions at which the contacts are formed.

3. The semiconductor device according to claim 1, wherein the other semiconductor elements are formed using a front surface layer of a semiconductor substrate.

4. The semiconductor device according to claim 1, wherein the plurality of electrodes are disposed at constant intervals within a surface of the insulation film.

5. The semiconductor device according to claim 1, further comprising:
an upper insulation film that is formed over an opposite side to the insulation film with the semiconductor layer interposed therebetween;
an upper contact that penetrates through the upper insulation film to be selectively formed in a portion according to necessity among portions connected to the connection regions or the active region; and
a wiring that is formed over the upper insulation film so that the wiring is connected to the upper contact.

6. The semiconductor device according to claim 1, wherein the insulation film, the electrodes, and the contacts are formed on both surfaces of the semiconductor layer.

7. The semiconductor device according to claim 6, wherein a support substrate is formed to come into contact with the electrodes disposed on one surface of the semiconductor layer.

8. The semiconductor device according to claim 1;
wherein the semiconductor layer is patterned in the active region and the connection regions, and
wherein the semiconductor elements each include a gate electrode traversing the patterned active region.

9. A semiconductor device comprising:
a semiconductor layer that includes an active region;
semiconductor elements that are formed using the active region;
connection regions that are obtained by metalizing parts of the semiconductor layer in an island shape isolated from the active region;
an insulation film that is formed to cover one main surface side of the semiconductor layer;
electrodes that are disposed to face the semiconductor elements and the connection regions via the insulation film;
contacts that penetrate through the insulation film to be selectively formed in portions according to necessity among portions that connect the semiconductor elements or the connection regions to the electrodes;
counter electrodes that are disposed at positions facing the electrodes and are connected to the electrodes;
a laminated insulation film that is formed over one main surface side of the insulation film to cover the counter electrodes;
other semiconductor elements that are formed over the laminated insulation film of an opposite side to the counter electrodes with the laminated insulation film interposed therebetween; and
other contacts that penetrate through the laminated insulation film to be selectively formed in portions according to necessity among portions that connect the other semiconductor elements to the counter electrodes,
wherein,
a tantalum oxide layer is formed between all of the plurality of electrodes and all of the plurality of counter electrodes disposed to face the electrodes, and
to the tantalum oxide layer located between an electrode according to necessity among the plurality of electrodes and the counter electrode disposed to face this electrode, at least one of materials of this electrode and this counter electrode diffuses.

10. The semiconductor device according to claim 1, wherein the semiconductor elements and the other semiconductor elements are formed using different semiconductor materials.

11. The semiconductor device according to claim 1, wherein a digital circuit is formed by connecting the semiconductor elements to the other semiconductor elements via the counter electrodes and the connection regions.

12. The semiconductor device according to claim 1, wherein the semiconductor layer is formed of silicon (Si), germanium (Ge), silicon germanium (SiGe), silicon carbide (SiC), carbon (C), carbon nanotube, graphene, gallium arsenide (GaAs), and indium gallium arsenide (InGaAs).

13. A solid-state imaging device comprising:
an imaging substrate that includes a photoelectric conversion unit;
a semiconductor layer that includes an active region and is formed over one main surface side of the imaging substrate;
semiconductor elements that are formed using the active region;
connection regions that are obtained by metalizing parts of the semiconductor layer in an island shape isolated from the active region;
an insulation film that is formed to cover one main surface side of the semiconductor layer;
electrodes that are disposed to face the semiconductor elements and the connection regions via the insulation film;
contacts that penetrate through the insulation film to be selectively formed in portions according to necessity among portions that connect the semiconductor elements or the connection regions to the electrodes;
counter electrodes that are disposed at positions facing the electrodes and are connected to the electrodes;
a laminated insulation film that is formed over one main surface side of the insulation film to cover the counter electrodes;
other semiconductor elements that are formed over the laminated insulation film of an opposite side to the counter electrodes with the laminated insulation film interposed therebetween; and
other contacts that penetrate through the laminated insulation film to be selectively formed in portions according to necessity among portions that connect the other semiconductor elements to the counter electrodes,
wherein
between an electrode according to necessity among the plurality of electrodes and the counter electrode disposed to face this electrode, a tantalum oxide layer having conductivity is formed by diffusing at least one of materials of this electrode and this counter electrode.

14. The semiconductor device according to claim 9, wherein the semiconductor elements and the other semiconductor elements are formed using different semiconductor materials.

15. The semiconductor device according to claim 9, wherein a digital circuit is formed by connecting the semiconductor elements to the other semiconductor elements via the counter electrodes and the connection regions.

16. The semiconductor device according to claim 9, wherein the semiconductor layer is formed of silicon (Si), germanium (Ge), silicon germanium (SiGe), silicon carbide (SiC), carbon (C), carbon nanotube, graphene, gallium arsenide (GaAs), and indium gallium arsenide (InGaAs).

* * * * *